United States Patent
Takeuchi et al.

(10) Patent No.: US 11,835,225 B2
(45) Date of Patent: Dec. 5, 2023

(54) PHOTOCONVERSION DEVICE AND ILLUMINATION SYSTEM

(71) Applicant: KYOCERA Corporation, Kyoto (JP)

(72) Inventors: Eri Takeuchi, Yokohama (JP); Noritaka Niino, Soraku-gun (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/915,359

(22) PCT Filed: Mar. 31, 2021

(86) PCT No.: PCT/JP2021/013905
§ 371 (c)(1),
(2) Date: Sep. 28, 2022

(87) PCT Pub. No.: WO2021/201121
PCT Pub. Date: Oct. 7, 2021

(65) Prior Publication Data
US 2023/0147353 A1    May 11, 2023

(30) Foreign Application Priority Data

Mar. 31, 2020   (JP) .................................. 2020-063652
Mar. 31, 2020   (JP) .................................. 2020-063678
Mar. 31, 2020   (JP) .................................. 2020-064387

(51) Int. Cl.
*F21V 9/35*        (2018.01)
*F21V 29/502*      (2015.01)
(Continued)

(52) U.S. Cl.
CPC ................. *F21V 9/35* (2018.02); *F21V 5/04* (2013.01); *F21V 7/06* (2013.01); *F21V 9/45* (2018.02); *F21V 29/502* (2015.01)

(58) Field of Classification Search
CPC ... F21V 9/35; F21V 9/45; F21V 13/04; F21V 14/04; F21V 29/502; F21V 5/04;
(Continued)

(56) References Cited

U.S. PATENT DOCUMENTS 10,365,552 B2 *   7/2019   Hu .............................. F21K 9/64
2011/0157865 A1 * 6/2011   Takahashi .................. F21V 9/35
                                                                  362/259
(Continued)

FOREIGN PATENT DOCUMENTS

JP    WO 2011118536    *   9/2011
JP    2011-221502 A       11/2011
(Continued)

OTHER PUBLICATIONS

English Machine Translation of WO2011118536A1 provided by Espacenet (Year: 2011).*

*Primary Examiner* — Zheng Song
(74) *Attorney, Agent, or Firm* — Volpe Koenig

(57) ABSTRACT

A photoconversion device includes a holder, a wavelength converter, and an optical element. The holder holds an output portion that outputs excitation light. The wavelength converter includes an incident surface section including a protruding surface to receive the excitation light from the output portion and emits fluorescence in response to the excitation light incident on the incident surface section. The optical element includes a focal point surrounded by the incident surface to direct the fluorescence emitted by the wavelength converter in a predetermined direction.

13 Claims, 48 Drawing Sheets

(51) Int. Cl.
*F21V 9/45* (2018.01)
*F21V 5/04* (2006.01)
*F21V 7/06* (2006.01)

(58) Field of Classification Search
CPC .......... F21V 7/06; F21V 29/505; F21V 29/75; F21V 7/08; F21V 7/26; F21V 9/38; G03B 21/204; G03B 21/16; G02B 5/10; G02B 6/0006; G02B 6/0008
See application file for complete search history.

(56) References Cited

U.S. PATENT DOCUMENTS

| | | |
|---|---|---|
| 2013/0003400 A1 | 1/2013 | Kijima et al. |
| 2013/0208496 A1* | 8/2013 | Kishimoto .............. F21V 13/14 362/509 |
| 2013/0265561 A1* | 10/2013 | Takahira ............... F21S 41/663 356/3 |
| 2013/0271947 A1 | 10/2013 | Finsterbusch |
| 2022/0275926 A1* | 9/2022 | Li ............................. F21V 7/00 |

FOREIGN PATENT DOCUMENTS

| | | | | |
|---|---|---|---|---|
| JP | 2012-243617 A | 12/2012 | | |
| JP | 2013-012358 A | 1/2013 | | |
| JP | 2014-010918 A | 1/2014 | | |
| JP | 2014-503948 A | 2/2014 | | |
| JP | WO 2016/027657 | * | 8/2015 | ............... F21S 2/00 |
| JP | 2017188297 | * | 10/2017 | ............... F21S 2/00 |

\* cited by examiner

PHOTOCONVERSION DEVICE AND ILLUMINATION SYSTEM

CROSS-REFERENCE TO RELATED APPLICATION

The present application is a National Phase entry based on PCT Application No. PCT/JP2021/013905 filed on Mar. 31, 2021, entitled "LIGHT CONVERSION DEVICE AND LIGHTING SYSTEM", which claims the benefit of Japanese Patent Application Nos. 2020-063652, 2020-063678, and 2020-064387, filed on Mar. 31, 2020, entitled "PHOTOCONVERSION DEVICE AND ILLUMINATION SYSTEM". The contents of which are incorporated by reference herein in their entirety.

FIELD

The present disclosure relates to a photoconversion device and an illumination system.

BACKGROUND

Known light source devices convert laser light to fluorescence having a different wavelength using a phosphor and emit the fluorescence in a predetermined direction (e.g., Japanese Unexamined Patent Application Publication Nos. 2012-243617, 2013-12358, and 2011-221502).

SUMMARY

One or more aspects of the present disclosure are directed to a photoconversion device and an illumination system.

In one aspect, a photoconversion device includes a holder, a wavelength converter, and an optical element. The holder holds an output portion that outputs excitation light. The wavelength converter includes an incident surface section including a protruding surface to receive the excitation light from the output portion and emits fluorescence in response to the excitation light incident on the incident surface section. The optical element includes a focal point surrounded by the incident surface section to direct the fluorescence emitted by the wavelength converter in a predetermined direction.

In one aspect, a photoconversion device includes a holder, a wavelength converter, and an optical element. The holder holds an output portion that outputs excitation light. The wavelength converter includes an incident surface section including a protruding surface to receive the excitation light from the output portion and emits fluorescence in response to the excitation light incident on the incident surface section. The optical element includes a focusing element that focuses the fluorescence emitted by the wavelength converter onto a focusing plane. The optical element includes a conjugate point having a conjugate relation with a point on the focusing plane. The conjugate point is surrounded by the incident surface section.

In one aspect, an illumination system includes a light-emitting module, a first optical transmitter, a relay, a second optical transmitter, and an optical radiation module. The light-emitting module emits excitation light. The first optical transmitter transmits the excitation light from the light-emitting module. The relay includes the photoconversion device according to any one the above aspects. The second optical transmitter transmits the fluorescence from the relay. The optical radiation module radiates the fluorescence transmitted by the second optical transmitter into an external space. The output portion includes an output end of the first optical transmitter.

DESCRIPTION OF EMBODIMENTS

Figure 1:
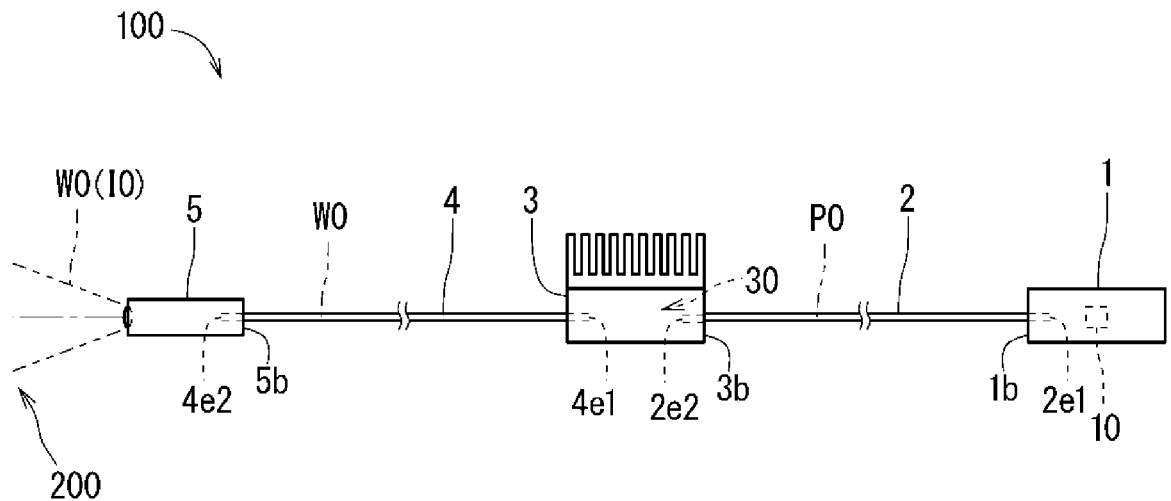
FIG. 1 is a schematic diagram of an example illumination system according to a first embodiment.

A known illumination device converts monochromatic excitation light emitted by a light-emitting element to light with a different wavelength using a phosphor and emits pseudo white light. Such an illumination device includes a phosphor portion containing a phosphor. The phosphor portion includes a flat surface. The phosphor portion has this surface perpendicular to the optical axis. The surface of the phosphor portion receives, for example, excitation light incident along the optical axis. The phosphor portion is excited by the excitation light to emit fluorescence. The fluorescence emitted from the phosphor portion is reflected from a reflector to travel in a predetermined direction. The reflector may include, for example, a reflective surface along an imaginary ellipsoid. The phosphor portion is located at a first focal point of the reflector. This causes the excitation light to enter the phosphor portion near the first focal point. The phosphor portion thus emits fluorescence near the first focal point. The reflector can direct the fluorescence emitted near the first focal point to be focused near a second focal point with high directivity.

However, with the excitation light entering the phosphor portion near the first focal point alone, an illuminating area to receive the excitation light on the surface of the phosphor portion can have a smaller area size. As the area size of the illuminating area is smaller, the phosphor portion emits fluorescence with lower intensity. The light intensity of fluorescence is thus compromised by increased directivity.

The inventors of the present disclosure thus have developed a technique for allowing emission of fluorescence with high directivity and with high light intensity from a photoconversion device and an illumination system including the photoconversion device.

Embodiments of the present disclosure will now be described with reference to the drawings. Throughout the drawings, the same reference numerals denote the same or similar components and functions, and such components and the functions will not be described repeatedly. The drawings are schematic.

1-1 First Embodiment 1-1-1 Illumination System

As illustrated in FIG. 1, an illumination system 100 according to a first embodiment includes, for example, a light-emitting module 1, a first optical transmission fiber 2 as a first optical transmitter, a relay 3, a second optical transmission fiber 4 as a second optical transmitter, and an optical radiation module 5.

The light-emitting module 1 can emit, for example, excitation light P0. The light-emitting module 1 includes a light-emitting element 10. The light-emitting element 10 includes, for example, a laser element such as a laser diode (LD), or an element such as a light-emitting diode (LED), a vertical-cavity surface-emitting laser (VCSEL), or a superluminescent diode (SLD). The excitation light P0 emitted by the light-emitting element 10 is monochromatic light, such as violet, blue-violet, or blue light. The light-emitting element 10 may be, for example, a gallium nitride (GaN) semiconductor laser that emits violet laser light with 405 nanometers (nm). In the light-emitting module 1, for example, the excitation light P0 emitted by the light-emitting element 10 is directed to be focused at one end 2e1 (also referred to as a first input end) of the first optical transmission fiber 2 by an optical system for focusing light. The light-emitting module 1 includes, for example, the housing 1b accommodating various components.

The first optical transmission fiber 2 can transmit, for example, the excitation light P0 from the light-emitting module 1. The first optical transmission fiber 2 extends, for example, from the light-emitting module 1 to the relay 3. More specifically, the first optical transmission fiber 2 includes the first input end 2e1 in the longitudinal direction located inside the light-emitting module 1 and another end 2e2 (also referred to as a first output end) opposite to the first input end 2e1 in the longitudinal direction located inside the relay 3. Thus, the first optical transmission fiber 2 provides, for example, an optical transmission path for transmitting the excitation light P0 from the light-emitting module 1 to the relay 3. The first optical transmission fiber 2 may be, for example, an optical fiber. The optical fiber includes, for example, a core and a cladding. The cladding surrounds the core and has a lower refractive index of light than the core. In this case, for example, the first optical transmission fiber 2 can transmit the excitation light P0 in the longitudinal direction in the core. The first optical transmission fiber 2 has, in the longitudinal direction, a length of, for example, several tens of centimeters (cm) to several tens of meters (m).

The relay 3 includes, for example, a photoconversion device 30. The photoconversion device 30 can, for example, receive the excitation light P0 transmitted by the first optical transmission fiber 2 and emit fluorescence W0. In this example, the photoconversion device 30 receives the excitation light P0 output through the first output end 2e2 of the first optical transmission fiber 2. The first output end 2e2 serves as an output portion. The fluorescence W0 emitted from the photoconversion device 30 in response to the excitation light P0 includes, for example, light with a wavelength different from the excitation light P0, and more specifically, light with a wavelength longer than the excitation light P0. More specifically, the fluorescence W0 includes, for example, red (R) fluorescence, green (G) fluorescence, and blue (B) fluorescence. The photoconversion device 30 can thus emit, for example, the fluorescence W0 as pseudo white light in response to the monochromatic excitation light P0. The relay 3 includes, for example, a housing 3b accommodating various components. The housing 3b may include, for example, fins for dissipating, to the outside, heat generated by the photoconversion device 30 in response to received excitation light P0.

The second optical transmission fiber 4 can transmit, for example, the fluorescence W0 from the relay 3. The second optical transmission fiber 4 extends, for example, from the relay 3 to the optical radiation module 5. More specifically, the second optical transmission fiber 4 includes one end 4e1 in the longitudinal direction (also referred to as a second input end) located inside the relay 3. The second optical transmission fiber 4 includes an end 4e2 opposite to the second input end 4e1 in the longitudinal direction (also referred to as a second output end) located inside the optical radiation module 5. Thus, the second optical transmission fiber 4 provides, for example, an optical transmission path for transmitting the fluorescence W0 from the relay 3 to the optical radiation module 5. The photoconversion device 30 included in the relay 3 has, for example, the surface onto which the fluorescence W0 is focused (also referred to as a focusing plane) at the second input end 4e1 of the second optical transmission fiber 4. The second optical transmission fiber 4 may be, for example, an optical fiber. The same or similar optical fiber as for the first optical transmission fiber 2 may be used.

The optical radiation module 5 can radiate, for example, the fluorescence W0 transmitted by the second optical transmission fiber 4 into a space 200 outside the illumination system 100 (also referred to as an external space). The optical radiation module 5 illuminates an intended area in the external space 200 with the fluorescence W0 as illumination light I0 through, for example, a lens or a diffuser. The optical radiation module 5 includes, for example, a housing 5b accommodating various components.

In the illumination system 100 with the above structure, for example, the photoconversion device 30 emits fluorescence W0 in response to the excitation light P0 transmitted by the first optical transmission fiber 2 from the light-emitting module 1. This structure can, for example, shorten the distance over which the fluorescence W0 is transmitted by the optical transmission fiber. The structure thus reduces light loss (also referred to as optical transmission loss) that may occur when, for example, the fluorescence W0 travels through the optical transmission fiber in a direction inclined at various angles to the longitudinal direction of the optical transmission fiber and is partly scattered during transmission. Thus, the illumination system 100 can radiate, for example, fluorescence W0 with higher light intensity in response to the excitation light P0. In this example, the optical radiation module 5 does not include the photoconversion device 30. The optical radiation module 5 is, for example, less likely to undergo temperature increase and is easily miniaturized. The structure thus allows, for example, miniaturization of the optical radiation module 5 that radiates the illumination light I0 into the external space 200 of the illumination system 100 while increasing the light intensity of the fluorescence W0 emitted from the illumination system 100 in response to the excitation light P0.

1-1-2. Photoconversion Device

Figure 2:
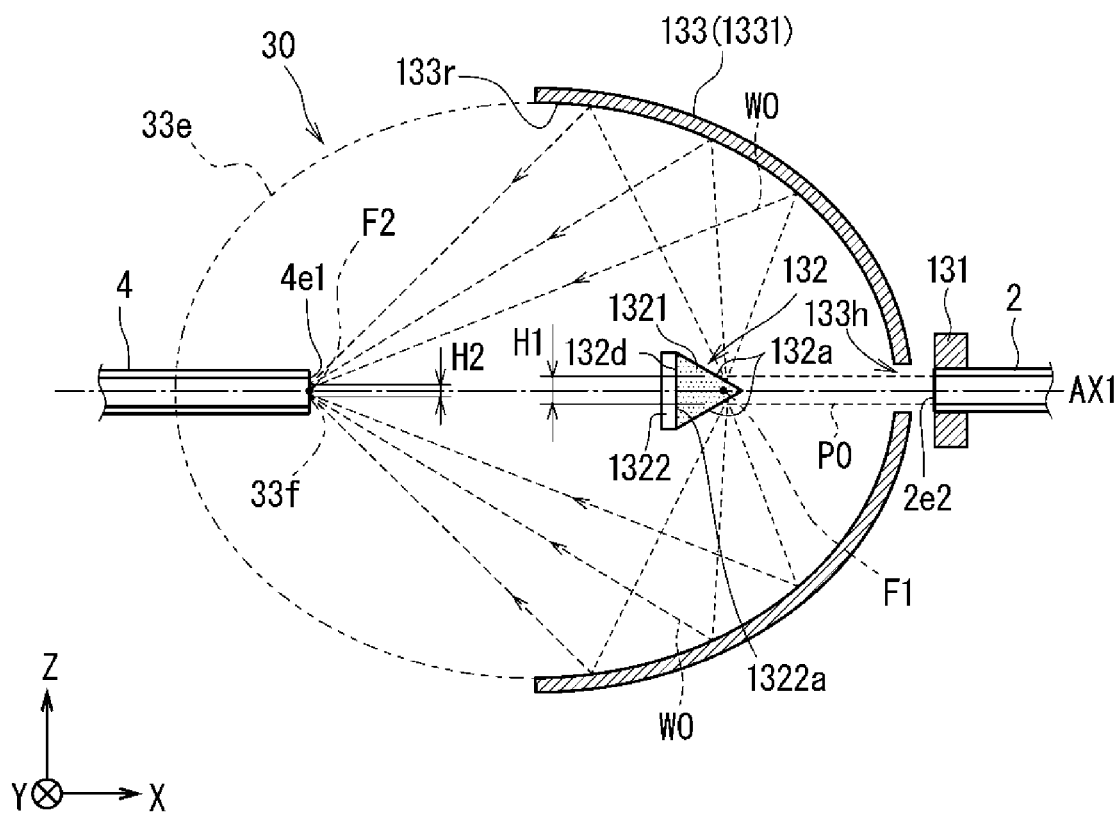
FIG. 2 is a schematic cross-sectional view of a photoconversion device with a first structure according to the first embodiment.

FIG. 2 is a schematic diagram of the photoconversion device 30 with an example structure. In FIG. 2, the housing 3b is not illustrated. The housing may not be illustrated in other drawings referred to below. In the drawings referred to below, the XYZ coordinate system is illustrated as appropriate. One direction along the X-axis may also referred to as the positive X-direction, and the opposite direction may be referred to as the negative X-direction. The same applies to the directions along the Y-axis and the Z-axis. In the XYZ coordinate system, the direction from the first output end 2e2 of the first optical transmission fiber 2 as an output portion or from an output portion 10f of the light-emitting element 10 toward a wavelength converter 132 is the negative X-direction. A direction perpendicular to the positive X-direction is referred to as the positive Y-direction. Also, the direction perpendicular to both the positive X-direction and the positive Y-direction is referred to as the positive Z-direction.

As illustrated in FIG. 2, the photoconversion device 30 includes, for example, a holder 131, the wavelength converter 132, and an optical element 133. These components of the photoconversion device 30 are fixed to the housing 3b of the relay 3 either directly or indirectly with, for example, another member. An optical axis AX1 is used to describe the positional relationship between the components. The optical axis AX1 is, for example, an optical axis of the optical element 133. In the example of FIG. 2, the optical axis AX1 extends in the X-direction.

The holder 131 holds the first output end 2e2 that serves as an output portion. In the example of FIG. 2, the holder 131 holds the first output end 2e2 to cause the first output end 2e2 to be located on the optical axis AX1 and cause excitation light P0 to be emitted in the negative X-direction through the first output end 2e2. The holder 131 includes, for example, a cylindrical portion through which the first output end 2e2 of the first optical transmission fiber 2 is placed. The holder 131 may, for example, hold or be bonded to the outer periphery of the cylindrical portion.

The wavelength converter 132 can emit, for example, fluorescence W0 in response to the excitation light P0 output through the first output end 2e2 as an output portion. The wavelength converter 132 includes a phosphor portion 1321. The phosphor portion 1321 includes a phosphor. The phosphor can emit fluorescence W0 in response to the excitation light P0. The fluorescence W0 has, for example, a longer wavelength than the excitation light P0. The phosphor portion 1321 may be, for example, a pellet-like phosphor portion (also referred to as a phosphor pellet) including a transparent sealant such as resin or glass containing numerous particles of phosphors that each emit fluorescence in response to the excitation light P0, numerous particles of phosphors may be, for example, particles of multiple types of phosphors that each emit fluorescence in response to the excitation light P0. The multiple types of phosphors may include, for example, a phosphor that emits fluorescence of a first color in response to the excitation light P0 and a phosphor that emits fluorescence of a second color different from the first color in response to the excitation light P0. More specifically, the multiple types of phosphors include, for example, a phosphor that emits red (R) fluorescence in response to the excitation light P0 (also referred to as a red phosphor), a phosphor that emits green (G) fluorescence in response to the excitation light P0 (also referred to as a green phosphor), a phosphor that emits blue (B) fluorescence in response to the excitation light P0 (also referred to as a blue phosphor). In another example, the multiple types of phosphors include, for example, a phosphor that emits blue-green fluorescence in response to the excitation light P0 (also referred to as a blue-green phosphor), a phosphor that emits yellow fluorescence in response to the excitation light P0 (also referred to as a yellow phosphor), and other various phosphors that each emit fluorescence with a different wavelength in response to the excitation light P0.

The red phosphor is, for example, a phosphor with a peak wavelength of fluorescence in a range of about 620 to 750 nm emitted in response to the excitation light P0. The red phosphor material is, for example, $CaAlSiN_3:Eu$, $Y_2O_3S:Eu$, $Y_2O_3:Eu$, $SrCaClAlSiN_3:Eu^{2+}$, $CaAlSiN_3:Eu$, or $CaAlSi(ON)_3:Eu$. The green phosphor is, for example, a phosphor with a peak wavelength of fluorescence in a range of about 495 to 570 nm emitted in response to the excitation light P0. The green phosphor material is, for example, $\beta\text{-SiAlON:Eu}$, $SrSi_3(O, Cl)_3N_3:Eu$, $(Sr, Ba, Mg)_2SiO_4:Eu^{2+}$, $ZnS:Cu, Al$, or $Zn_3SiO_4:Mn$. The blue phosphor is, for example, a phosphor with a peak wavelength of fluorescence in a range of about 450 to 495 nm emitted in response to the excitation light P0. The blue phosphor material is, for example, $(BaSr)MgAl_{10}O_{17}:Eu$, $BaMgAl_{10}O_{17}:Eu$, $(Sr, Ca, Ba)_{10}(PO_4)_6Cl_2:Eu$, or $(Sr, Ba)_{10}(PO_4)_6Cl_3:Eu$. The blue-green phosphor is, for example, a phosphor with a peak wavelength of fluorescence at about 495 nm emitted in response to the excitation light P0. The blue-green phosphor material is, for example, $Sr_4Al_{14}O_{25}:Eu$. The yellow phosphor is, for example, a phosphor with a peak wavelength of fluorescence in a range of about 570 to 590 nm emitted in response to the excitation light P0. The yellow phosphor material is, for example, $SrSi_3(O, Cl)_3N_3:Eu$. The ratio of the elements in the parentheses herein may be changed as appropriate without deviating from the molecular formulas.

The phosphor portion 1321 in the wavelength converter 132 is, for example, on the optical axis AX1 in the negative X-direction from the first output end 2e2. The phosphor portion 1321 includes an incident surface section 132a protruding (protruding surface) to receive incident excitation light P0. The incident surface section 132a includes, for example, a protruding surface with its middle portion being in the positive X-direction from its peripheral portion. In other words, the incident surface section 132a includes a protruding surface protruding in the positive X-direction. The incident surface section 132a may be a single curved surface, may include multiple flat or curved surfaces connected together, or may include flat and curved surfaces connected together.

Figure 3:
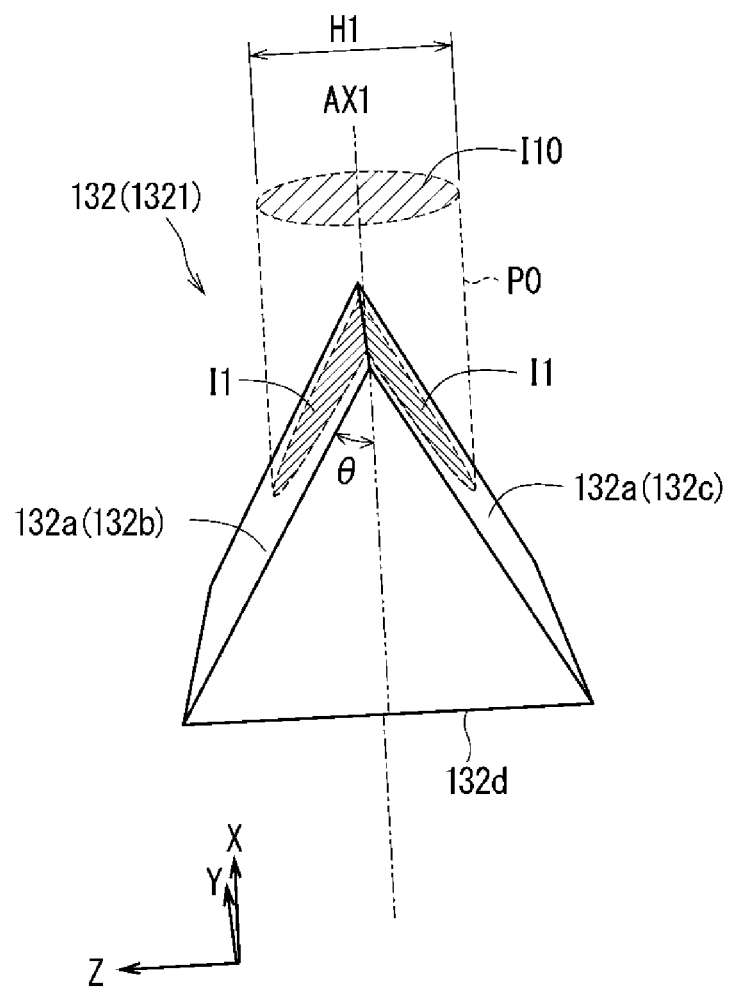
FIG. 3 is a schematic perspective view of a wavelength converter with an example structure.

FIG. 3 is a schematic diagram of the phosphor portion 1321 with an example structure. As illustrated in FIG. 3, the phosphor portion 1321 may be in the shape of a triangular prism. The phosphor portion 1321 is installed to have one rectangular side surface of the triangular prism (referred to as a surface 132d) perpendicular to the optical axis AX1 and one side of the triangular prism facing the first output end 2e2 (specifically, in the positive X-direction). The phosphor portion 1321 has the other two rectangular side surfaces corresponding to the incident surface section 132a. This incident surface section 132a is V-shaped in a ZX cross section including the optical axis AX1 that is incident on the incident surface section 132a. The phosphor portion 1321 includes a triangular side surface in the shape of, for example, an isosceles triangle. The triangular prism has each side with a length of, for example, 1 mm or more.

The incident surface section 132a may include two sides surfaces that are hereafter referred to as an incident surface 132b and an incident surface 132c. The incident surface 132b and the incident surface 132c are inclined in different directions. For example, the incident surface 132b is located in the positive Z-direction from the incident surface 132c. In the positive X-direction, the incident surface 132b is inclined in the negative Z-direction. In the positive X-direction, the incident surface 132c is inclined in the positive Z-direction. The incident surface 132b has its side edge in the positive X-direction joined to the side edge of the incident surface 132c in the positive X-direction.

The incident surface section 132a includes the protruding surface protruding toward the first output end 2e2. Thus, the phosphor portion 1321 has, for example, the width in the direction perpendicular to the optical axis AX1 (e.g., in the Z-direction) decreasing monotonically toward the first output end 2e2 (specifically, in the positive X-direction).

The excitation light P0 output through the first output end 2e2 is incident on the incident surface section 132a of the phosphor portion 1321. More specifically, the excitation light P0 is incident across both the incident surface 132b and the incident surface 132c. The phosphor portion 1321 receives the excitation light P0 and emits fluorescence W0. FIG. 2 illustrates beams representing the fluorescence W0 radiated from a single point on the incident surface 132b and beams representing the fluorescence W0 radiated from a single point on the incident surface 132c. In an actual operation, phosphors at multiple points in the phosphor portion 1321 receiving the excitation light P0 each emit fluorescence W0.

As illustrated in FIG. 2, the wavelength converter 132 may further include a substrate 1322. As illustrated in FIG. 2, the substrate 1322 may be, for example, a plate. The substrate 1322 is located to have, for example, a thickness along the optical axis AX1. The substrate 1322 is located, for example, opposite to the first output end 2e2 from the phosphor portion 1321 (specifically, in the negative X-direction). The substrate 1322 includes a surface 1322a in the positive X-direction on which, for example, the phosphor portion 1321 is located. More specifically, the surface 1322a of the substrate 1322 is, for example, joined to the surface 132d of the phosphor portion 1321.

The substrate 1322 may be transparent or reflective. In the example described below, the substrate 1322 includes a reflective surface as the surface 1322a. For the reflective substrate 1322, for example, the excitation light P0 passing through the phosphor portion 1321 is reflected from the surface 1322a of the substrate 1322 and enters the phosphor portion 1321 again. This can increase, for example, the light intensity of the fluorescence W0 emitted from the phosphor portion 1321 and increase, for example, the light intensity of the fluorescence W0 emitted in response to the excitation light P0.

The substrate 1322 may be made of, for example, a metal material. The metal material may be, for example, copper (Cu), aluminum (Al), magnesium (Mg), gold (Au), silver (Ag), iron (Fe), chromium (Cr), cobalt (Co), beryllium (Be), molybdenum (Mo), tungsten (W), or an alloy of any of these metals. The substrate 1322 made of, for example, Cu, Al, Mg, Fe, Cr, Co, or Be as the metal material may be fabricated easily by molding, such as die casting. The substrate 1322 made of, for example, Al, Mg, Ag, Fe, Cr, or Co as the metal material may include the surface 1322a with a higher reflectance against visible light. This can increase, for example, the light intensity of the fluorescence W0 emitted in response to the excitation light P0. The substrate 1322 may be made of, for example, a nonmetallic material. The nonmetallic material may be, for example, aluminum nitride (AlN), silicon nitride ($Si_3N_4$), carbon (C), or aluminum oxide ($Al_2O_3$). The nonmetallic material may be, for example, crystalline or non-crystalline. The crystalline nonmetallic material may be, for example, silicon carbide (SiC) or $Si_3N_4$.

The substrate 1322 may include, as the surface 1322a, a layer of a metal material with, for example, a higher light reflectance than its main part (also referred to as a high light reflectance layer). For example, the substrate 1322 may use Cu as the material for the main part, and may use Ag or Cr, which has a high reflectance against visible light, as the metal material with a high light reflectance. In this case, for example, the main part of the substrate 1322 is fabricated by molding, or for example, by die casting. The surface of the main part then undergoes vapor deposition or plating to form a high light reflectance layer of, for example, Ag or Cr. For example, a dielectric multilayer film may further be formed on the high light reflectance layer on the surface 1322a of the substrate 1322. The dielectric multilayer film may include, for example, dielectric thin films repeatedly stacked on one another. The dielectric may be at least one material selected from the group consisting of titanium dioxide ($TiO_3$), silicon dioxide ($SiO_2$), niobium pentoxide ($Nb_2O_5$), tantalum pentoxide ($Ta_2O_5$), and magnesium fluoride ($MgF_2$).

The optical element 133 directs fluorescence W0 emitted by the wavelength converter 132 in a predetermined direction. More specifically, for example, the optical element 133 focuses the fluorescence W0 onto a focusing plane 33f. The optical element 133 includes, for example, a reflector 1331. The reflector 1331 includes a concave reflective surface 133r. The reflective surface 133r is, for example, an ellipsoidal mirror that is shaped along an imaginary ellipsoid 33e. The reflector 1331 includes, for example, the reflective surface 133r with the axis of symmetry aligned with the optical axis AX1. The reflective surface 133r directs the fluorescence W0 emitted by the wavelength converter 132 to be focused onto the focusing plane 33f. The reflector 1331 may be, for example, a parabolic reflector.

In the example of FIG. 2, the reflective surface 133r is concave in the direction from the wavelength converter 132 toward the first output end 2e2 and surrounds the wavelength converter 132. In other words, the wavelength converter 132 is located inside the reflective surface 133r. The imaginary YZ cross section of the reflective surface 133r is, for example, circular. More specifically, for example, the imaginary YZ cross section of the reflective surface 133r may be circular and centered at a point on the optical axis AX1. The imaginary circular cross section of the reflective surface 133r along a YZ plane has a maximum diameter of, for example, about 1 to 10 cm. The reflector 1331 includes, for example, a through-hole 133h extending along the optical axis AX1. This structure allows, for example, excitation light P0 to be emitted through the first output end 2e2 toward the wavelength converter 132. The first optical transmission fiber 2 may have, for example, its portion including the first output end 2e2 placed through the through-hole 133h.

The ellipsoid 33e along which the reflective surface 133r extends includes a focal point F1 (also referred to as a first focal point) located, for example, inside the wavelength converter 132 (more specifically, for example, the phosphor portion 1321). In other words, the wavelength converter 132 is located, for example, on the first focal point F1 of the reflective surface 133r. More specifically, for example, the wavelength converter 132 may include the incident surface section 132a surrounding the first focal point F1. In other words, the wavelength converter 132 may be located to have, for example, the first focal point F1 inside the incident surface section 132a. More specifically, the wavelength converter 132 includes the incident surface 132b and the incident surface 132c sandwiching the first focal point F1 on the optical axis AX1 in the cross section illustrated in FIG. 2. The first focal point F1 is adjacent to the side edge at which the incident surface 132b and the incident surface 132c are joined together. In this structure, excitation light P0 enters the wavelength converter 132 at a position near the first focal point F1. The wavelength converter 132 thus emits fluorescence W0 near the first focal point F1. The reflector 1331 can receive the fluorescence W0 emitted near the first focal point F1 and focus the fluorescence W0 near a second focal point F2. The second focal point F2 is another focal point of the ellipsoid 33e. The second focal point F2 is different from the first focal point F1. Being near the first focal point F1 may be, for example, being at a distance of ⅒ or less of the inter-focal distance (distance between the first focal point and the second focal point).

The focusing plane 33f is aligned with the second focal point F2. The focusing plane 33f may be either an imaginary plane or an actual surface. In the first embodiment, for example, the focusing plane 33f is aligned with the second input end 4e1 of the second optical transmission fiber 4.

In this structure, the fluorescence W0 emitted by the wavelength converter 132 near the first focal point F1 is reflected from the reflective surface 133r and is focused at the second input end 4e1 of the second optical transmission fiber 4 located at the second focal point F2. This can increase, for example, the light intensity of the fluorescence W0 transmitted by the second optical transmission fiber 4.

The photoconversion device 30 may further include an optical system (not illustrated), such as a lens, that focuses the excitation light P0 output through the first output end 2e2 of the first optical transmission fiber 2 toward the wavelength converter 132.

1-1-3. Overview of First Embodiment

The photoconversion device 30 includes, for example, the holder 131, the wavelength converter 132, and the optical element 133. The holder 131 holds the first output end 2e2 that serves as an output portion. The wavelength converter 132 includes the incident surface section 132a including a protruding surface to receive excitation light P0 and emits fluorescence W0 in response to the excitation light P0. The optical element 133 has the first focal point F1 surrounded by the incident surface section 132a and directs the fluorescence W0 in a predetermined direction. The optical element 133 includes, for example, the reflector 1331 that reflects the fluorescence W0 on its reflective surface 133r and focuses the fluorescence W0 onto the focusing plane 33f. This structure allows, for example, the fluorescence W0 to enter the second optical transmission fiber 4. The optical radiation module 5 can then radiate the fluorescence W0 as illumination light TO.

The photoconversion device 30 uses the reflector 1331 to focus the fluorescence W0 onto the focusing plane 33f, and thus optically converts a first image formed using the fluorescence W0 in the wavelength converter 132 to a second image formed with a magnification on the focusing plane 33f. The wavelength converter 132 may be regarded as a light source of the fluorescence W0. In this case, the first image formed using the fluorescence W0 in the wavelength converter 132 can have the size corresponding to the size of the area of the phosphor portion 1321 receiving the excitation light P0, whereas the second image formed on the focusing plane 33f has the size corresponding to the size of the area of the focusing plane 33f receiving the excitation light P0.

In the Z-direction, for ease of explanation, the first image formed using the fluorescence W0 has the size corresponding to a width H1 of an illuminating area I1 on the incident surface section 132a that receives the excitation light P0. The width H1 is the dimension of the illuminating area I1 in the Z-direction perpendicular to the optical axis AX1 in a plan view of the incident surface section 132a along the optical axis AX1. The second image formed using the fluorescence W0 has the size corresponding to a width H2 of an illuminating area of the focusing plane 33f. The width H2 is the width of the illuminating area in the Z-direction in the focusing plane 33f. The width H1 may be, for example, about 1 mm or more. The width H2 may be less than the width H1, and may be, for example, several hundred micrometers to several millimeters. More specifically, the reflector 1331 reduces the image formed using the fluorescence W0 by a magnification of H2/H1 in the Z-direction. As the magnification (=H2/H1) of the reflector 1331 is smaller, the aberration of the reflector 1331 tends to increase. In other words, as the magnification is larger, the aberration of the reflector 1331 tends to decrease. When the aberration is large, light on the focusing plane deviates more from an ideal imaging point due to the aberration of the fluorescence W0 reflected from the reflector 1331, thus lowering the efficiency of focusing light onto the focusing plane 33f. The width H1 is reduced to enhance the degree of focusing.

When the illuminating area I1 on the incident surface section 132a is larger, the phosphor portion 1321 receives excitation light P0 in a wider area and thus can emit fluorescence W0 with higher light intensity. In the present embodiment, the incident surface section 132a includes the protruding surface to cause the illuminating area I1 to have a larger area size without increasing the width H1. In a comparative example, an incident surface section 132a is a flat surface parallel to a YZ plane. An illuminating area I1 in this example (hereafter referred to as an illuminating area I10) has the area size corresponding to the area size of a portion through which excitation light P0 travels on a YZ plane (refer to FIG. 3). With the incident surface section 132a including a protruding surface in the present embodiment, the illuminating area I1 has a larger area size than the illuminating area I10.

The difference in the area size between the illuminating area I1 and the illuminating area I10 may be quantitatively represented using, for example, an angle θ. The angle θ is half the angle of the tip of the incident surface section 132a, or specifically, half the angle between the incident surface 132b and the incident surface 132c. The area size of the illuminating area I1 is 1/sin θ times the area size of the illuminating area I10. More specifically, the illuminating area can have a larger area size by a factor of 1/sin θ than the structure with the incident surface section 132a parallel to a YZ plane. When, for example, the angle θ is 45 degrees, the illuminating area can have a larger area size by a factor of √2. Thus, the fluorescence W0 can have higher light intensity with the reflector 1331 having a smaller aberration.

This will be described with reference to the first focal point F1 as well. In a comparative example, an incident surface section 132a is a flat surface parallel to a YZ plane. When, for example, the first focal point F1 is at the center of the illuminating area I10 in FIG. 3, the illuminating area I10 may be extended by increasing the diameter of the excitation light P0 to cause the edge of the illuminating area I10 to be apart from the first focal point F1. In the comparison example, the maximum value of a distance D1 between each point in the illuminating area I10 and the first focal point F1 increases as the area size of the illuminating area I10 increases. Although being reflected from the reflector 1331, the fluorescence W0 generated at a position largely apart from the first focal point F1 travels toward a position deviating from the second focal point F2 and does not reach the focusing plane 33f. This lowers the directivity of the fluorescence W0 toward the focusing plane 33f.

In contrast, the incident surface section 132a includes the protruding surface in the present embodiment. Thus, the illuminating area I1 can have a large area size, without increasing the diameter of the excitation light P0. In other words, the illuminating area I1 can have a larger area size, without increasing the maximum value of the distance D1 between each point in the illuminating area I1 and the first focal point F1. Thus, the photoconversion device 30 can focus the fluorescence W0 onto the focusing plane 33f with high directivity and with high light intensity.

In the present embodiment, the incident surface section 132a including the protruding surface as described above allows the illuminating area I1 to have a larger area size without increasing the width H1 or the distance D1 from the first focal point F1. In other words, the photoconversion device 30 including the reflector 1331 with a small aberration can emit fluorescence W0 with high directivity and with high light intensity.

To increase the intensity of the fluorescence W0, the intensity of the excitation light P0 (light intensity per unit area size) may be increased. However, when the intensity of the excitation light P0 increases, the wavelength converter 132 can have more local heat. A phosphor or a sealant (also referred to as a binder) included in the wavelength converter 132 can be degraded or altered under heat, possibly causing temperature quenching.

In contrast, the structure in the present embodiment includes the incident surface section 132a including the protruding surface to extend the illuminating area I1 and thus to increase the light intensity of the fluorescence W0, without increasing the intensity of the excitation light P0. The temperature increase in the wavelength converter 132 is reduced to reduce heat that can possibly cause the issues described above.

For another comparison, an incident surface section 132a may be concave in the negative X-direction. In the example described below, the incident surface section 132a is concave and is V-shaped. The incident surface section 132a includes a first surface and a second surface. In this case, a portion of the fluorescence W0 from the first surface is incident on the second surface, and a portion of the fluorescence W0 from the second surface is incident on the first surface. In this manner, such portions of the fluorescence W0 are incident on the phosphor portion in an overlapping manner. Such incidence of fluorescence in an overlapping manner can lower the light intensity of the fluorescence W0.

In contrast, the incident surface section 132a includes the protruding surface in the present embodiment. This structure reduces such incidence of the fluorescence W0 in an overlapping manner on the phosphor portion 1321. This structure is less likely to lower the light intensity of the fluorescence W0.

1-1-4. Substrate
1-1-4-1. Shape

Figure 4:
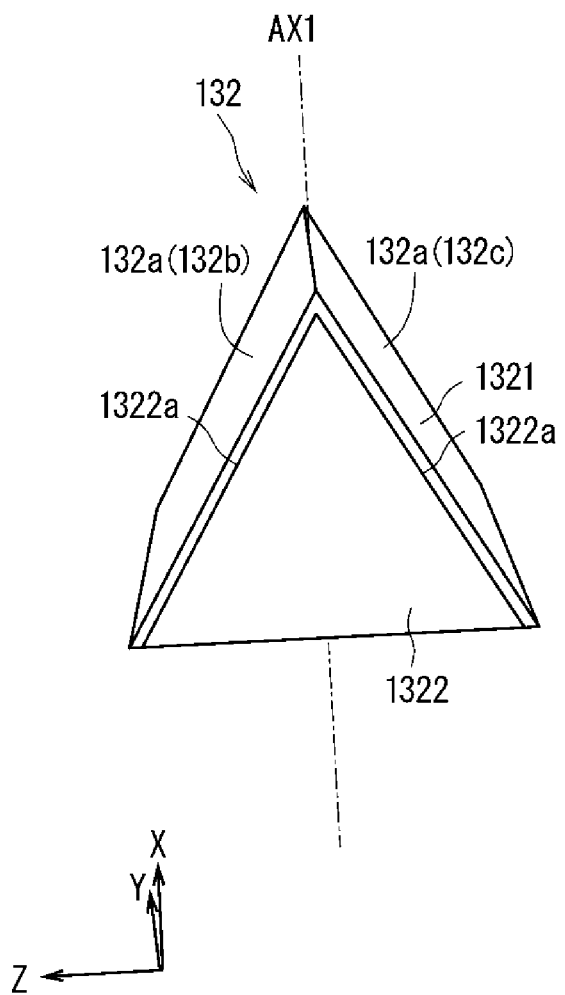
FIG. 4 is a schematic perspective view of a wavelength converter with another example structure.

As illustrated in FIG. 2, the surface 1322a of the substrate 1322 may be flat and parallel to a YZ plane. In some embodiments, as illustrated in FIG. 4, the surface 1322a of the substrate 1322 may also include a protruding surface. In the example of FIG. 4, the surface 1322a of the substrate 1322 includes a protruding surface, similarly to the incident surface section 132a of the phosphor portion 1321. For example, the surface 1322a of the substrate 1322 protrudes toward the first output end 2e2 (specifically, in the positive X-direction). The substrate 1322 in a specific example may be in the shape of a triangular prism. The substrate 1322 may be located to have one rectangular side surface of the triangular prism perpendicular to the optical axis AX1 and one side of the triangular prism facing the first output end 2e2. The other two side surfaces of the triangular prism correspond to the surface 1322a of the substrate 1322. The phosphor portion 1321 is located on the surface 1322a of the substrate 1322. The incident surface section 132a of the phosphor portion 1321 has a protruding surface similar to the surface 1322a of the substrate 1322. The phosphor portion 1321 may have a substantially constant thickness.

The wavelength converter 132 also includes the incident surface section 132a including a protruding surface. Thus, the illuminating area I1 can have a larger area size without increasing its width H1 or the distance D1 from the first focal point F1. Thus, the photoconversion device 30 can emit fluorescence W0 with high directivity and with high light intensity.

1-1-5. Phosphor Portion
1-1-5-1. Shape

Figure 5:
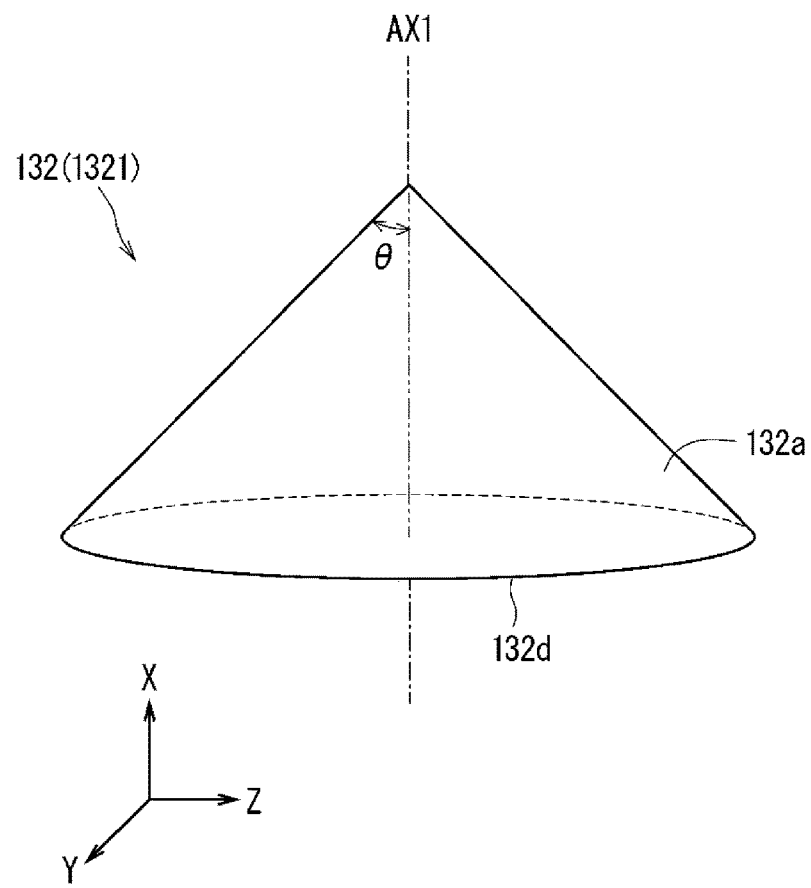
FIG. 5 is a schematic perspective view of a wavelength converter with another example structure.

Although the phosphor portion 1321 in the above example is in the shape of a triangular prism, the structure is not limited to this example. As illustrated in FIG. 5, the phosphor portion 1321 may be in the shape of a cone. More specifically, the phosphor portion 1321 may be in the shape of, for example, a circular cone. The phosphor portion 1321 has, for example, its bottom surface perpendicular to the optical axis AX1 and its tip facing the first output end 2e2. The side surface of the circular cone corresponds to the incident surface section 132a of the phosphor portion 1321. In other words, the incident surface section 132a extends along the side surface of the cone. The bottom surface of the circular cone corresponds to the surface 132d of the phosphor portion 1321. The diameter of the surface 132d and the height of the cone may be, for example, 1 mm or more. The shape of the phosphor portion 1321 may not be a circular cone but may be a pyramid.

In this case as well, the first focal point F1 of the reflector 1331 may be, for example, inside the wavelength converter 132. More specifically, the phosphor portion 1321 may have, for example, the incident surface section 132a surrounding the first focal point F1. In other words, the phosphor portion 1321 may be located to have, for example, the first focal point F1 inside the incident surface section 132a.

The phosphor portion 1321 also includes the incident surface section 132a including a protruding surface, thus allowing the illuminating area I1 to have a larger area size without increasing the width H1 or the maximum value of the distance D1 from the first focal point F1. More specifically, the illuminating area can have a larger area size by a factor of 1/sin θ than when the incident surface section 132a is parallel to a YZ plane. The angle θ is formed between the center line of the circular cone and the side surface of the circular cone in the cross section including the center line of the circular cone.

The incident surface section 132a is circular in any YZ cross section. In this structure, the phosphor portion 1321 can emit the fluorescence W0 more isotropically in a plan view of the phosphor portion 1321 along the optical axis AX1.

Figure 6:
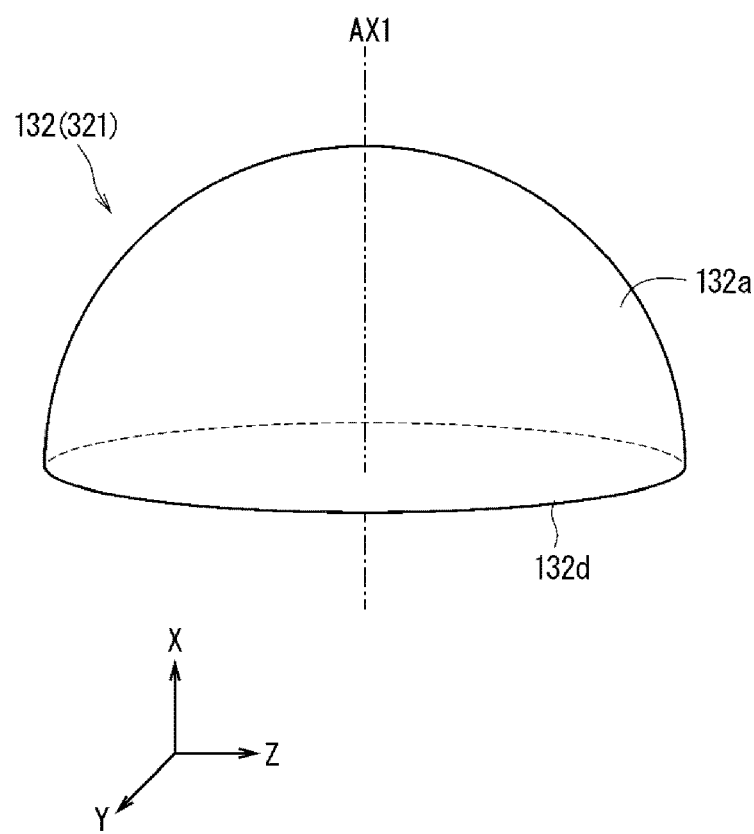
FIG. 6 is a schematic perspective view of a wavelength converter with another example structure.

As illustrated in FIG. 6, the incident surface section 132a of the phosphor portion 1321 may include, for example, a protruding surface and may curve smoothly without being angled. More specifically, the phosphor portion 1321 may be, for example, hemispherical. The phosphor portion 1321 is installed to have, for example, its bottom surface perpendicular to the optical axis AX1 and its spherical surface facing the first output end 2e2. The hemispherical surface of the phosphor portion 1321 corresponds to the incident surface section 132a. In other words, the incident surface section 132a extends along a spherical surface. The bottom surface of the hemisphere corresponds to the surface 132d of the phosphor portion 1321. The diameter of the surface 132d may be, for example, 1 mm or more.

In this case as well, the first focal point F1 of the reflector 1331 may be, for example, inside the wavelength converter 132. More specifically, the phosphor portion 1321 may have, for example, the incident surface section 132a surrounding the first focal point F1. In other words, the phosphor portion 1321 may be located to have, for example, the first focal point F1 inside the incident surface section 132a.

The phosphor portion 1321 also includes the incident surface section 132a including a protruding surface, thus allowing the illuminating area I1 to have a larger area size without increasing the width H1 or the maximum value of the distance D1 from the first focal point F1.

The area size of the illuminating area I1 in each of FIGS. 5 and 6 will be described. In the examples described below, the excitation light P0 is incident substantially across the entire incident surface section 132a. The illuminating area I1 in FIG. 5 corresponds to the side surface of the circular cone. The illuminating area I1 in FIG. 6 corresponds to the hemispherical surface. For the phosphor portions 1321 illustrated in FIGS. 5 and 6 to have the same size, the height of the circular cone in FIG. 5 may be equal to the radius of the bottom surface (specifically, the surface 132d). The angle θ of the circular cone is 45 degrees in this example. The surfaces 132d in FIGS. 5 and 6 have the same radius. The area size of the surface 132d may be the area size of the illuminating area I10 when the incident surface section 132a is a flat surface. In the example of FIG. 5, the area size of the illuminating area I1 is √2 times the area size of the illuminating area I10. In the example of FIG. 6, the area size of the illuminating area I1 is 2 times the area size of the illuminating area I10. When the angle θ is 45 degrees in the example of FIG. 3, the area size of the illuminating area I1 is √2 times the area size of the illuminating area I10. For the incident surface section 132a being a hemispherical surface, the area size of the illuminating area I1 can be the greatest of all the area sizes in FIGS. 3, 5, and 6 when the excitation light P0 is incident substantially across the entire incident surface section 132a.

The incident surface section 132a along the hemispherical surface is circular in any YZ cross section. In this structure, the phosphor portion 1321 can emit the fluorescence W0 more isotropically in a plan view along the optical axis AX1. The incident surface section 132a along the hemispherical surface has no large corners, thus facilitating entry of the excitation light P0 into the phosphor portion 1321. The photoconversion device 30 including the phosphor portion 1321 illustrated in FIG. 6 can emit fluorescence W0 with still higher directivity and with still higher light intensity.

1-1-6. Output Portion
1-1-6-1. Multiple Output Portions

Figure 7:
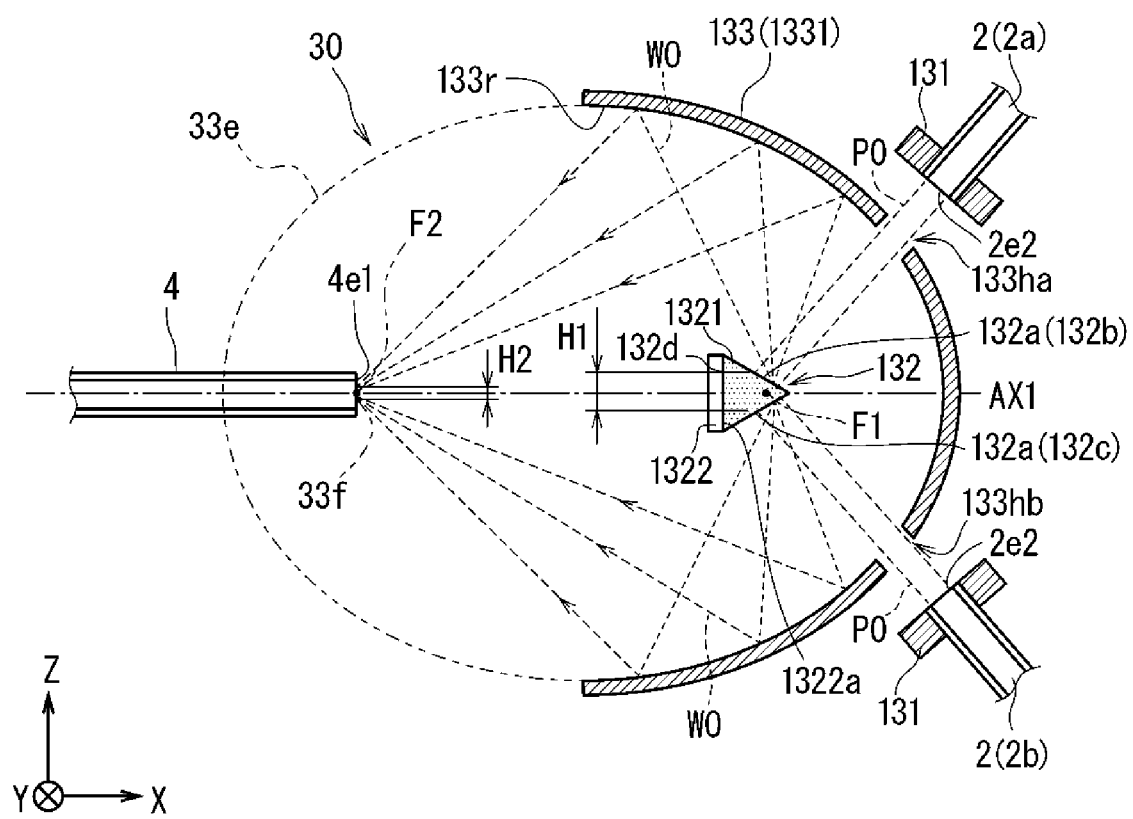
FIG. 7 is a schematic cross-sectional view of a photoconversion device with a second structure according to the first embodiment.

As illustrated in FIG. 7, the photoconversion device 30 may include multiple holders 131. In the example of FIG. 7, the photoconversion device 30 includes two holders 131 each holding a first output end 2e2 of a first optical transmission fiber 2. The two first optical transmission fibers 2 are hereafter referred to as a first optical transmission fiber 2a and a first optical transmission fiber 2b.

The reflector 1331 includes a through-hole 133ha through which excitation light P0 from the first optical transmission fiber 2a passes and a through-hole 133hb through which excitation light P0 from the first optical transmission fiber 2b passes. The through-hole 133ha receives, for example, the reflector 1331 being placed in the thickness direction at a position in the positive Z-direction from the optical axis AX1. The excitation light P0 from the first optical transmission fiber 2a passes through the through-hole 133ha, travels from outside the reflector 1331 inward, and is incident on the incident surface 132b of the wavelength converter 132. The through-hole 133hb receives, for example, the reflector 1331 being placed in the thickness direction at a position in the negative Z-direction from the optical axis AX1. The excitation light P0 from the first optical transmission fiber 2b passes through the through-hole 133hb, travels from outside the reflector 1331 inward, and is incident on the incident surface 132c of the wavelength converter 132. This structure causes an illuminating area I1 on the incident surface 132b and an illuminating area I1 on the incident surface 132c to be apart from each other.

The wavelength converter 132 emits fluorescence W0 in response to the excitation light P0 from the first optical transmission fiber 2a and from the first optical transmission fiber 2b. The reflector 1331 reflects the fluorescence W0 emitted by the wavelength converter 132 and focuses the fluorescence W0 onto the focusing plane 33f. The reflector 1331 thus reduces a first image formed using the fluorescence W0 in the wavelength converter 132 to a second image formed using the fluorescence W0 on the focusing plane 33f. In the Z-direction, the size of the first image formed using the fluorescence W0 corresponds to the width H1 between the first end and the second end furthest in the positive Z-direction and furthest in the negative Z-direction in the two illuminating areas I1 on the incident surface section 132a when the incident surface section 132a is viewed in plan along the optical axis AX1. More specifically, the width H1 is the dimension between the first end and the second end in the Z-direction perpendicular to the optical axis AX1. As the width H1 of the reflector 1331 increases, the magnification (=H2/H1) of the reflector 1331 decreases, and thus the aberration of the reflector 1331 tends to increase.

The photoconversion device 30 also includes the incident surface section 132a including a protruding surface. At the same width H1, the total area of the illuminating area I1 is larger than when the incident surface section 132a is a flat surface parallel to a YZ plane. This structure increases the light intensity of the fluorescence W0 with the reflector 1331 having a small aberration. The incident surface section 132a including a protruding surface also allows the illuminating area I1 to have a larger area size without increasing the maximum value of the distance D1 from the first focal point F1. This allows the fluorescence W0 to be focused onto the focusing plane 33f with high directivity while increasing the light intensity of the fluorescence W0. In other words, the photoconversion device 30 including the reflector 1331 with a small aberration can emit fluorescence W0 with high directivity and with high light intensity.

1-1-6-2. Splitting Excitation Light

Figure 8:
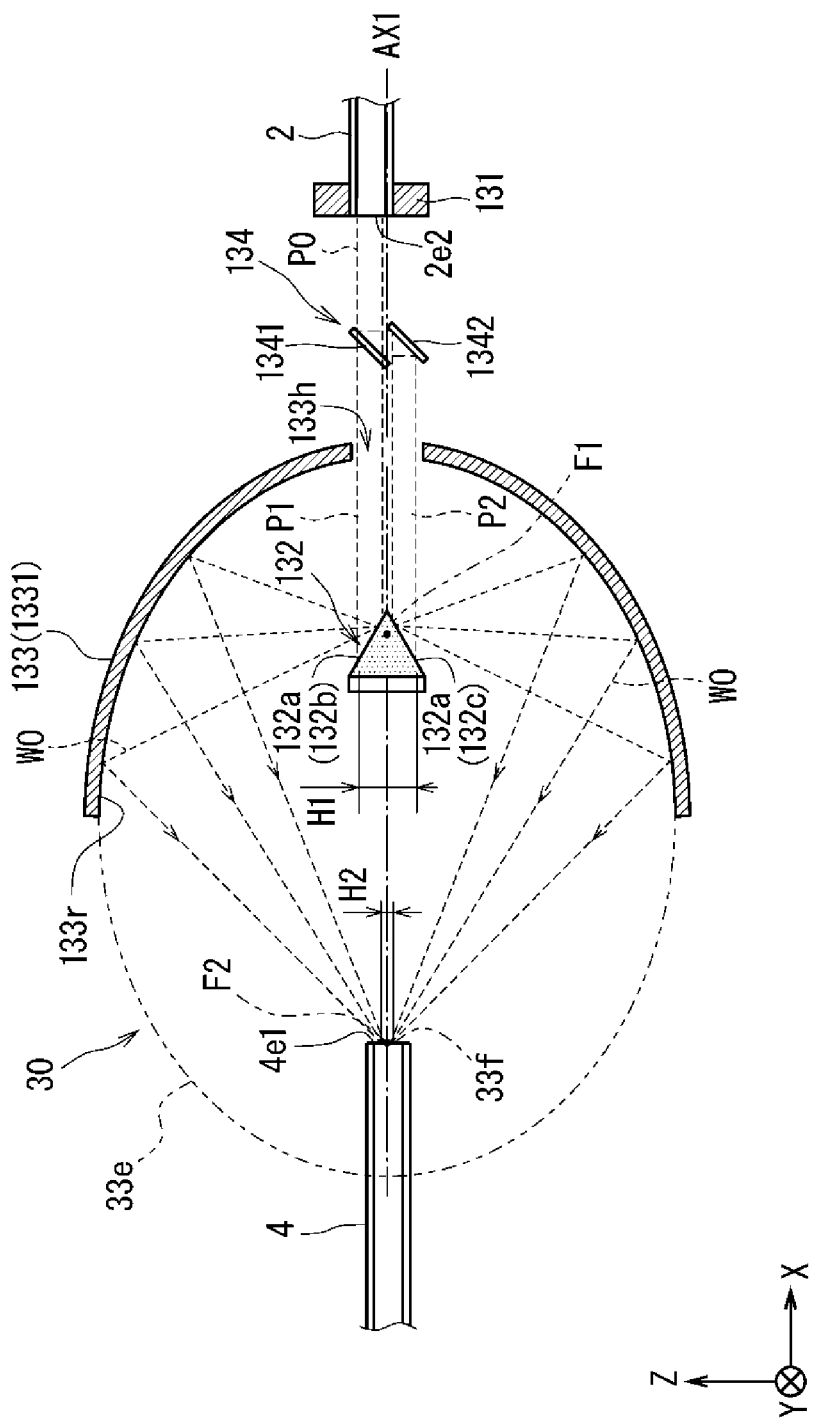
FIG. 8 is a schematic cross-sectional view of a photoconversion device with a third structure according to the first embodiment.

As illustrated in FIG. 8, a single beam of excitation light P0 may be split into multiple beams of excitation light P0. In the example of FIG. 8, the photoconversion device 30 has the same or similar structure as the photoconversion device 30 illustrated in FIG. 2, except that it includes an optical system 134.

The optical system 134 splits a single beam of excitation light P0 output through the first output end 2e2 into first excitation light P1 and second excitation light P2, and causes the first excitation light P1 to be incident on the incident surface 132b of the wavelength converter 132 and the second excitation light P2 to be incident on the incident surface 132c of the wavelength converter 132. The optical system 134 includes, for example, a semitransparent mirror 1341 and an optical path changer 1342. The semitransparent mirror 1341 is located between the wavelength converter 132 and the first output end 2e2. The semitransparent mirror 1341 transmits, for example, a portion of the excitation light P0 output through the first output end 2e2 to the wavelength converter 132 as the first excitation light P1. The first excitation light P1 passes, for example, through the through-hole 133h in the reflector 1331 and is incident on the incident surface 132b of the wavelength converter 132. The semitransparent mirror 1341 reflects the remaining portion of the excitation light P0 as the second excitation light P2 toward the optical path changer 1342. The optical path changer 1342 is, for example, a mirror that reflects the second excitation light P2 to be incident on the incident surface 132c of the wavelength converter 132. The second excitation light P2 passes, for example, through the through-hole 133h in the reflector 1331 and is incident on the incident surface 132c of the wavelength converter 132. This structure also causes the illuminating area I1 on the incident surface 132b and the illuminating area I1 on the incident surface 132b to be apart from each other.

This photoconversion device 30 also includes the incident surface section 132a including a protruding surface, and thus can emit, using the reflector 1331 with a small aberration, fluorescence W0 with high directivity and with high light intensity, similarly to the photoconversion device 30 illustrated in FIG. 7.

Although the optical system 134 is located outside the reflector 1331 in the example of FIG. 8, the optical system 134 may be located inside the reflector 1331. More specifically, the optical system 134 may be located between the wavelength converter 132 and the through-hole 133h.

1-2. Other Embodiments

The present disclosure is not limited to the above first embodiment and may be changed or varied without departing from the spirit and scope of the present disclosure.

1-2-1. Second Embodiment

Figure 9:
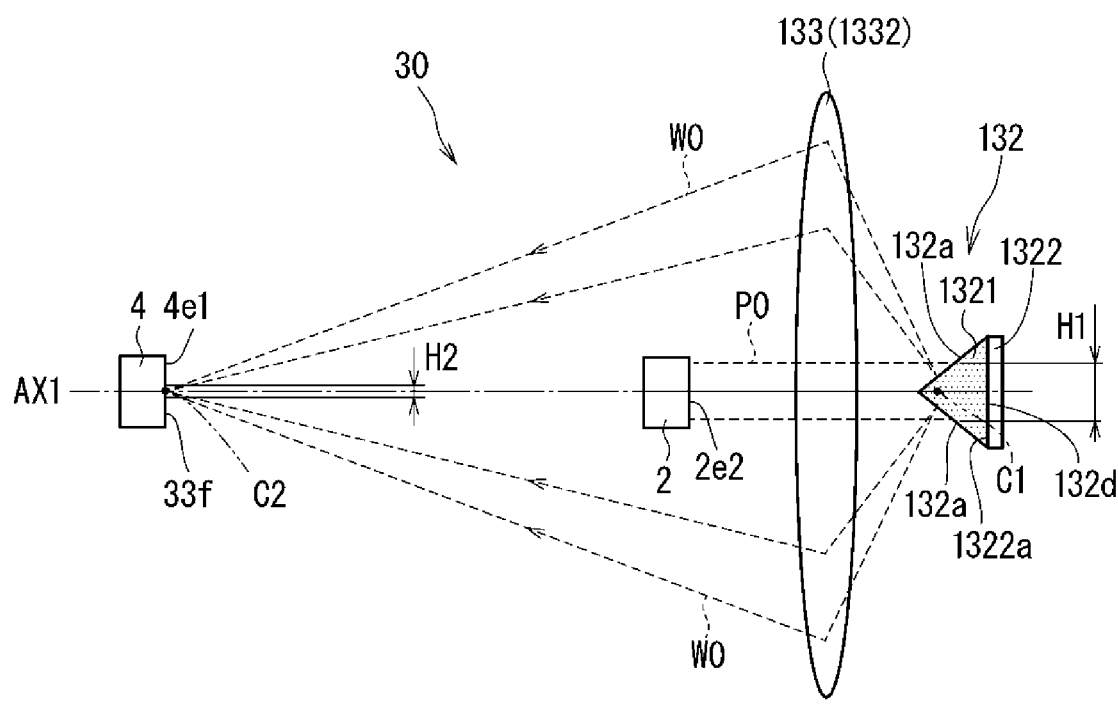
FIG. 9 is a schematic cross-sectional view of a photoconversion device with a first structure according to a second embodiment.
Figure 9:
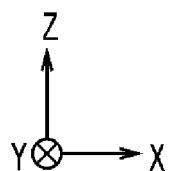

A photoconversion device 30 with a first structure according to a second embodiment differs from the photoconversion device 30 according to the first embodiment in the structure of the optical element 133. As illustrated in FIG. 9, the optical element 133 includes a lens 1332 as a focusing element. The lens 1332 focuses fluorescence W0 emitted by the wavelength converter 132 onto the focusing plane 33f. In the example of FIG. 9, the first optical transmission fiber 2 is indicated schematically with a square block. The holder 131 is not illustrated. The lens 1332 is located between the first output end 2e2 and the wavelength converter 132. As illustrated in FIG. 9, the first output end 2e2 and the wavelength converter 132 may be, for example, on the optical axis AX1 of the lens 1332. The lens 1332 includes, for example, a convex lens. The wavelength converter 132 is installed to have the incident surface section 132a protruding toward the lens 1332.

The first output end 2e2 outputs excitation light P0 in the positive X-direction. The excitation light P0 passes through the lens 1332 and is incident on the protruding surface of the incident surface section 132a of the wavelength converter 132. The wavelength converter 132 can emit fluorescence W0 in response to the excitation light P0.

The fluorescence W0 emitted by the wavelength converter 132 passes through the lens 1332 and is focused onto the focusing plane 33f. The substrate 1322 being reflective can reflect the fluorescence W0 toward the lens 1332, and can increase the light intensity of the fluorescence W0 entering the lens 1332. This increases the light intensity of the fluorescence W0 focused on the focusing plane 33f. In the example of FIG. 9, the second optical transmission fiber 4 is also indicated schematically with a square block. The second input end 4e1 of the second optical transmission fiber 4 is aligned with the focusing plane 33f. The focusing plane 33f is, for example, located opposite to the lens 1332 from the first output end 2e2 on the optical axis AX1.

A conjugate point C1, which has a conjugate relation with a point C2 on the focusing plane 33f with respect to the lens 1332, is located inside the wavelength converter 132. The point C2 is, for example, a point of intersection between the focusing plane 33f and the optical axis AX1. The wavelength converter 132 is installed to have the conjugate point C1 surrounded by the incident surface section 132a. The excitation light P0 output through the first output end 2e2 thus enters the wavelength converter 132 near the conjugate point C1. Thus, the wavelength converter 132 emits the fluorescence W0 near the conjugate point C1. The fluorescence W0 generated near the conjugate point C1 is easily focused through the lens 1332 onto the focusing plane 33f. This structure increases the light intensity of the fluorescence W0 focused on the focusing plane 33f.

In this photoconversion device 30 as well, the lens 1332 reduces the first image formed using the fluorescence W0 in the wavelength converter 132 to the second image formed using the fluorescence W0 on the focusing plane 33f, similarly to the reflector 1331. In the Z-direction, the lens 1332 reduces the image formed using the fluorescence W0 by a magnification of H2/H1. The aberration of the lens 1332 tends to be smaller as the magnification increases. The width H1 is thus reduced to enhance the degree of focusing.

In the second embodiment as well, the incident surface section 132a of the wavelength converter 132 includes a protruding surface to have the illuminating area I1 with a larger area size without increasing the width H1. Thus, the fluorescence W0 can have higher light intensity with the lens 1332 having a small aberration. The incident surface section 132a including a protruding surface also allows the illuminating area I1 to have a larger area size without increasing the maximum value of a distance D2 from the conjugate point C1. Thus, the photoconversion device 30 can emit fluorescence W0 with high directivity and with high light intensity.

Figure 10:
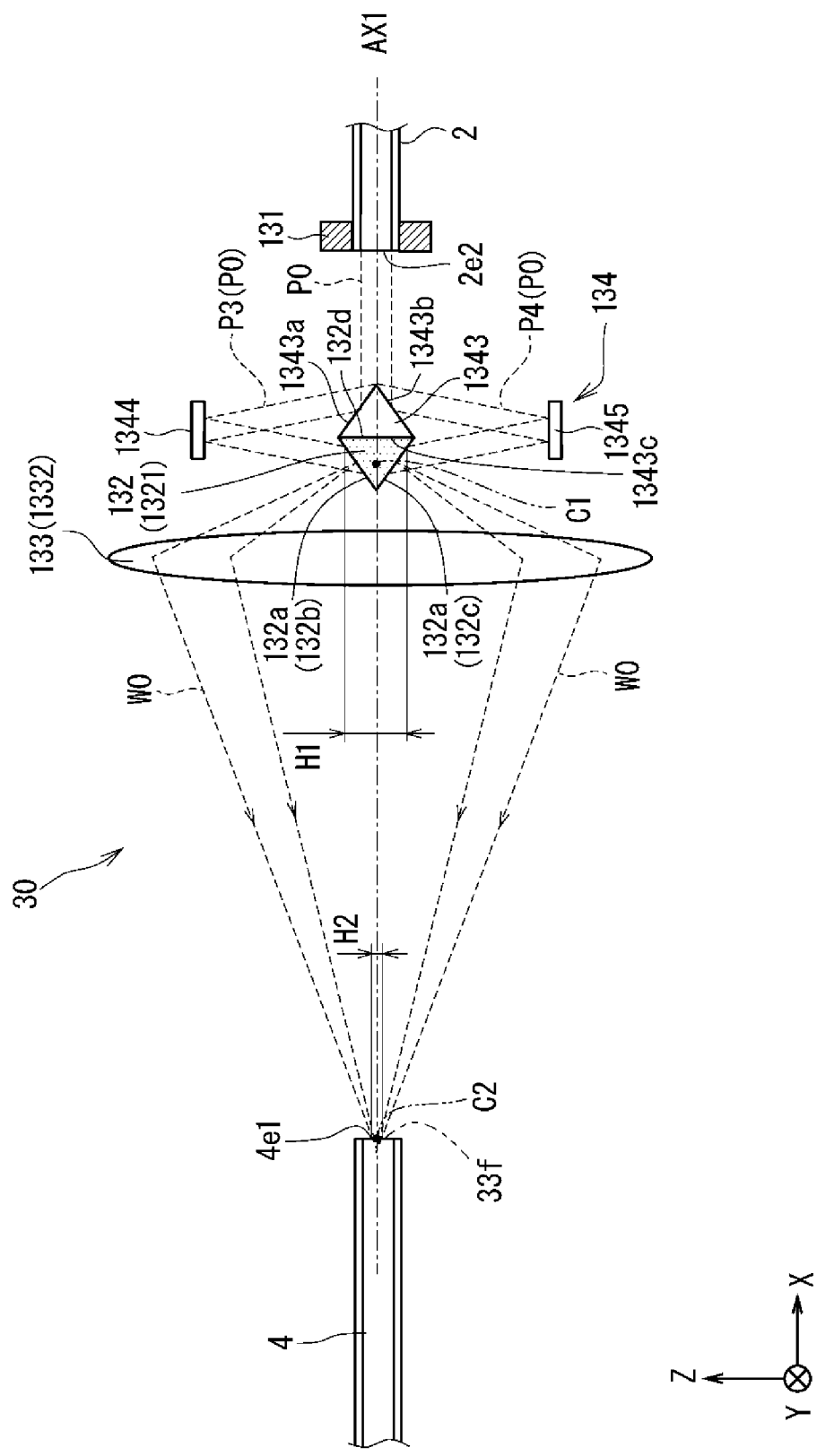
FIG. 10 is a schematic cross-sectional view of a photoconversion device with a second structure according to the second embodiment.

As illustrated in FIG. 10, a photoconversion device 30 with a second structure according to the second embodiment includes a holder 131, a wavelength converter 132, an optical element 133, and an optical system 134. The holder 131 holds the first output end 2e2 of the first optical transmission fiber 2. The first output end 2e2 outputs excitation light P0 in the negative X-direction. The optical system 134 splits the excitation light P0 output through the first output end 2e2 into third excitation light P3 and fourth excitation light P4, and causes the third excitation light P3 and the fourth excitation light P4 to be incident on the incident surface section 132a of the wavelength converter 132. The optical system 134 includes, for example, a splitter 1343, an optical path changer 1344, and an optical path changer 1345.

The splitter 1343 is located, for example, between the wavelength converter 132 and the first output end 2e2 on the optical axis AX1. The splitter 1343 splits the excitation light P0 output through the first output end 2e2 into the third excitation light P3 and the fourth excitation light P4.

The splitter 1343 includes, for example, an incident surface 1343a and an incident surface 1343b. The incident surface 1343a and the incident surface 1343b are continuous with each other. The excitation light P0 is incident across the boundary between the incident surface 1343a and the incident surface 1343b. More specifically, a portion of the excitation light P0 is incident on the incident surface 1343a, and the remaining portion of the excitation light P0 is incident on the incident surface 1343b.

The incident surface 1343a and the incident surface 1343b are inclined in different directions. The incident surface 1343a and the incident surface 1343b are, for example, flat surfaces and together define a V shape. More specifically, the incident surface 1343a and the incident surface 1343b are joined to each other at an acute angle. The incident surface 1343a and the incident surface 1343b are inclined toward each other in the Z-direction toward the first output end 2e2 in the X-direction. In the example of FIG. 10, the boundary between the incident surface 1343a and the incident surface 1343b is aligned with the optical axis AX1.

The splitter 1343 splits the excitation light P0 into a first portion of the excitation light P0 that is incident on the incident surface 1343a and a second portion of the excitation light P0 that is incident on the incident surface 1343b to allow these light portions to travel in different directions. The first portion corresponds to the third excitation light P3. The second portion corresponds to the fourth excitation light P4. The incident surface 1343a and the incident surface 1343b are, for example, reflective surfaces. With the incident surface 1343a and the incident surface 1343b inclined in different directions, the third excitation light P3 reflected from the incident surface 1343a and the fourth excitation light P4 reflected from the incident surface 1343b travel in different directions. This allows spatial splitting of the excitation light P0 into the third excitation light P3 and the fourth excitation light P4.

The splitter 1343 may be in the shape of a triangular prism similar to, for example, the wavelength converter 132 illustrated in FIG. 3. The splitter 1343 is installed to have one rectangular side surface of the triangular prism (referred to as a surface 1343c) perpendicular to the optical axis AX1 and one side of the triangular prism facing the first output end 2e2. The remaining two rectangular side surfaces of the splitter 1343 correspond to the incident surface 1343a and the incident surface 1343b. A material for the splitter 1343 may be, for example, the same as or similar to the material for the substrate 1322 described above.

In the example of FIG. 10, the incident surface 1343a is located in the positive Z-direction from the incident surface 1343b. Thus, the first portion of the excitation light P0 reflected from the incident surface 1343a travels in the positive Z-direction as the third excitation light P3. The second portion of the excitation light P0 reflected from the incident surface 1343b travels in the negative Z-direction as the fourth excitation light P4.

The optical path changer 1344 is an optical element that directs the third excitation light P3 from the splitter 1343 to the incident surface section 132a of the wavelength converter 132. In the example of FIG. 10, the third excitation light P3 travels in the positive Z-direction from the splitter 1343. The optical path changer 1344 is thus located in the positive Z-direction from the splitter 1343. The optical path changer 1344 includes, for example, a mirror that reflects the third excitation light P3 to be incident on the incident surface section 132a of the wavelength converter 132 (more specifically, the incident surface 132b). In the example of FIG. 10, the third excitation light P3 is obliquely incident on the incident surface 132b.

The optical path changer 1345 is an optical element that directs the fourth excitation light P4 from the splitter 1343 to the incident surface section 132a of the wavelength converter 132. In the example of FIG. 10, the fourth excitation light P4 travels in the negative Z-direction from the splitter 1343. The optical path changer 1345 is thus located in the negative Z-direction from the splitter 1343. The optical path changer 1345 includes, for example, a mirror that reflects the fourth excitation light P4 to be incident on the incident surface section 132a of the wavelength converter 132 (more specifically, the incident surface 132c). In the example of FIG. 10, the fourth excitation light P4 is obliquely incident on the incident surface 132c. The illuminating area I1 on the incident surface 132b and the illuminating area I1 on the incident surface 132c can thus be apart from each other.

As illustrated in FIG. 10, the incident surface section 132a of the wavelength converter 132 includes a protruding surface protruding in the direction opposite to (specifically, in the negative X-direction from) the first output end 2e2. As illustrated in FIG. 10, the wavelength converter 132 may be connected to the splitter 1343. More specifically, the surface 1343c of the splitter 1343 may be joined to the surface 132d of the wavelength converter 132 in the positive X-direction. In this case, the splitter 1343 may function as the substrate for the phosphor portion 1321 of the wavelength converter 132. The wavelength converter 132 may not include the substrate 1322.

The wavelength converter 132 can emit fluorescence W0 in response to the third excitation light P3 and the fourth excitation light P4. The incident surface section 132a of the wavelength converter 132 includes a protruding surface protruding in the negative X-direction. The wavelength converter 132 can thus emit more fluorescence W0 in the negative X-direction.

The optical element 133 includes the lens 1332 located opposite to (specifically, in the negative X-direction from) the first output end 2e2 from the wavelength converter 132. The lens 1332 includes, for example, a convex lens that focuses the fluorescence W0 from the wavelength converter 132 onto the focusing plane 33f. The focusing plane 33f is, for example, at a position opposite to the wavelength converter 132 from the lens 1332 on the optical axis AX1.

The substrate 1322 being reflective reflects the fluorescence W0 toward the lens 1332, thus increasing the light intensity of the fluorescence W0 entering the lens 1332. This increases the light intensity of the fluorescence W0 focused on the focusing plane 33f.

A conjugate point C1, which has a conjugate relation with a point C2 on the focusing plane 33f with respect to the lens 1332, is located, for example, inside the wavelength converter 132. More specifically, the conjugate point C1 is surrounded by, for example, the incident surface section 132a.

In this photoconversion device 30 as well, the lens 1332 reduces the first image formed using the fluorescence W0 in the wavelength converter 132 to the second image formed using the fluorescence W0 on the focusing plane 33f. In the Z-direction, the lens 1332 reduces the image formed using the fluorescence W0 by a magnification of H2/H1. The aberration of the lens 1332 tends to be smaller as the magnification increases. The width H1 is thus reduced to enhance the degree of focusing.

The wavelength converter 132 also includes the incident surface section 132a including a protruding surface, thus allowing the illuminating area I1 to have a larger area size without increasing the width H1 of the illuminating area I1 and the maximum value of the distance D2 from the conjugate point C1. Thus, the photoconversion device 30 including the lens 1332 with a small aberration can emit fluorescence W0 with high directivity and with high light intensity.

1-2-2. Third Embodiment

Figure 11:
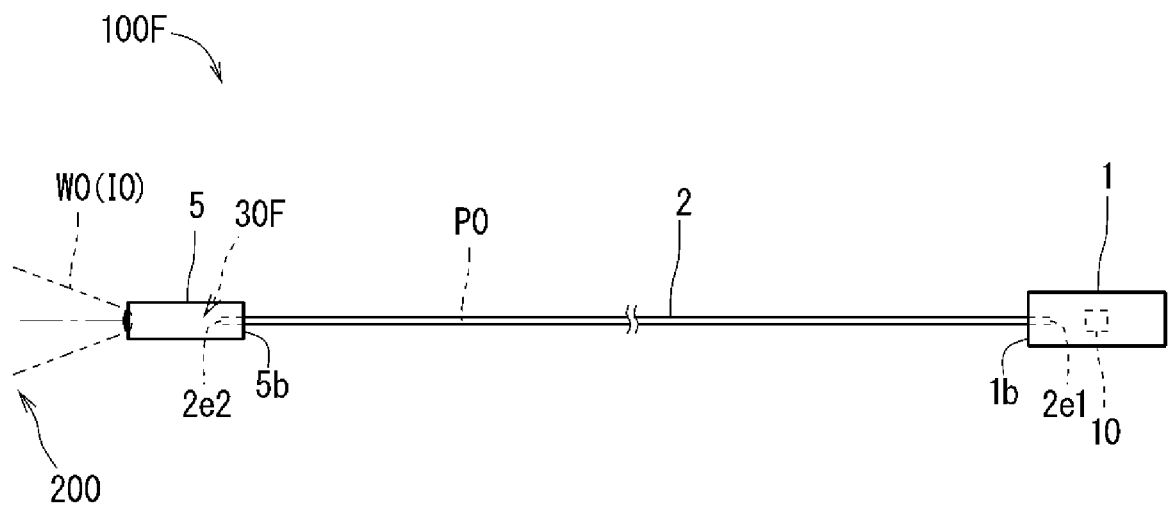
FIG. 11 is a schematic diagram of an example illumination system according to a third embodiment.

In the above embodiments, as illustrated in, for example, FIG. 11, the first optical transmission fiber 2 extends from the light-emitting module 1 to the optical radiation module 5, without the relay 3 or the second optical transmission fiber 4. The optical radiation module 5 may include a photoconversion device 30F with the same or similar structure as the photoconversion device 30 according to the first embodiment or the second embodiment described above.

As illustrated in FIG. 11, an illumination system 100F according to a third embodiment includes, for example, a light-emitting module 1, a first optical transmission fiber 2, and an optical radiation module 5. In this example, the first optical transmission fiber 2 includes a first input end 2e1 located inside the light-emitting module 1 and a first output end 2e2 located inside the optical radiation module 5. The first optical transmission fiber 2 can thus transmit, for example, excitation light P0 from the light-emitting module 1 to the optical radiation module 5. In the optical radiation module 5, for example, the photoconversion device 30F can receive excitation light P0 output through the first output end 2e2 of the first optical transmission fiber 2 as an output portion to emit fluorescence W0. The optical radiation module 5 can then radiate, for example, fluorescence W0 emitted from the photoconversion device 30F into an external space 200 of the illumination system 100F as illumination light I0.

Figure 12:
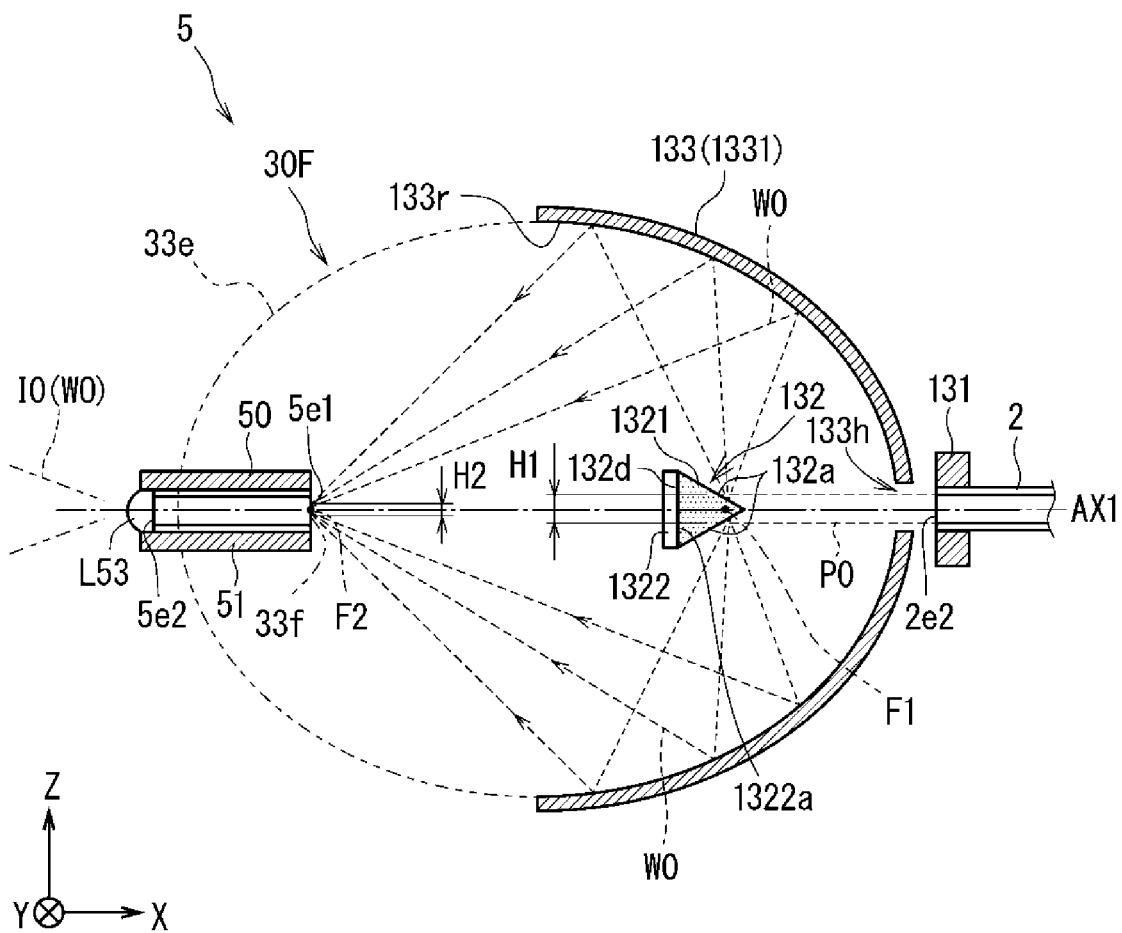
FIG. 12 is a schematic cross-sectional view of a photoconversion device with a first structure according to the third embodiment.

An optical radiation module 5 with a first structure according to the third embodiment illustrated in FIG. 12 includes a photoconversion device 30F and an optical radiator 50. In this example, the photoconversion device 30F has the same or similar structure as the photoconversion device 30 with the structure according to the first embodiment illustrated in FIG. 2. The optical radiator 50 includes, for example, a lightguide 51 and an optical system L53. The lightguide 51 can transmit, for example, fluorescence W0 from the second focal point F2 toward the optical system L53. The lightguide 51 includes, for example, an optical fiber or a cylindrical member with a mirror-like inner surface. The lightguide 51 includes, for example, one end 5e1 (also referred to as a third input end) for receiving fluorescence W0 and another end 5e2 (also referred to as a third output end) for outputting the fluorescence W0. The third output end 5e2 is located opposite to the third input end 5e1. In the example of FIG. 12, the optical system L53 is aligned with, for example, the third output end 5e2 of the lightguide 51. The optical system L53 can radiate, for example, the fluorescence W0 transmitted by the lightguide 51 into the external space 200 at an intended angle of light distribution. The optical system L53 may include, for example, a lens or a diffuser. In this structure, for example, the optical radiation module 5 can include a smaller portion to radiate the fluorescence W0 into the external space 200 as illumination light I0.

Although the optical element 133 is the reflector 1331 in the example of FIG. 12, the optical element 133 may be a lens 1332 as illustrated in FIGS. 9 and 10.

The photoconversion device 30F with the first structure also includes a holder 131, a wavelength converter 132, and an optical element 133. The holder 131 holds the first output end 2e2 that serves as an output portion. The wavelength converter 132 includes the incident surface section 132a including a protruding surface to receive excitation light P0 and emits fluorescence W0 in response to the excitation light P0. The optical element 133 has a first focal point F1 or a conjugate point C1 surrounded by the incident surface section 132a to focus the fluorescence W0 onto the focusing plane 33f. Thus, the photoconversion device 30F including the optical element 133 with a small aberration can focus the fluorescence W0 onto the focusing plane 33f with high directivity and with high light intensity. This allows the fluorescence W0 with higher light intensity to enter the optical radiator 50, thus allowing the optical radiation module 5 to emit the fluorescence W0 with higher light intensity.

Figure 13:
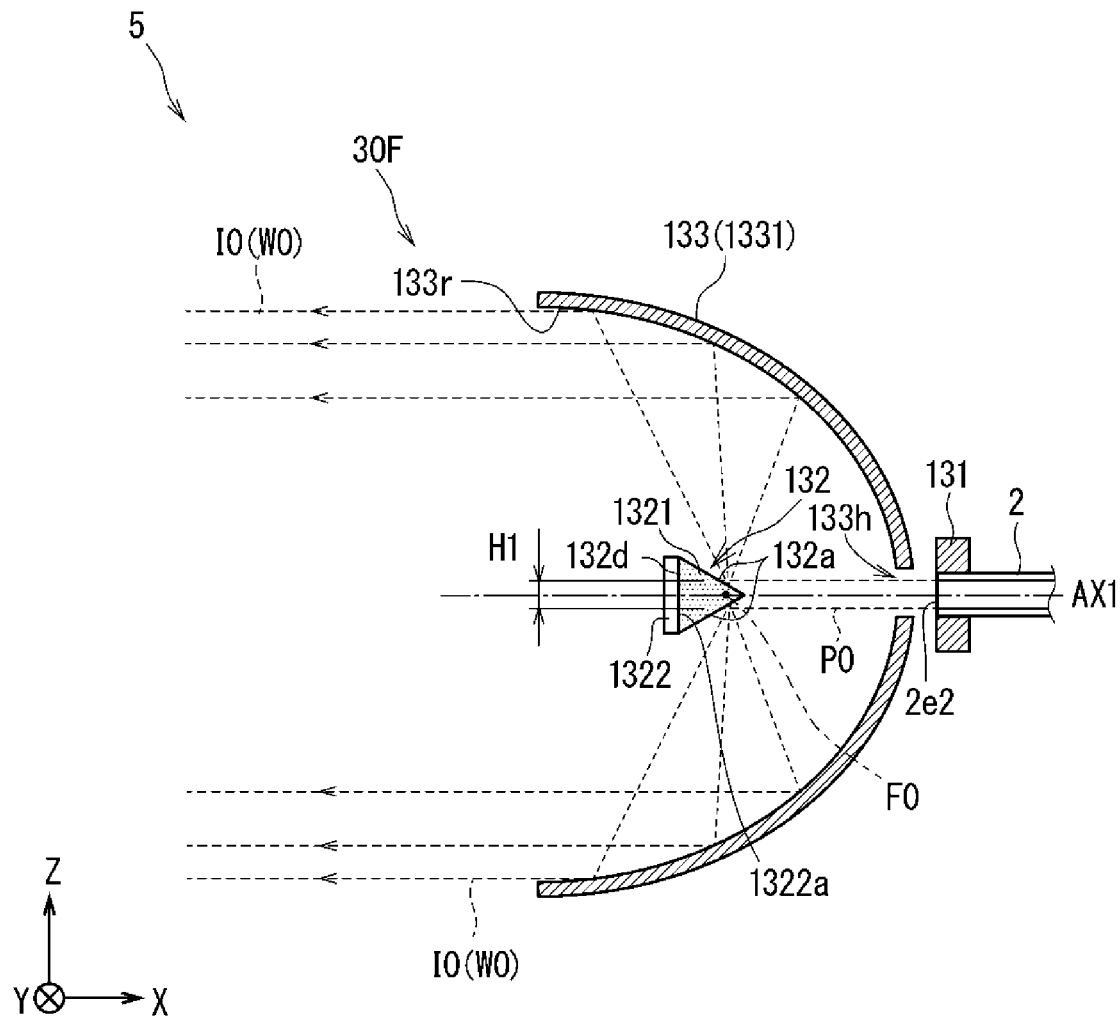
FIG. 13 is a schematic cross-sectional view of a photoconversion device with a second structure according to the third embodiment.

An optical radiation module 5 with a second structure according to the third embodiment may not include the optical radiator 50, as illustrated in, for example, FIG. 13. In the example of FIG. 13, the reflective surface 133r extends along an imaginary paraboloid. A focal point F0 of the paraboloid is located, for example, inside the wavelength converter 132. More specifically, the focal point F0 of the paraboloid is surrounded by, for example, the incident surface section 132a of the wavelength converter 132. Thus, the wavelength converter 132 can emit fluorescence W0 near the focal point F0. The reflector 1331 can convert the fluorescence W0 emitted near the focal point F0 to collimated light with higher directivity. The collimated light may be, for example, radiated into the external space 200 as illumination light I0 directly or through various optical systems such as a lens or a diffuser.

Although the optical element 133 is the reflector 1331 in the example of FIG. 13, the optical element 133 may be the lens 1332 as illustrated in FIGS. 9 and 10. In this case, the lens 1332 may be a collimating lens. More specifically, the focal point of the lens 1332 may be located inside the wavelength converter 132. In other words, the phosphor portion 1321 may be located to have the incident surface section 132a surrounding the focal point of the lens 1332. In this structure, the lens 1332 can convert the fluorescence W0 emitted by the wavelength converter 132 near the focal point to collimated light with high directivity.

The photoconversion device 30F with the second structure also includes a holder 131, a wavelength converter 132, and an optical element 133. The holder 131 holds the first output end 2e2 that serves as an output portion. The wavelength converter 132 includes the incident surface section 132a including a protruding surface to receive excitation light P0 and emits fluorescence W0 in response to the excitation light P0. The optical element 133 has the focal point surrounded by the incident surface section 132a and converts the fluorescence W0 to collimated light. Thus, the photoconversion device 30F (and thus the optical radiation module 5) including the optical element 133 with a small aberration can emit the fluorescence W0 with high directivity and with high light intensity.

In the illumination system 100F, the wavelength converter 132 in the optical radiation module 5 emits fluorescence W0 in response to the excitation light P0 transmitted by the first optical transmission fiber 2 from the light-emitting module 1. This structure reduces optical transmission loss that may occur when, for example, the fluorescence W0 travels through the optical transmission fiber in a direction inclined at various angles to the longitudinal direction of the optical transmission fiber and is partly scattered during transmission. Thus, the illumination system 100F can radiate, for example, fluorescence W0 with higher light intensity in response to the excitation light P0.

Although the optical element 133 converts the fluorescence W0 to collimated light, a focusing optical system including a lens (not illustrated) between the optical element 133 and the focusing plane 33f may be used to focus the fluorescence W0 onto the focusing plane 33f.

1-2-3. Fourth Embodiment

Figure 14:
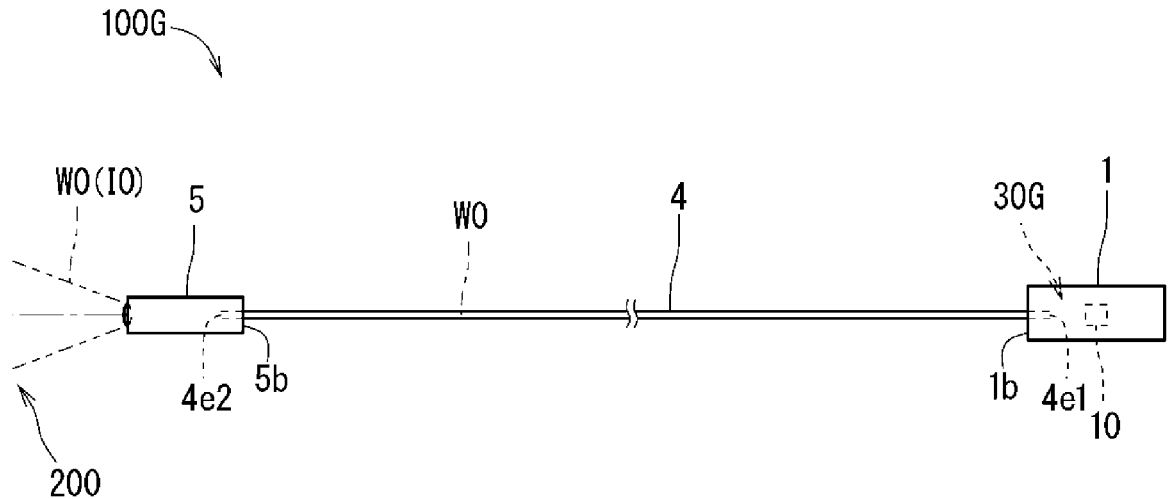
FIG. 14 is a schematic diagram of an example illumination system according to a fourth embodiment.

The structure according to each of the above first and second embodiments may not include the relay 3 or the first optical transmission fiber 2, and may include a second optical transmission fiber 4 extending from a light-emitting module 1 to an optical radiation module 5, and the light-emitting module 1 may include a photoconversion device 30G with the same or similar structure as the photoconversion device 30 according to either of the first or second embodiment, as illustrated in, for example, FIG. 14.

As illustrated in FIG. 14, an illumination system 100G according to a fourth embodiment includes, for example, a light-emitting module 1, a second optical transmission fiber 4, and an optical radiation module 5. In this example, the second optical transmission fiber 4 includes a second input end 4e1 located inside the light-emitting module 1 and a second output end 4e2 located inside the optical radiation module 5. The second optical transmission fiber 4 can thus, for example, transmit fluorescence W0 from the light-emitting module 1 to the optical radiation module 5. In the light-emitting module 1, for example, the photoconversion device 30G can receive excitation light P0 emitted by the light-emitting element 10 as an output portion to emit fluorescence W0. The fluorescence W0 emitted from the photoconversion device 30G in the light-emitting module 1 is, for example, transmitted to the optical radiation module 5 through the second optical transmission fiber 4. The optical radiation module 5 can then radiate, for example, the fluorescence W0 transmitted by the second optical transmission fiber 4 into an external space 200 of the illumination system 100G as illumination light I0.

Figure 15:
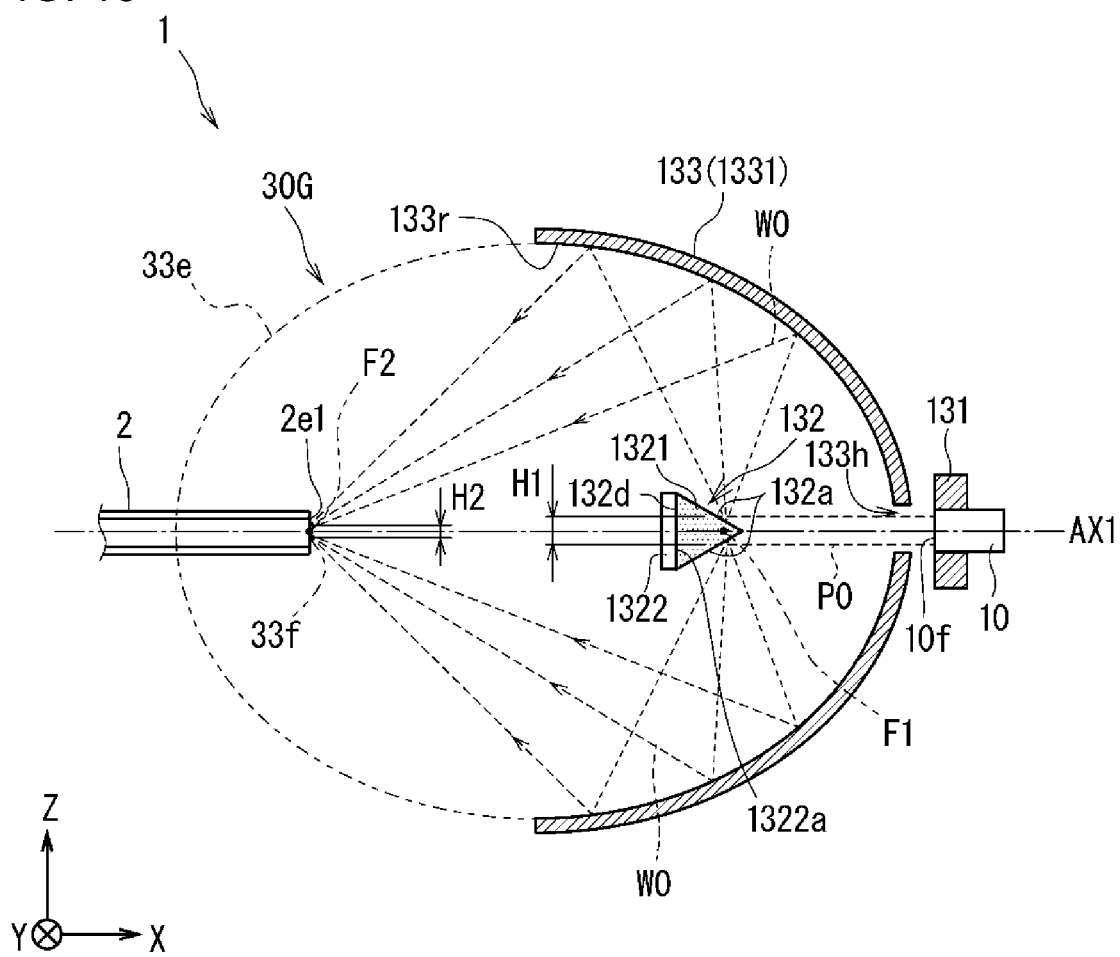
FIG. 15 is a schematic cross-sectional view of an example photoconversion device according to the fourth embodiment.

A light-emitting module 1 with an example structure according to the fourth embodiment illustrated in FIG. 15 includes a light-emitting element 10 and a photoconversion device 30G. In this example, the photoconversion device 30G has the same or similar structure as the photoconversion device 30 according to the first embodiment illustrated in FIG. 2. In the example of FIG. 15, excitation light P0 is emitted from an output portion 10f of the light-emitting element 10 toward the wavelength converter 132, instead of being through the first output end 2e2 of the first optical transmission fiber 2. The holder 131 holds the light-emitting element 10. The holder 131 may have, for example, a shape selected from various shapes and may hold the light-emitting element 10 in a manner selected from various manners. The photoconversion device 30G may be the photoconversion device 30 described in either of the first or second embodiment.

In this structure as well, the photoconversion device 30G includes, for example, the holder 131, the wavelength converter 132, and the optical element 133. The holder 131 holds the output portion 10f that serves as an output portion. The wavelength converter 132 includes the incident surface section 132a including a protruding surface to receive excitation light P0 and emits fluorescence W0 in response to the excitation light P0. The optical element 133 has a first focal point F1 or a conjugate point C1 surrounded by the incident surface section 132a to focus the fluorescence W0 onto the focusing plane 33f. Thus, the photoconversion device 30G including the optical element 133 with a small aberration can input the fluorescence W0 into the second optical transmission fiber 4 with high directivity and with high light intensity. The optical radiation module 5 can radiate the fluorescence W0 with high light intensity as illumination light I0.

In the illumination system 100G, for example, the optical radiation module 5 may not include the wavelength converter 132. The optical radiation module 5 is, for example, less likely to undergo temperature increase and can be miniaturized.

The optical element 133 included in the photoconversion device 30G may convert the fluorescence W0 to collimated light, similarly to the photoconversion device 30F. This structure may include a focusing optical system including a lens (not illustrated) between the optical element 133 and the focusing plane 33f to input the fluorescence W0 into the second input end 4e1 of the second optical transmission fiber 4.

1-2-4. Fifth Embodiment

Figure 16:
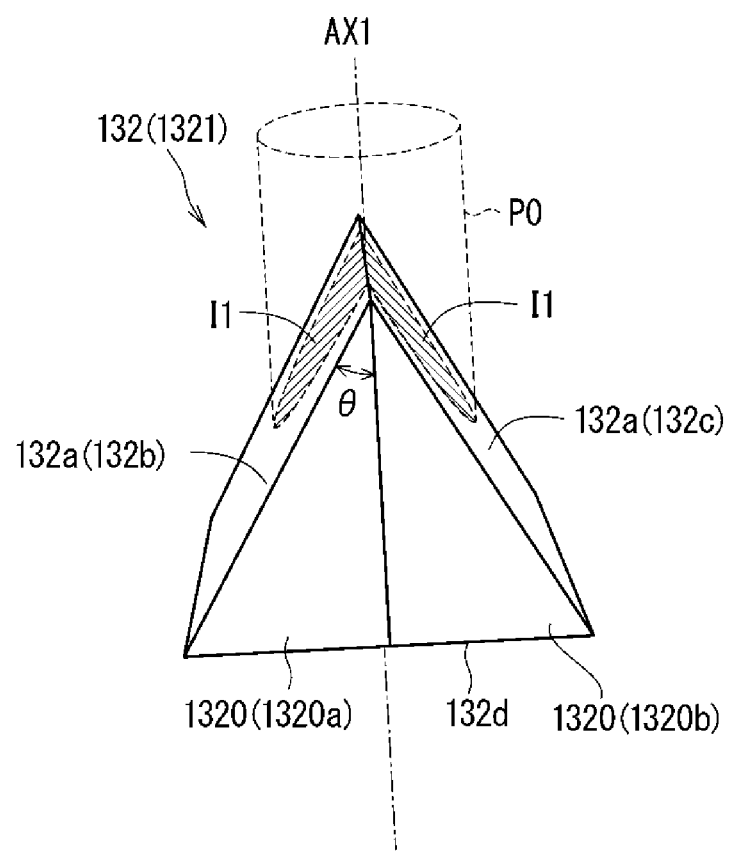
FIG. 16 is a schematic perspective view of a wavelength converter with an example structure according to a fifth embodiment.
Figure 17:
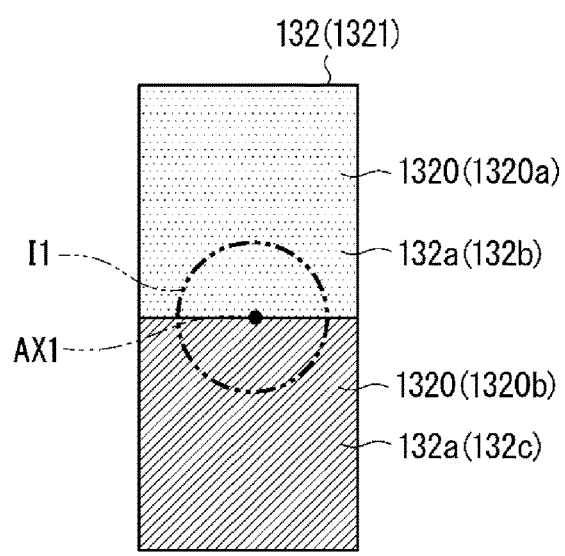
FIG. 17 is a schematic cross-sectional view of an example photoconversion device according to the fifth embodiment.
Figure 17:
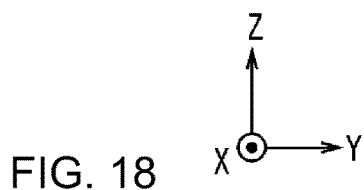

In the first to fourth embodiments described above, the wavelength converter 132 may include, for example, multiple phosphor areas 1320, as illustrated in FIGS. 16 and 17. In other words, the wavelength converter 132 (more specifically, the phosphor portion 1321) may include multiple phosphor areas 1320. The multiple phosphor areas 1320 include, for example, a first phosphor area 1320a and a second phosphor area 1320b. In the example of FIG. 16, the phosphor portion 1321 is in the shape of a triangular prism, and may have two portions into which the phosphor portion 1321 is equally divided with an XY plane. The two portions correspond to the first phosphor area 1320*a* and the second phosphor area 1320*b*. For example, the first phosphor area 1320*a* corresponds to the incident surface 132*b*, and the second phosphor area 1320*b* corresponds to the incident surface 132*c*. In other words, the surface of the first phosphor area 1320*a* in the positive X-direction is the incident surface 132*b*, and the surface of the second phosphor area 1320*b* in the positive X-direction is the incident surface 132*c*.

The first phosphor area 1320*a* emits, for example, fluorescence with a first wavelength spectrum in response to the excitation light P0. The second phosphor area 1320*b* emits, for example, fluorescence with a second wavelength spectrum different from the first wavelength spectrum in response to the excitation light P0. The fluorescence with the first wavelength spectrum and the fluorescence with the second wavelength spectrum may have, for example, different color temperatures. More specifically, the fluorescence with the first wavelength spectrum may be, for example, light with a first color temperature. The fluorescence with the second wavelength spectrum may be, for example, light with a second color temperature. The first color temperature may be, for example, 2650 Kelvin (K). The second color temperature may be, for example, 6500 K. The color temperature herein refers to, for example, the color temperature or the correlated color temperature specified in JIS Z 8725:2015.

Each phosphor area 1320 contains, for example, numerous phosphor particles of multiple types that each emit light with a different color. The ratio of the phosphor particles is different for each phosphor area 1320. For example, when each phosphor area 1320 contains red, green, and blue phosphors, the ratio of the red, green, and blue phosphors contained in the first phosphor area 1320*a* is different from the ratio of the red, green and blue phosphors contained in the second phosphor area 1320*b*. Each phosphor area 1320 can thus emit fluorescence W0 with a different wavelength spectrum. The fluorescence W0 emitted from the first phosphor area 1320*a* is also referred to as fluorescence W1, and the fluorescence W0 emitted from the second phosphor area 1320*b* is also referred to as fluorescence W2.

In the example of FIGS. 16 and 17, the excitation light P0 is incident across both the first phosphor area 1320*a* and the second phosphor area 1320*b*. More specifically, the illuminating area I1 is located across both the first phosphor area 1320*a* and the second phosphor area 1320*b*. In the example of FIGS. 16 and 17, the proportion of the first phosphor area 1320*a* and the proportion of the second phosphor area 1320*b* in the illuminating area I1 are similar to each other. The first phosphor area 1320*a* receives excitation light P0 and emits fluorescence W1. The second phosphor area 1320*b* receives excitation light P0 and emits fluorescence W2.

The photoconversion device 30 including the wavelength converter 132 can emit the fluorescence W1 and the fluorescence W2 that have wavelength spectra different from each other.

As in the first embodiment, the optical element 133 may focus, for example, the fluorescence W1 and the fluorescence W2 at the second input end 4*e*1 of the second optical transmission fiber 4 (refer also to FIG. 2). The fluorescence W1 and the fluorescence W2 mix spatially when being transmitted by the second optical transmission fiber 4. The illumination light 10 radiated from the optical radiation module 5 is thus less likely to have a color distribution. In this case, the optical radiation module 5 can radiate the illumination light 10 as a mixture of the colors of the fluorescence W1 and the fluorescence W2.

Figure 18:
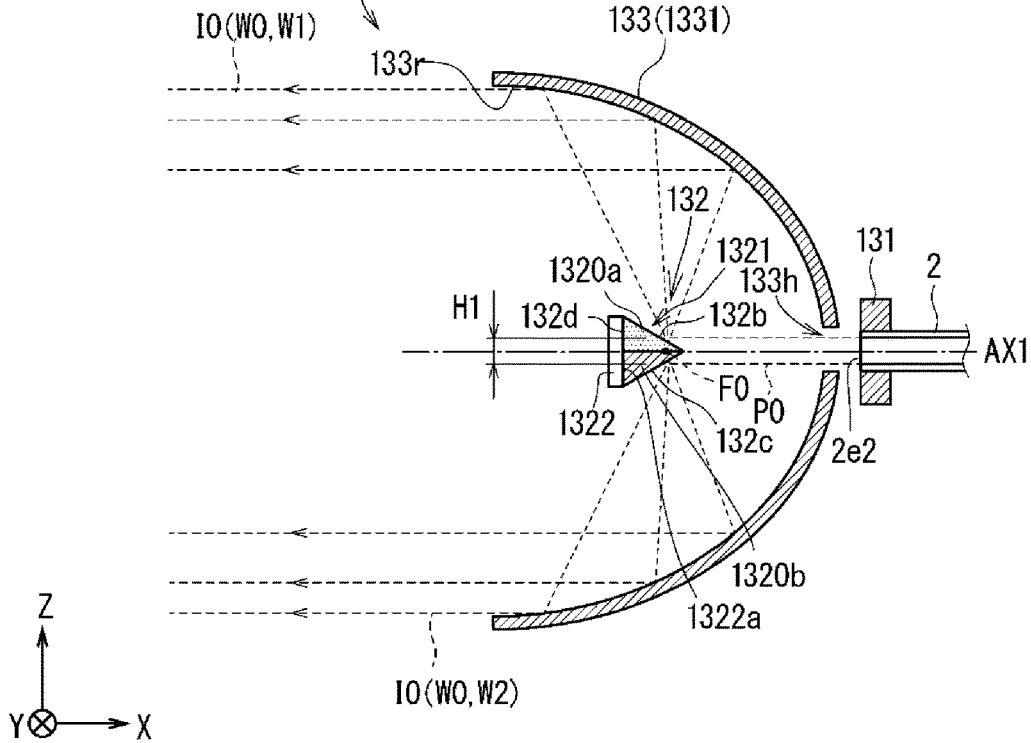
FIG. 18 is a schematic cross-sectional view of the photoconversion device according to the fifth embodiment.

As illustrated in, for example, FIG. 18, the photoconversion device 30 may also emit the fluorescence W1 and the fluorescence W2 into the external space 200 as illumination light 10 without being through the second optical transmission fiber 4. The photoconversion device 30 illustrated in FIG. 18 corresponds to the photoconversion device 30F in FIG. 13 with its wavelength converter 132 replaced by the wavelength converter 132 illustrated in FIGS. 16 and 17. The reflector 1331 reflects the fluorescence W1 and the fluorescence W2 emitted by the wavelength converter 132 and converts the fluorescence W1 and the fluorescence W2 to collimated light.

In the example of FIGS. 16 and 17, the incident surface 132*b* of the first phosphor area 1320*a* and the incident surface 132*c* of the second phosphor area 1320*b* are inclined in different directions. The fluorescence W1 emitted from the first phosphor area 1320*a* and the fluorescence W2 emitted from the second phosphor area 1320*b* can travel mainly in different directions. In the example of FIG. 18, the first phosphor area 1320*a* is located in the positive Z-direction from the second phosphor area 1320*b*, and the incident surface 132*b* of the first phosphor area 1320*a* faces in the positive Z-direction. In this structure, the first phosphor area 1320*a* can emit more fluorescence W1 mainly in the positive Z-direction. In contrast, the second phosphor area 1320*b* is located in the negative Z-direction from the first phosphor area 1320*a*, and the incident surface 132*c* of the second phosphor area 1320*b* faces in the negative Z-direction. In this structure, the second phosphor area 1320*b* can emit more fluorescence W2 mainly in the negative Z-direction.

Thus, the illumination light 10 emitted from the photoconversion device 30 in FIG. 18 can have a spatial color distribution in the Z-direction. The color distribution of the illumination light 10 is reflected in the color tones of an illumination object. The color tones of the illumination object can thus be changed partially. More specifically, the color tones can be varied between a part of the illumination object receiving more fluorescence W1 and a part of the illumination object receiving more fluorescence W2.

The photoconversion device 30 may be used for, for example, illumination in a stage performance to change the distribution of the color tones of an illumination object. The photoconversion device 30 may also be used as illumination for inspection equipment for inspecting an inspection object. For example, detecting defects in an inspection object including a substrate such as a semiconductor substrate may use illumination light with a different color depending on the type of defects to be detected. The first phosphor area 1320*a* is thus designed to emit fluorescence W1 for detecting a defect of a first type, and the second phosphor area 1320*b* is designed to emit fluorescence W2 for detecting a defect of a second type. This facilitates detection of defects of a first type in a portion receiving the fluorescence W1, and detection of defects of a second type in a portion receiving the fluorescence W2. The inspection object can be, for example, scanned using this illumination light to allow inspection entirely across the inspection object.

For the surface 1322*a* of the substrate 1322 being a reflective surface having the same or similar shape as the incident surface section 132*a* of the phosphor portion 1321 (refer also to FIG. 4) as well, the illumination light can have a notable spatial color distribution. This results from the fluorescence W1 from the first phosphor area 1320*a* traveling in the negative Z-direction and reflected from the surface 1322*a* of the substrate 1322 to travel in the positive Z-direction, and also from the fluorescence W2 traveling in the negative Z-direction likewise. An illumination object can thus have a more notable distribution of color tones.

When the optical element 133 focuses the fluorescence W1 and the fluorescence W2 onto the focusing plane 33*f*, the photoconversion device 30 may emit the fluorescence W1 and the fluorescence W2 as illumination light without being through the second optical transmission fiber 4. This can change the distribution of the color tones of the illumination object.

As described above, the color distribution of the illumination light I0 can be reduced by causing the light to travel through the second optical transmission fiber 4. However, when, for example, the second optical transmission fiber 4 is short, the illumination light I0 after traveling through the second optical transmission fiber 4 may possibly have a viewable color distribution. In this case, the illumination light I0 after traveling through the second optical transmission fiber 4 can also change the distribution of the color tones of the illumination object.

In the example of FIG. 17, the multiple phosphor areas 1320 in the wavelength converter 132 may have substantially the same size or may have different sizes. Although the two phosphor areas 1320 are illustrated in the example of FIG. 17, three or more phosphor areas 1320 may be provided. In this case, the excitation light P0 may be applied across three or more phosphor areas 1320.

1-2-5. Sixth Embodiment

Figure 19:
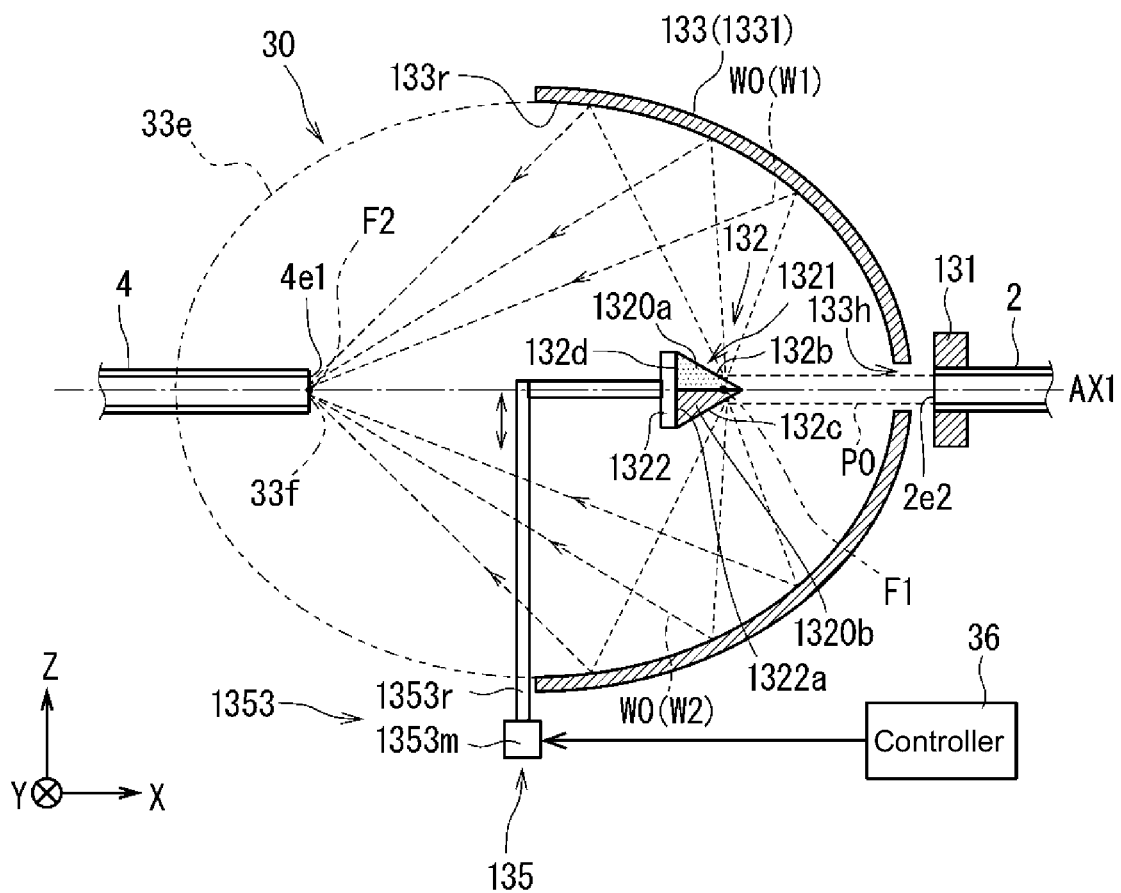
FIG. 19 is a schematic cross-sectional view of a photoconversion device with a first structure according to a sixth embodiment.

A photoconversion device 30 with a first structure according to a sixth embodiment illustrated in FIG. 19 has the same or similar structure as in the fifth embodiment, except that it includes a drive 135 and a controller 36. The drive 135 changes an illuminating area I1 that receives excitation light P0 in the multiple phosphor areas 1320. The drive 135 moves, for example, a part of at least one of the holder 131 or the wavelength converter 132 to change the relative positional relationship between the first output end 2*e*2 and the multiple phosphor areas 1320.

1-2-5-1. Linear Driving

Figure 20A:
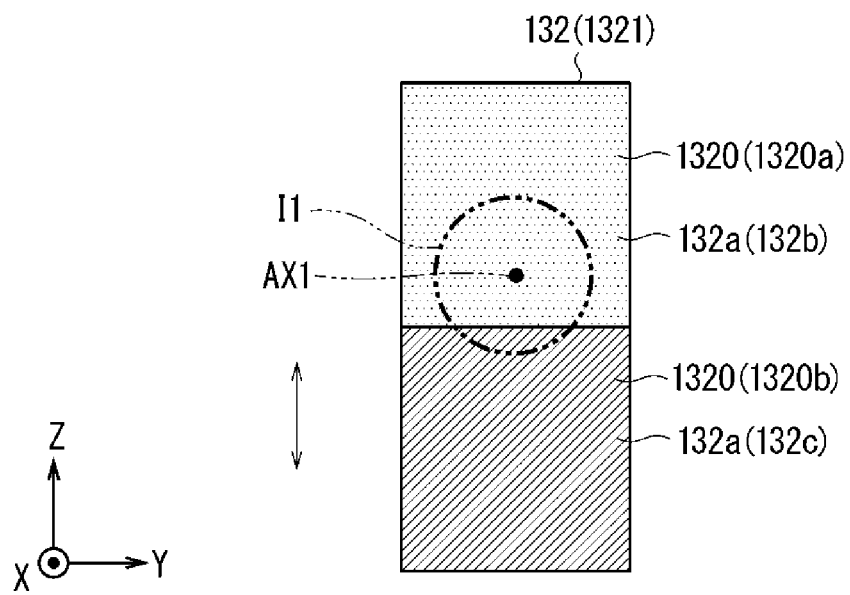
FIGS. 20A and 20B are diagrams of example multiple phosphor areas describing example movement of an illuminating area in a wavelength converter.
Figure 20B:
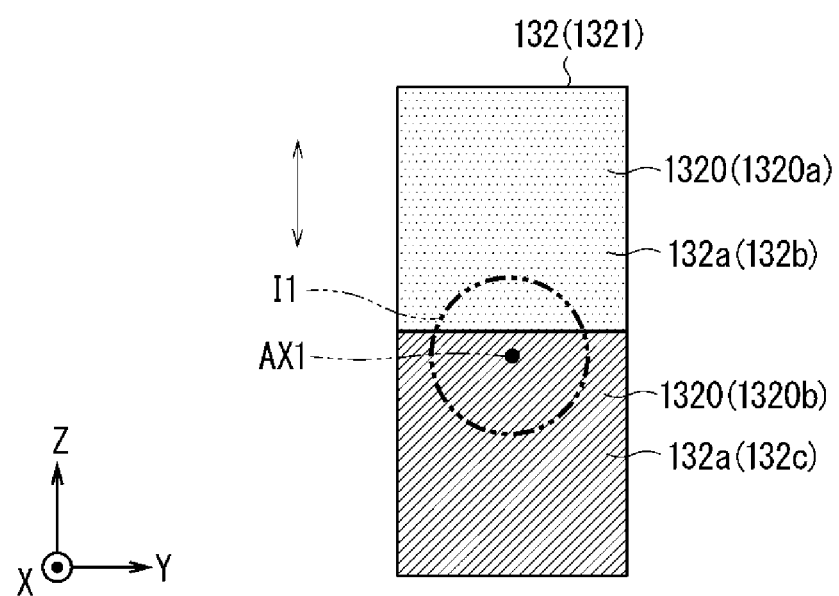

The first structure according to the sixth embodiment includes the drive 135 including a first linear mover 1353 as an example first mover for moving the wavelength converter 132 in the Z-direction intersecting with the optical axis AX1 as a first intersecting direction. The first linear mover 1353 includes, for example, a rod 1353*r* and a driver 1353*m*. The rod 1353*r* is, for example, an L-shaped rod having one end connected to the wavelength converter 132. The rod 1353*r* has its other opposite end connected to the driver 1353*m*. The driver 1353*m* moves, for example, the rod 1353*r* in the Z-direction. The driver 1353*m* includes, for example, a motor and a ball screw. In this example, the driver 1353*m* moves the rod 1353*r* in the Z-direction to move the wavelength converter 132 in the Z-direction. As illustrated in FIGS. 20A and 20B, for example, the multiple phosphor areas 1320 may move integrally in the Z-direction. The driver 1353*m* may be, for example, an actuator selected from various actuators.

The controller 36 may drive, for example, the drive 135 to change the illuminating area I1 receiving the excitation light P0 in the multiple phosphor areas 1320 and stop driving the drive 135 to define the illuminating area I1 in the multiple phosphor areas 1320. In the example of FIG. 19, the controller 36 drives the drive 135 to change the relative positional relationship between the first output end 2*e*2 as an output portion and the multiple phosphor areas 1320. In this example, the controller 36 controls the degree of movement of the wavelength converter 132 with the first linear mover 1353 by, for example, controlling the driver 1353*m* included in the first linear mover 1353. The controller 36 detects, for example, the rotation angle of the motor included in the driver 1353*m* to control the time to stop the motor. The controller 36 is, for example, a control board or a microcomputer. The microcomputer is a large-scale integration circuit (LSI) in which, for example, a central processing unit (CPU) and a memory are integrated. The controller 36 controls the operation of the drive 135 by, for example, transmitting and receiving a signal to and from the drive 135. The controller 36 may control, for example, the operation of the drive 135 in response to a signal from a device external to the photoconversion device 30.

The controller 36 may serve as a control circuit. The controller 36 includes at least one processor that performs control and processing for implementing various functions, as described in more detail below.

In various embodiments, the at least one processor may be a single integrated circuit (IC), multiple ICs connected to one another for mutual communication, and/or discrete circuits. The at least one processor may be implemented in accordance with various known technologies.

In one embodiment, the processor includes one or more circuits or units that perform one or more data computation procedures or processes by, for example, executing instructions stored in an associated memory. In another embodiment, the processor may be a piece of firmware (e.g., a discrete logic component) to perform one or more data computation procedures or processes.

In various embodiments, the processor may be one or more processors, controllers, microprocessors, microcontrollers, application-specific integrated circuits (ASICs), digital signal processors, programmable logic devices, field-programmable gate arrays, or may include any combination of these devices or components or any combination of other known devices and components, and may implement the functions described below.

The functions of the controller 36 may be implemented entirely or partially using hardware circuits, without using software to implement the functions.

In the example illustrated in FIG. 20, the wavelength converter 132 includes the multiple phosphor areas 1320 including the first phosphor area 1320*a* and the second phosphor area 1320*b*. When, for example, the wavelength converter 132 is viewed in plan in the direction along the optical axis AX1 of excitation light P0 as illustrated in FIG. 20, the multiple phosphor areas 1320 may be arranged in the Z-direction as the first intersection direction. In the example of FIG. 20, the first phosphor area 1320*a* and the second phosphor area 1320*b* are arranged in this order in the negative Z-direction.

The drive 135 can move, for example, the wavelength converter 132 in the Z-direction to move the illuminating area I1 on the multiple phosphor areas 1320. This movement changes the proportions of the multiple phosphor areas 1320 in the illuminating area I1. This thus changes, for example, the wavelength spectrum of the fluorescence W0 emitted by the wavelength converter 132.

In the example of FIGS. 20A and 20B, the illuminating area I1 is located across both the first phosphor area 1320*a* and the second phosphor area 1320*b*. In this case, for example, the fluorescence W0 emitted by the wavelength converter 132 is a mixture of the fluorescence with the first color temperature emitted from the first phosphor area 1320*a* and the fluorescence with the second color temperature emitted from the second phosphor area 1320b. For example, the mixing ratio of the fluorescence W1 having the first color temperature and the fluorescence W2 having the second color temperature may be determined in accordance with, for example, the proportions of the first phosphor area 1320a and the second phosphor area 1320b in the illuminating area I1. As illustrated in FIG. 20A, the proportion of the first phosphor area 1320a in the illuminating area I1 increases as the wavelength converter 132 moves more in the negative Z-direction. Thus, the proportion of the fluorescence W1 in the fluorescence W0 increases as the wavelength converter 132 moves more in the negative Z-direction. As illustrated in FIG. 20B, the proportion of the second phosphor area 1320b in the illuminating area I1 increases as the wavelength converter 132 moves more in the positive Z-direction. Thus, the proportion of the fluorescence W2 in the fluorescence W0 increases as the wavelength converter 132 moves more in the positive Z-direction.

In the example of FIG. 19, the optical element 133 focuses, for example, the fluorescence W1 and the fluorescence W2 at the second input end 4e1 of the second optical transmission fiber 4. The fluorescence W1 and the fluorescence W2 are transmitted by the second optical transmission fiber 4 and emitted from the optical radiation module 5 as illumination light I0. The fluorescence W1 and the fluorescence W2 mix spatially when being transmitted by the second optical transmission fiber 4. The illumination light I0 including the fluorescence W1 and the fluorescence W2 is then emitted from the optical radiation module 5.

The drive 135 thus moves the wavelength converter 132 to adjust the light intensity ratio between the fluorescence W1 and the fluorescence W2 and thus adjust the color tones of the illumination light I0. In other words, the colors of the illumination light I0 can be adjusted. When, for example, the second optical transmission fiber 4 is short, the illumination light I0 can have a spatial color distribution. This color distribution can also be adjusted.

The photoconversion device 30 may emit the fluorescence W1 and the fluorescence W2 into the external space 200 as illumination light I0 without being through the second optical transmission fiber 4 and the optical radiation module 5. In this case, the illumination light I0 can have a more notable color distribution.

In the first structure according to the sixth embodiment, the drive 135 moves the wavelength converter 132 to change the position of the first focal point F1 of the optical element 133 relative to the wavelength converter 132. The first focal point F1 may be surrounded by the incident surface section 132a of the wavelength converter 132 at least in a part of the range of movement of the wavelength converter 132 by the drive 135. With the first focal point F1 being surrounded by the incident surface section 132a of the phosphor portion 1321 when the wavelength converter 132 is within the part of its movement range, the photoconversion device 30 can emit fluorescence W1 and fluorescence W2 with higher directivity and with higher light intensity.

When the directivity and the light intensity are not to be considered, the first focal point F1 may be constantly outside the movement range of the wavelength converter 132. In this structure as well, the drive 135 can move the wavelength converter 132 to adjust the colors (or further the color distribution) of the illumination light I0.

Although the drive 135 moves the wavelength converter 132 in the above example, the drive 135 may move the holder 131 instead. More specifically, the drive 135 may move the holder 131 to change the relative positional relationship between the first output end 2e2 as an output portion and the multiple phosphor areas 1320. In other words, the drive 135 may move, for example, a part of at least one of the holder 131 or the wavelength converter 132 to change the relative positional relationship between the first output end 2e2 as an output portion and the multiple phosphor areas 1320. In this structure as well, the controller 36 may, for example, drive the drive 135 to change the illuminating area I1 receiving the excitation light P0 in the multiple phosphor areas 1320 and stop driving the drive 135 to define the illuminating area I1 in the multiple phosphor areas 1320.

Figure 21:
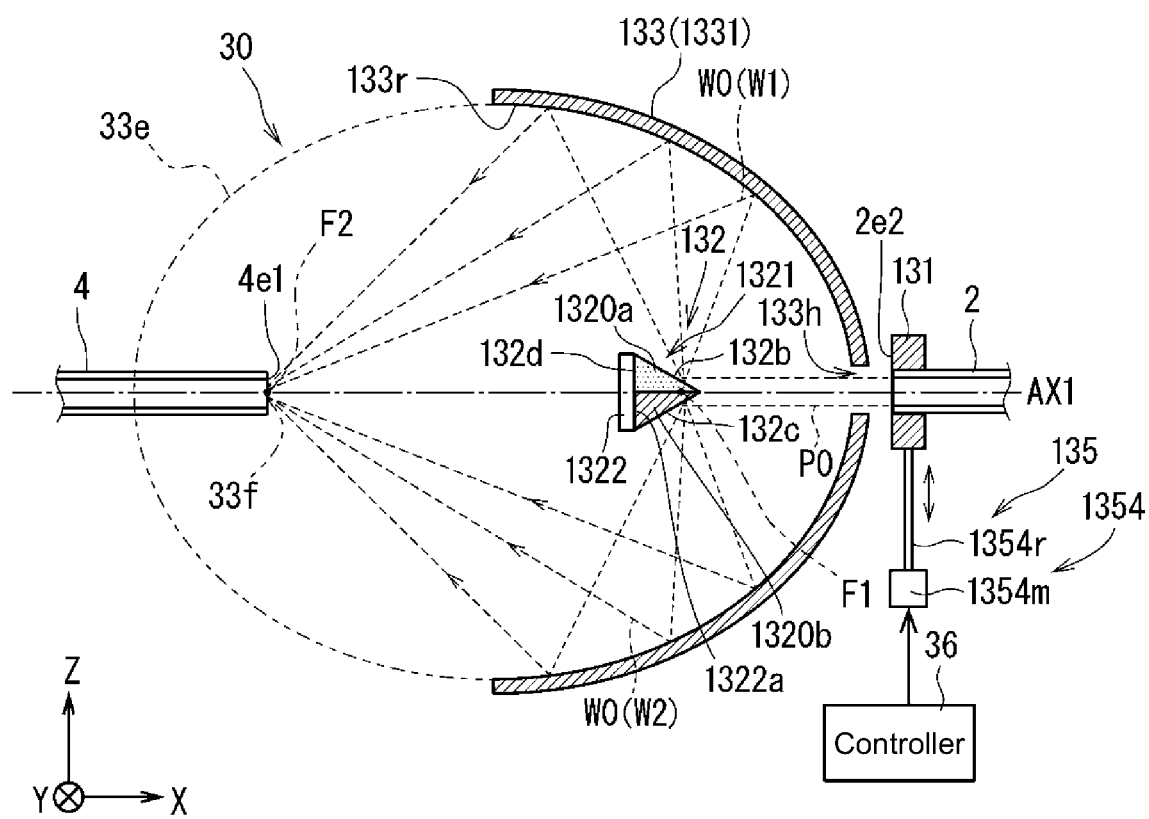
FIG. 21 is a schematic cross-sectional view of a photoconversion device with a second structure according to the sixth embodiment.

In the photoconversion device 30 with the second structure according to the sixth embodiment illustrated in FIG. 21, the drive 135 moves the holder 131. More specifically, the drive 135 includes a second linear mover 1354 as a first mover for moving the holder 131 in the Z-direction as the first intersecting direction. The second linear mover 1354 includes, for example, a rod 1354r and a driver 1354m. The rod 1354r is connected to, for example, the holder 131. The driver 1354m moves, for example, the rod 1354r in the Z-direction. The driver 1354m includes, for example, a motor and a ball screw. In this example, the driver 1354m moves, for example, the rod 1354r in the Z-direction to move the holder 131 and the first output end 2e2 in the Z-direction. The controller 36 controls, for example, the degree of movement and the position of the holder 131 in the Z-direction by controlling the rotational speed of the motor included in the driver 1354m. The controller 36 may control the time to stop the motor by, for example, detecting the rotational speed of the motor in the driver 1354m. The driver 1354m may be, for example, an actuator selected from various actuators.

Figure 22A:
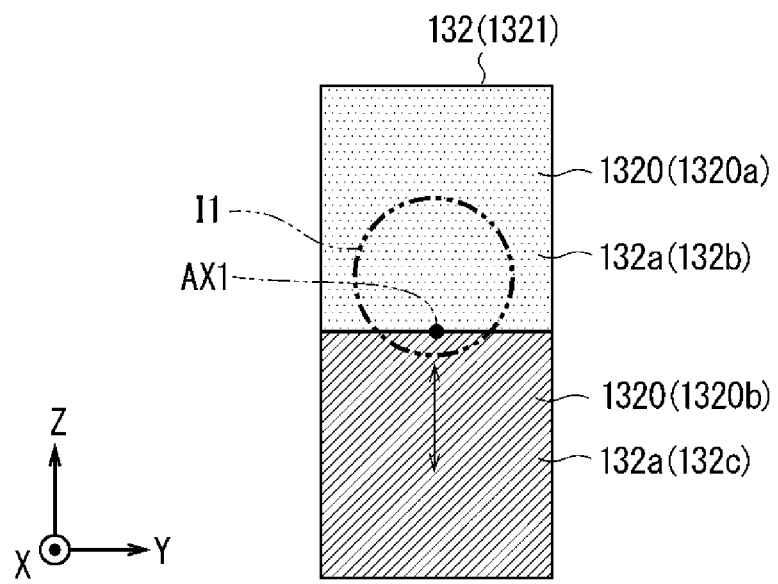
FIGS. 22A and 22B are diagrams of example multiple phosphor areas describing example movement of an illuminating area in a wavelength converter.
Figure 22B:
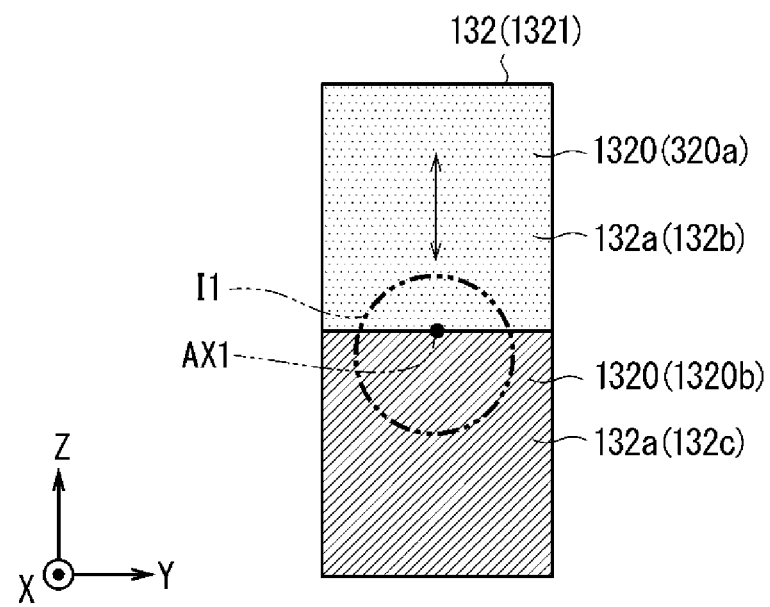

The drive 135 moves the holder 131 to cause, for example, the illuminating area I1 to move in the first intersecting direction (Z-direction) on the multiple phosphor areas 1320, as illustrated in FIGS. 22A and 22B. For example, the illuminating area I1 in the multiple phosphor areas 1320 may thus be changed. This structure also facilitates adjustment of the colors (or further the color distribution) of emission light from the photoconversion device 30, in the same manner as described above.

In the above example, the multiple phosphor areas 1320 in the wavelength converter 132 may have substantially the same size or may have different sizes.

The boundary between the first phosphor area 1320a and the second phosphor area 1320b is perpendicular to the first intersecting direction (Z-direction in this example), which is the direction of movement of the drive 135. However, the boundary between the phosphor areas 1320 may be inclined with respect to the first intersecting direction.

Although the two phosphor areas 1320 are illustrated in the above example, three or more phosphor areas 1320 may be provided. The three or more phosphor areas 1320 may not be all arranged in the first intersecting direction. When the wavelength converter 132 is viewed in plan along the optical axis AX1, the multiple phosphor areas 1320 may be arranged two-dimensionally and adjacent to each other. For example, the multiple phosphor areas 1320 may be arranged in a matrix. In this case, the drive 135 may move the wavelength converter 132 two-dimensionally. More specifically, the drive 135 may include both the first linear mover 1353 that moves at least one of the holder 131 or the wavelength converter 132 in the first intersecting direction (e.g., in the Z-direction) and another linear mover (not illustrated) that moves at least one of the holder 131 or the wavelength converter 132 along the optical axis AX1 and in the second intersecting direction (e.g., in the Y-direction)

intersecting with the first intersecting direction. The other linear mover has the same or similar structure as the first linear mover 1353 except the direction of its movement.

In the example of FIGS. 20A, 20B, 22A, and 22B, the illuminating area I1 is located across both the first phosphor area 1320a and the second phosphor area 1320b. However, the drive 135 may move the illuminating area I1 in the positive Z-direction from the first phosphor area 1320a and the second phosphor area 1320b to position the illuminating area I1 in the first phosphor area 1320a alone. Similarly, the drive 135 may position the illuminating area I1 in the second phosphor area 1320b alone.

1-2-5-2. Rotational Driving

Figure 23:
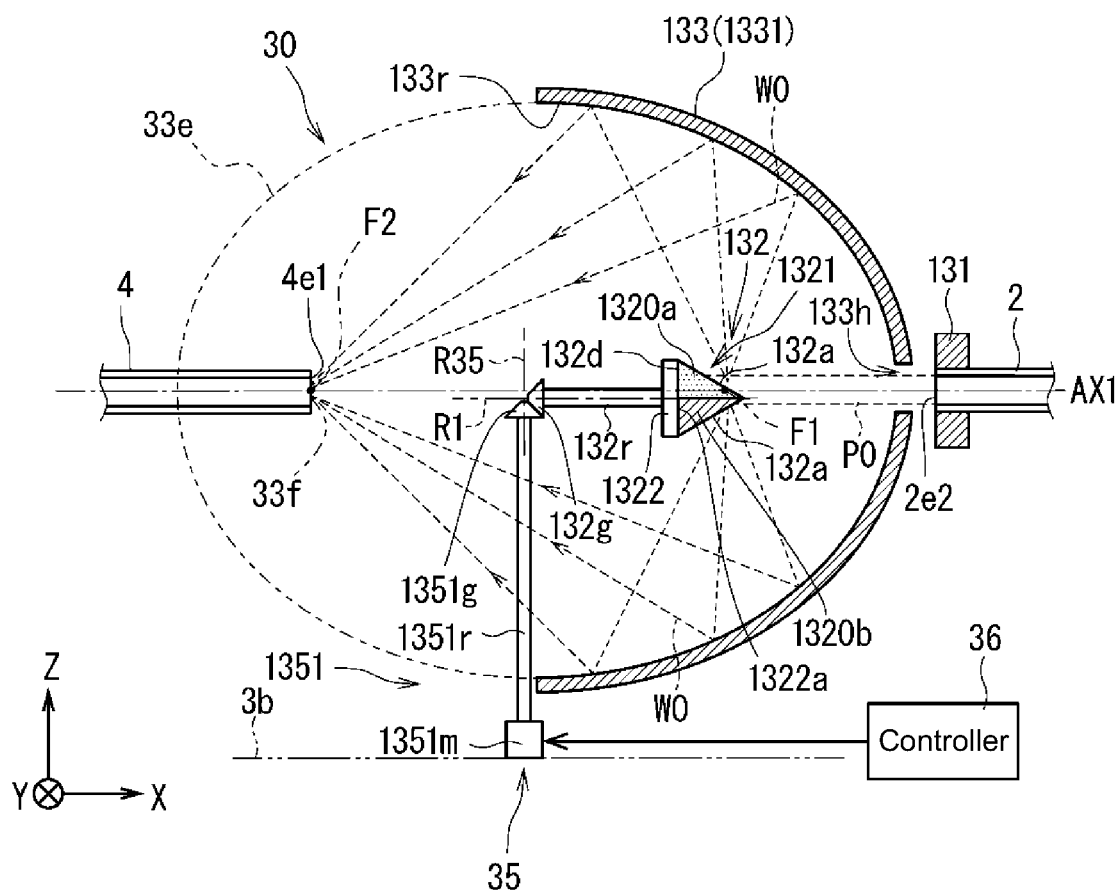
FIG. 23 is a schematic cross-sectional view of a photoconversion device with a third structure according to the sixth embodiment.

A photoconversion device 30 with a third structure according to the sixth embodiment illustrated in FIG. 23 includes a drive 135 including, for example, a unit 1351 (also referred to as a first rotator) that rotates the wavelength converter 132 about an imaginary rotation axis R1 (also referred to as a first rotation axis) different from the optical axis AX1 of the excitation light P0 that is applied to the wavelength converter 132.

Figure 24A:
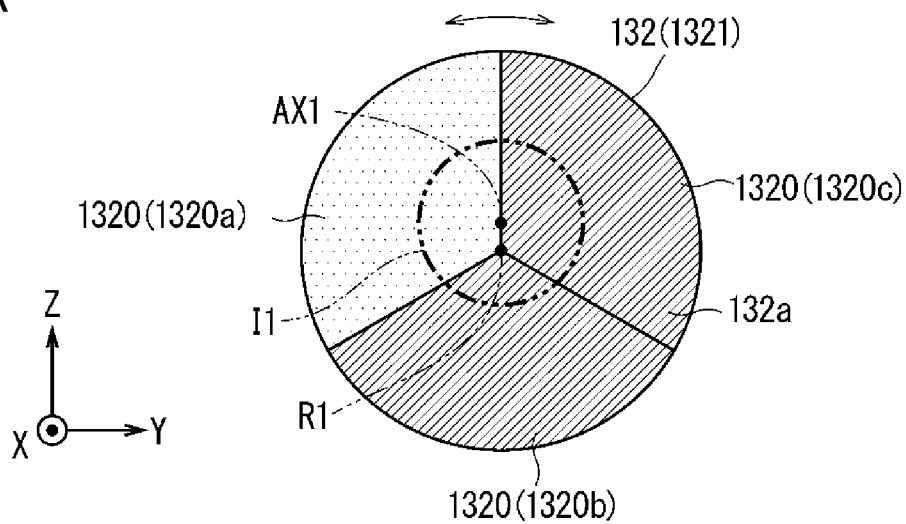
FIGS. 24A to 24C are diagrams of example multiple phosphor areas describing example movement of an illuminating area in a wavelength converter.
Figure 24B:
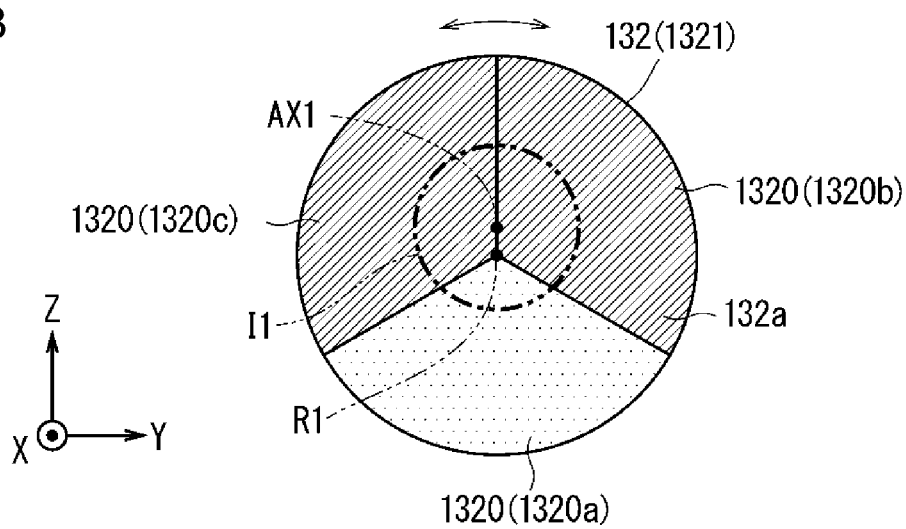
Figure 24C:
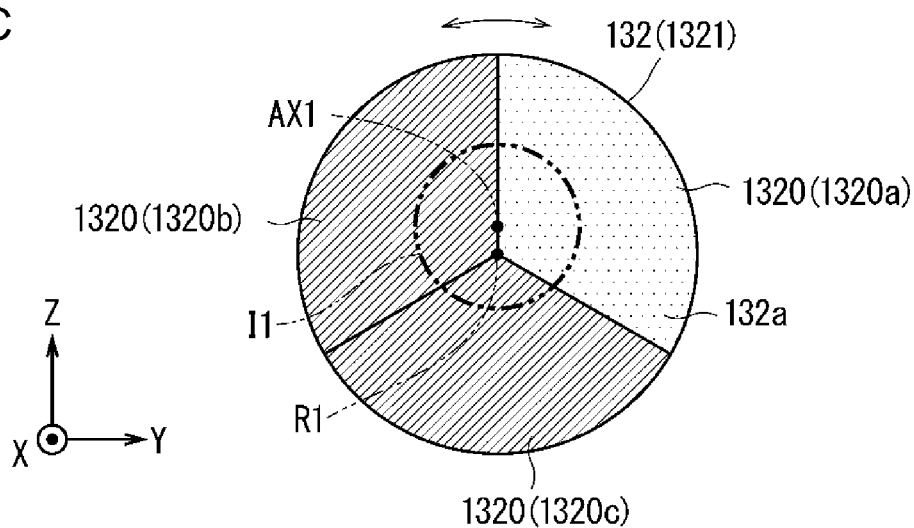

In the example of FIG. 23, the drive 135 moves, for example, the rod 132r connected to the wavelength converter 132 to change the illuminating area I1 in the multiple phosphor areas 1320. The rod 132r protrudes in the negative X-direction from the wavelength converter 132. The rod 132r has its distal end in the negative X-direction to which a bevel gear 132g is fixed. The rod 132r is, for example, supported by a housing 3b directly or indirectly with another member and can rotate about the first rotation axis R1 extending in the X-direction. The first rotator 1351 includes, for example, a motor 1351m, a rod 1351r, and a gear 1351g. The rod 1351r is elongated in the Z-direction. The rod 1351r has its distal end in the positive Z-direction to which, for example, a bevel gear 1351g is fixed. The gear 1351g meshes with the gear 132g. The motor 1351m rotates the rod 1351r and the gear 1351g about an imaginary rotation axis R35 extending in the Z-direction. Thus, for example, the torque of the gear 1351g is transmitted to the gear 132g to rotate the wavelength converter 132 about the first rotation axis R1. As illustrated in FIGS. 24A to 24C, for example, the multiple phosphor areas 1320 may thus rotate integrally about the first rotation axis R1.

The wavelength converter 132 includes multiple phosphor areas 1320 as illustrated in, for example, FIGS. 24A to 24C. In the example of FIGS. 24A to 24C, the multiple phosphor areas 1320 include a first phosphor area 1320a, a second phosphor area 1320b, and a third phosphor area 1320c. The first phosphor area 1320a emits, for example, fluorescence with a first wavelength spectrum in response to the excitation light P0. The second phosphor area 1320b emits, for example, fluorescence with a second wavelength spectrum different from the first wavelength spectrum in response to the excitation light P0. The third phosphor area 1320c emits, for example, fluorescence with a third wavelength spectrum different from the first wavelength spectrum and the second wavelength spectrum in response to the excitation light P0. The fluorescence with the first wavelength spectrum and the fluorescence with the second wavelength spectrum may have, for example, different color temperatures. The fluorescence with the third wavelength spectrum may be, for example, fluorescence with a color temperature different from the color temperature of fluorescence with the first wavelength spectrum and from the color temperature of fluorescence with the second wavelength spectrum. More specifically, the fluorescence with the first wavelength spectrum may be, for example, light with a first color temperature. The fluorescence with the second wavelength spectrum may be, for example, light with a second color temperature. The fluorescence with the third wavelength spectrum may be, for example, light with the third color temperature. The first color temperature may be, for example, 2650 K. The second color temperature may be, for example, 6500 K. The third color temperature may be 4000 K.

When, for example, the wavelength converter 132 is viewed in plan in the direction along the first rotation axis R1 as illustrated in FIGS. 24A to 24C, the multiple phosphor areas 1320 may be arranged circumferentially about the first rotation axis R1. For example, the first phosphor area 1320a, the second phosphor area 1320b, and the third phosphor area 1320c may be arranged in this order circumferentially about the first rotation axis R1.

In this case, the phosphor portion 1321 in the wavelength converter 132 may be in the shape of, for example, a circular cone or a hemisphere. The phosphor portion 1321 is circular as viewed in plan and may be used for the multiple phosphor areas 1320 arranged in the circumferential direction. The incident surface section 132a of the phosphor portion 1321 is defined by the surfaces of the first phosphor area 1320a, the second phosphor area 1320b, and the third phosphor area 1320c in the positive X-direction.

In this case, for example, the drive 135 rotates the wavelength converter 132 about the first rotation axis R1. This easily changes the proportions of the multiple phosphor areas 1320 in the illuminating area I1. Thus, the color temperature of the fluorescence emitted by the wavelength converter 132 can also be changed based on the proportions of the phosphor areas 1320. This structure facilitates adjustment of the colors (or further the color distribution) of illumination light I0 emitted from the photoconversion device 30.

In the above example, the drive 135 includes the first rotator 1351 that rotates the wavelength converter 132. However, the drive 135 may include a second rotator (not illustrated) that rotates the first output end 2e2, instead of or in addition to the first rotator 1351. In other words, the drive 135 may rotate at least one of the wavelength converter 132 or the first output end 2e2 to move the illuminating area I1 relative to the phosphor portion 1321, as illustrated in FIGS. 24A to 24C.

In the example of FIGS. 24A to 24C, the illuminating area I1 includes the first rotation axis R1. Thus, the illuminating area I1 includes the first phosphor area 1320a, the second phosphor area 1320b, and the third phosphor area 1320c. However, the positional relationship between the wavelength converter 132 and the first output end 2e2 may be defined to cause the illuminating area I1 to exclude the first rotation axis R1. In this case, the illuminating area I1 is located in a single phosphor area 1320 or across two adjacent phosphor areas 1320 depending on the position of rotation.

The multiple phosphor areas 1320 in the wavelength converter 132 may have substantially the same size or different sizes.

The wavelength converter 132 may include two, four, or more phosphor areas 1320. In other words, the wavelength converter 132 may include, for example, two or more phosphor areas 1320 arranged in the circumferential direction.

When the wavelength converter 132 is viewed in plan along the optical axis AX1, one of the multiple phosphor areas 1320 may be circular and include the optical axis AX1, and the other phosphor areas 1320 may be arranged circumferentially around the circular phosphor area 1320. With the illuminating area I1 partly in the circular phosphor area 1320 at any position of rotation, the photoconversion device 30 is used as appropriate for frequent use of fluorescence with the color temperature emitted from the circular phosphor area 1320. The circular phosphor area 1320 in the center may emit fluorescence with the same wavelength spectrum as fluorescence emitted from at least one phosphor area 1320 located adjacent to the phosphor area 1320 in the center.

1-2-5-3. Size of Illuminating Area

In a photoconversion device 30 with a fourth structure according to the sixth embodiment, the drive 135 may include, for example, a unit (also referred to as a second mover) that changes the distance between the holder 131 and the wavelength converter 132. In this case, for example, the drive 135 changes the distance between the first output end 2e2 as an output portion and the wavelength converter 132 to change the size of the illuminating area I1. The drive 135 thus changes, for example, the illuminating area I1 receiving the excitation light P0 in the multiple phosphor areas 1320. In this case as well, the controller 36 may drive, for example, the drive 135 to change the illuminating area I1 receiving the excitation light P0 in the multiple phosphor areas 1320 and stop driving the drive 135 to define the illuminating area I1 in the multiple phosphor areas 1320. This changes, for example, the wavelength spectrum of fluorescence W0 emitted by the wavelength converter 132 to adjust the colors of emission light from the photoconversion device 30.

Figure 25:
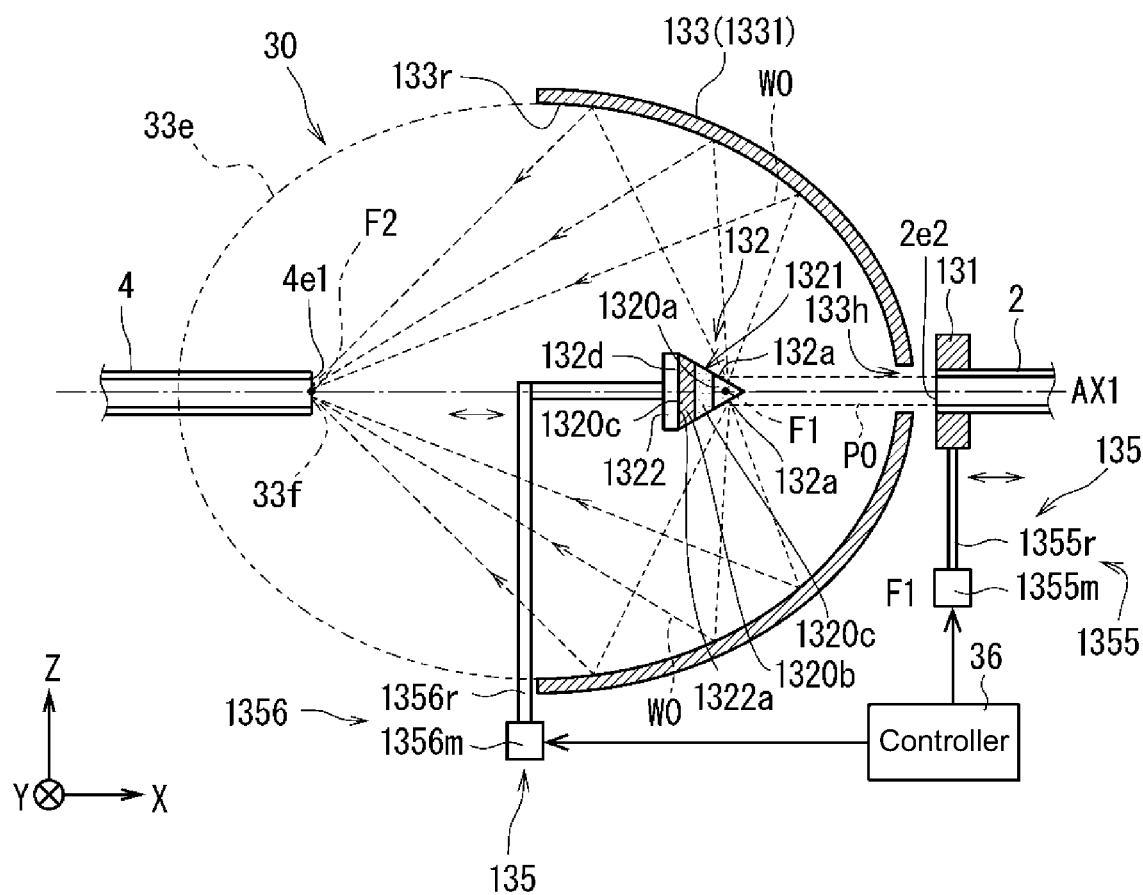
FIG. 25 is a schematic cross-sectional view of a photoconversion device with a fourth structure according to the sixth embodiment.

In a photoconversion device 30 with the fourth structure according to the sixth embodiment illustrated in FIG. 25, the drive 135 includes a third linear mover 1355 as an example second mover for moving the holder 131 in the X-direction as the direction along the optical axis AX1. The third linear mover 1355 includes, for example, a rod 1355r and a driver 1355m. The rod 1355r is connected to, for example, the holder 131. The driver 1355m moves, for example, the rod 1355r in the X-direction. The driver 1355m includes, for example, a motor and a ball screw. In this example, the driver 1355m moves the rod 1355r in the X-direction to move the holder 131 in the X-direction. The controller 36 controls, for example, the degree of movement and the position of the holder 131 in the X-direction by controlling the rotational speed of the motor included in the driver 1355m. The controller 36 may control the time to stop the motor by, for example, detecting the rotational speed of the motor in the driver 1355m. The driver 1355m may be, for example, an actuator selected from various actuators.

In the photoconversion device 30 with the fourth structure according to the sixth embodiment illustrated in FIG. 25, the drive 135 includes a fourth linear mover 1356 as an example second mover for moving the wavelength converter 132 in the X-direction as the direction along the optical axis AX1. The fourth linear mover 1356 includes, for example, a rod 1356r and a driver 1356m. The rod 1356r is connected to, for example, the wavelength converter 132. The driver 1356m moves, for example, the rod 1356r in the X-direction. The driver 1356m includes, for example, a motor and a ball screw. In this example, the driver 1356m moves the rod 1356r in the X-direction to move the wavelength converter 132 in the X-direction. The controller 36 controls, for example, the degree of movement and the position of the wavelength converter 132 in the X-direction by controlling the rotational speed of the motor included in the driver 1356m. The controller 36 may control the time to stop the motor by, for example, detecting the rotational speed of the motor in the driver 1356m. The driver 1356m may be, for example, an actuator selected from various actuators. For example, the photoconversion device 30 may include at least one of the third linear mover 1355 or the fourth linear mover 1356.

Figure 26A:
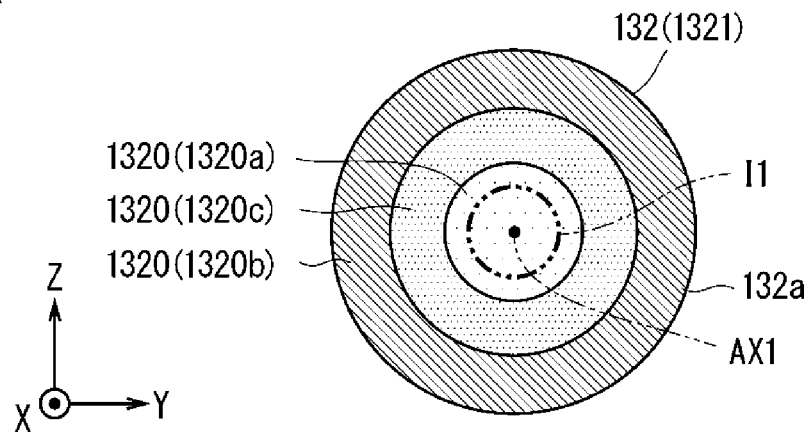
FIGS. 26A to 26C are diagrams of example multiple phosphor areas describing example movement of an illuminating area in a wavelength converter.
Figure 26B:
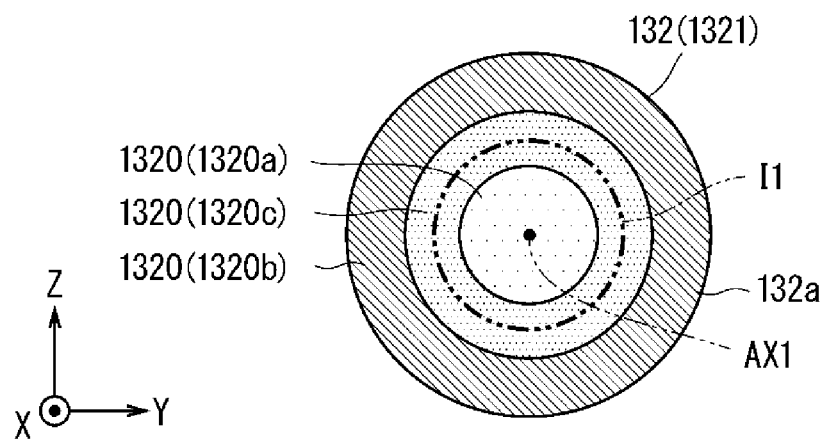
Figure 26C:
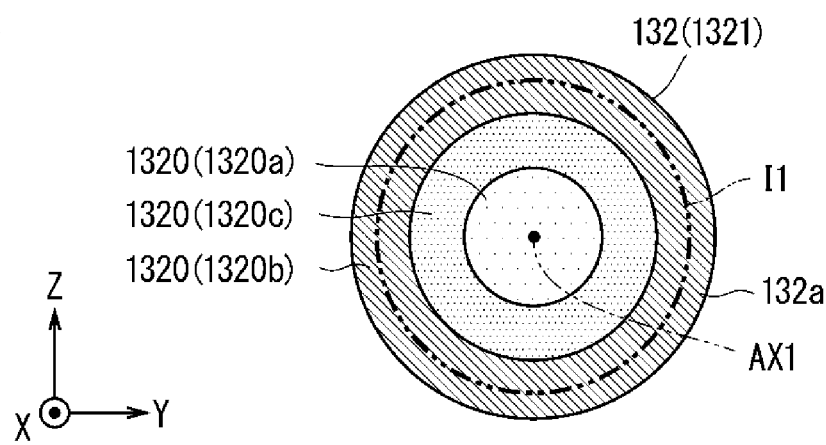

When, for example, the wavelength converter 132 is viewed in plan in the X-direction (more specifically, in the negative X-direction) as the optical axis direction of the excitation light P0 as illustrated in FIGS. 26A to 26C, the multiple phosphor areas 1320 may be arranged in a direction apart from the optical axis AX1.

In the example of FIGS. 26A to 26C, the first to third phosphor areas 1320a to 1320c are arranged concentrically. In this case, the phosphor portion 1321 in the wavelength converter 132 may be in the shape of, for example, a circular cone or a hemisphere. The phosphor portion 1321 is circular as viewed in plan and may be used for multiple phosphor areas 1320 arranged concentrically. The incident surface section 132a of the phosphor portion 1321 is defined by the surfaces of the first phosphor area 1320a, the second phosphor area 1320b, and the third phosphor area 1320c in the positive X-direction.

The driving performed by the drive 135 allows, for example, the distance between the first output end 2e2 and the wavelength converter 132 to be changed to change the size of the illuminating area I1 as illustrated in FIGS. 26A to 26C. This easily changes the proportions of the multiple phosphor areas 1320 in the illuminating area I1. This structure thus facilitates, for example, adjustment of the colors of fluorescence in the photoconversion device 30. In the example of FIG. 26A, the illuminating area I1 includes the first phosphor area 1320a alone. Thus, for example, the fluorescence W0 emitted by the wavelength converter 132 is fluorescence with the first color temperature emitted from the first phosphor area 1320a. When, for example, the distance between the first output end 2e2 and the wavelength converter 132 is longer, the illuminating area I1 has a greater diameter. In this case, the illuminating area I1 includes the first phosphor area 1320a and the third phosphor area 1320c as illustrated in FIG. 26B. In this case, for example, the fluorescence W0 emitted by the wavelength converter 132 is a mixture of fluorescence with the first color temperature emitted from the first phosphor area 1320a and fluorescence with the third color temperature emitted from the third phosphor area 1320c. For example, the mixing ratio of the fluorescence with the first color temperature and the fluorescence with the third color temperature may be determined in accordance with, for example, the proportions of the first phosphor area 1320a and the third phosphor area 1320c in the illuminating area I1. When, for example, the distance between the first output end 2e2 and the wavelength converter 132 is still longer, the illuminating area I1 has a still greater diameter. In this case, the illuminating area I1 includes the first phosphor area 1320a, the third phosphor area 1320c, and the second phosphor area 1320b as illustrated in FIG. 26C. In this case, for example, the fluorescence W0 emitted by the wavelength converter 132 is a mixture of fluorescence with the first color temperature emitted from the first phosphor area 1320a, fluorescence with the third color temperature emitted from the third phosphor area 1320c, and fluorescence with the second color temperature emitted from the second phosphor area 1320b. For example, the mixing ratio of the fluorescence with the first color temperature, the fluorescence with the third color temperature, and the fluorescence with the second color temperature may be determined in accordance with, for example, the proportions of the first phosphor area 1320a, the third phosphor area 1320c, and the second phosphor area 1320b in the illuminating area I1.

The wavelength converter 132 (specifically, the surface 132d of the phosphor portion 1321) has a diameter of, for example, about 0.1 to 20 mm. The first phosphor area 1320a has a diameter of about 0.1 to 10 mm. The illuminating area I1 has a diameter of, for example, about 0.1 to 10 mm. When, for example, viewed in plan in the direction along the optical axis AX1, the wavelength converter 132 and the multiple phosphor areas 1320 may each have a shape other than a circle, such as a rectangle.

1-3. Others

In each of the above embodiments, for example, the fluorescence with the first wavelength spectrum, the fluorescence with the second wavelength spectrum, and the fluorescence with the third wavelength spectrum may each be fluorescence with a specific color. For example, the fluorescence with the first wavelength spectrum may be red (R) fluorescence, the fluorescence with the second wavelength spectrum may be green (G) fluorescence, and the fluorescence with the third wavelength spectrum may be blue (B) fluorescence. In this case, for example, the first phosphor area 1320a may contain a red phosphor, the second phosphor area 1320b may contain a green phosphor, and the third phosphor area 1320c may contain a blue phosphor.

In each of the above embodiments, for example, the wavelength converter 132 may include multiple phosphor areas 1320 that are integral with one another, or may include two or more portions formed separately and then multiple phosphor areas 1320 are arranged in the multiple portions as appropriate.

In each of the above embodiments, for example, the color temperature or the color of the fluorescence W0 emitted from each of the photoconversion devices 30, 30F, and 30G may be detected by a sensor, and the controller 36 may control the driving of the drive 135 based on the detection result.

In each of the above embodiments, for example, the reflective surface 133r may be a concave surface displaced from the imaginary ellipsoid 33e, and may reflect the fluorescence W0 focused using an optical system. For example, the reflective surface 133r may extend along a paraboloid, and collimated light of the fluorescence W0 reflected from the reflective surface 133r may be focused through a condenser lens.

In each of the above embodiments, for example, any of the X-direction, Y-direction, and Z-direction may be the vertical direction, or any other direction may be the vertical direction.

In the first structure and the second structure according to the above sixth embodiment, for example, the drive 135 may include rods 1353r and 1354r both elongated in the Y-direction and to be swung with the drivers 1353m and 1354m. In these structures as well, the drive 135 moves, for example, the wavelength converter 132 and the holder 131 relative to each other in the direction intersecting with the optical axis AX1.

In each of the above embodiments, for example, the drive 135 may include, between the output portion and the wavelength converter 132, an optical system that is moved to change the illuminating area I1 receiving the excitation light P0 in the multiple phosphor areas 1320. The optical system may include various components including a lens, a prism, and a reflector. The optical system may be moved by translating, rotating, and swinging various components. The illuminating area I1 being changed includes, for example, the illuminating area I1 being moved by redirecting the traveling direction of the excitation light P0, or the illuminating area I1 with the diameter being increased or decreased by increasing or decreasing the beam diameter of the excitation light P0.

Figure 27:
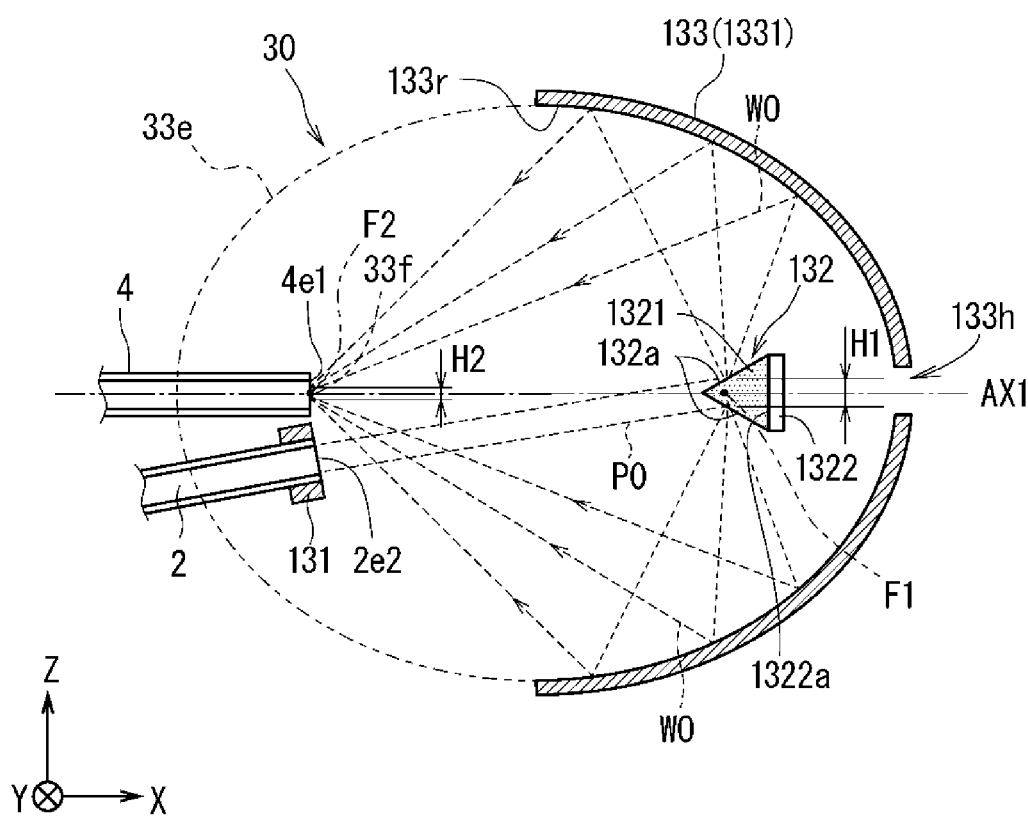
FIG. 27 is a schematic cross-sectional view of an example photoconversion device according to a variation.

In the above example, the optical element 133 includes the reflector 1331, and the incident surface section 132a of the wavelength converter 132 includes a protruding surface protruding toward the through-hole 133h (specifically, in the positive X-direction) of the reflector 1331 (refer to, for example, FIG. 2). The excitation light P0 is then output through the first output end 2e2 from the through-hole 133h of the reflector 1331 toward the incident surface section 132a of the wavelength converter 132. As illustrated in FIG. 27, the wavelength converter 132 may be installed to have the incident surface section 132a protruding in the opposite direction (specifically, in the negative X-direction). In this case, the first output end 2e2 may be located in the negative X-direction from the wavelength converter 132. With the incident surface section 132a of the wavelength converter 132 including a protruding surface in this case as well, the photoconversion device 30 can emit fluorescence W0 with high directivity and with high light intensity as in the first embodiment.

For the reflector 1331 focusing the fluorescence W0 onto the focusing plane 33f, the first optical transmission fiber 2 may be located to avoid an area in which the fluorescence W0 travels from each point on the reflective surface 133r to the focusing plane 33f. The first optical transmission fiber 2 can thus avoid blocking the fluorescence W0.

The through-hole 133h may not be formed. With the drive 135 driving the wavelength converter 132 as in, for example, the sixth embodiment, the rod may extend in the negative X-direction from the surface of the wavelength converter 132 in the negative X-direction and may extend through the through-hole 133h. In this case, the drive 135 may drive the rod. This structure allows the drive 135 to be outside the reflector 1331. The drive 135 can thus avoid blocking the fluorescence W0.

The first optical transmission fiber 2 as a first transmitter and the second optical transmission fiber 4 as a second transmitter may each include multiple dads. In some embodiments, the first optical transmitter and the second optical transmitter may be, for example, light guides. Each light guide may be, for example, a bundle of multiple optical fibers, or a flexible tube (made of, for example, acrylic resin) that allows excitation light P0 to be reflected from its inner circumferential surface, or a flexible linear light-transmissive member without dads or coating that allows excitation light P0 to be transmitted inside the light-transmissive member.

2-1. Seventh Embodiment

A known light source directs excitation light toward a first phosphor and a second phosphor arranged adjacent to each other in a predetermined direction and allows the light to be incident on the first phosphor and the second phosphor from the opposite sides. This light source directs first excitation light emitted from a first light source to be incident on the first phosphor from the side opposite to the second phosphor, and directs second excitation light emitted from a second light source to be incident on the second phosphor from the side opposite to the first phosphor. The first phosphor receives the first excitation light and emits fluorescence. The second phosphor receives the second excitation light and emits fluorescence. The first phosphor and the second phosphor each emit fluorescence with the same color. The light source reflects the fluorescence with a reflector and emits the fluorescence in a predetermined direction. When the first phosphor and the second phosphor each contain phosphor substances that emit red (R) fluorescence, green (G) fluorescence, and blue (B) fluorescence, for example, the light source emits pseudo white light.

However, this light source includes multiple light sources, thus complicating the structure of the light source system and increasing the manufacturing cost.

The inventors of the present disclosure thus have developed a technique for simplifying the structures of a photoconversion device and an illumination system including the photoconversion device.

2-1-1. Illumination System

An example illuminating system according to a seventh embodiment is the same as or similar to the system in FIG. 1.

2-1-2. Photoconversion Device

Figure 28:
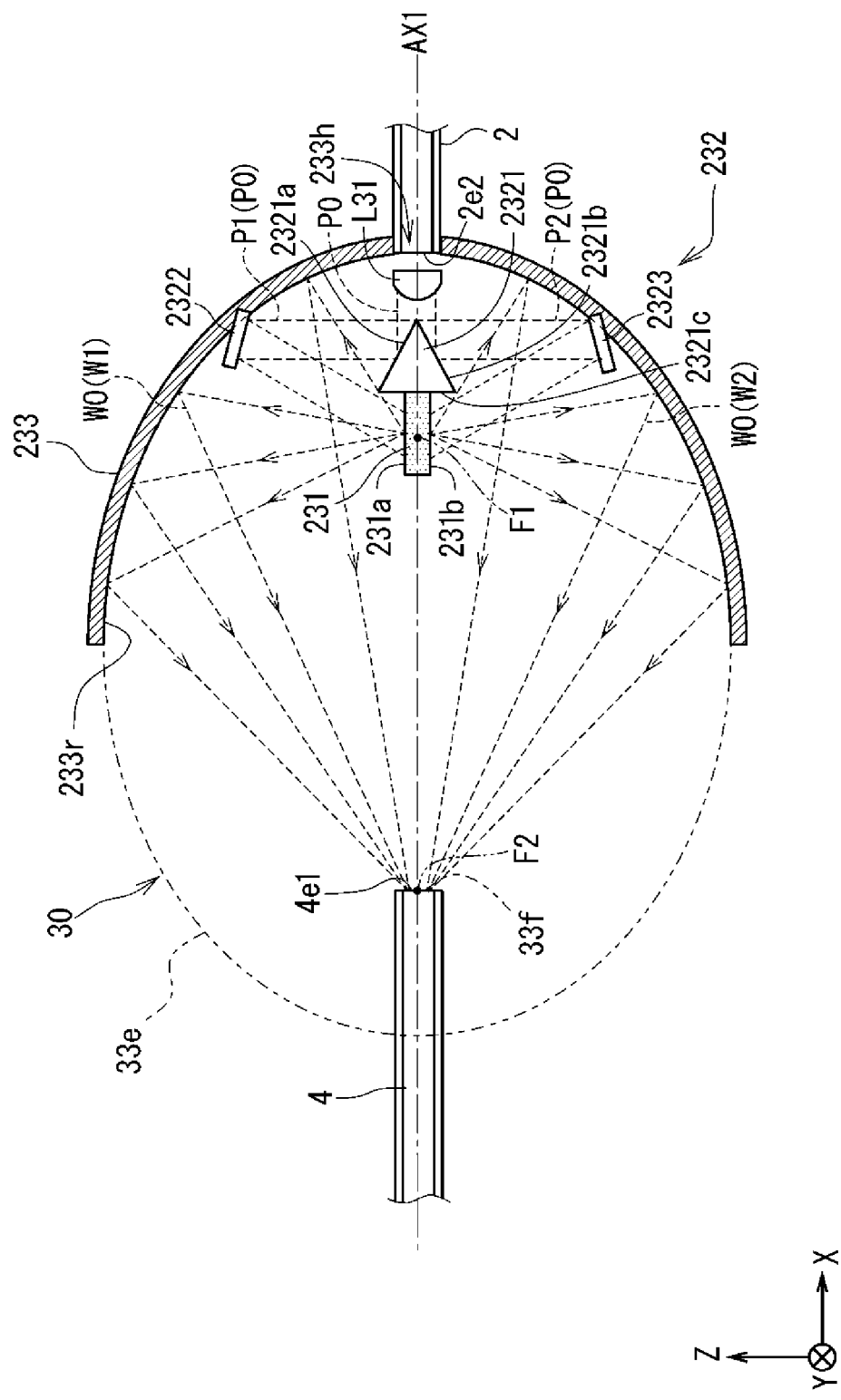
FIG. 28 is a schematic cross-sectional view of a photoconversion device with an example structure according to a seventh embodiment.

FIG. 28 is a schematic diagram of a photoconversion device 30 with an example structure according to the seventh embodiment. As illustrated in FIG. 28, the photoconversion device 30 includes, for example, a first wavelength converter 231 and a splitter optical system 232. These components of the photoconversion device 30 are fixed to a housing 3b of a relay 3 either directly or indirectly with, for example, another member. An optical axis AX1 is hereafter, for example, an optical axis of the first output end 2e2. In the example of FIG. 28, the optical axis AX1 extends in the X-direction.

The first wavelength converter 231 can emit fluorescence W0 in response to the excitation light P0. The first wavelength converter 231 is, for example, on the optical axis AX1. The first wavelength converter 231 includes a surface 231a (hereafter referred to as a first incident surface) and another surface opposite to the first incident surface 231a (hereafter referred to as a second incident surface 231b). The first incident surface 231a and the second incident surface 231b face each other in the direction intersecting with the optical axis AX1 (e.g., in the Z-direction). The first incident surface 231a and the second incident surface 231b are, for example, flat surfaces parallel to each other. The first wavelength converter 231 may be, for example, rectangular. The first incident surface 231a receives first excitation light P1. The second incident surface 231b receives second excitation light P2. The first excitation light P1 and the second excitation light P2 are split from the excitation light P0 as described below. The first wavelength converter 231 including the first incident surface 231a and the second incident surface 231b protrudes in the positive X-direction. In other words, the protruding surface of the incident surface section of the first wavelength converter 231 includes the first incident surface 231a and the second incident surface 231b.

Figure 29:
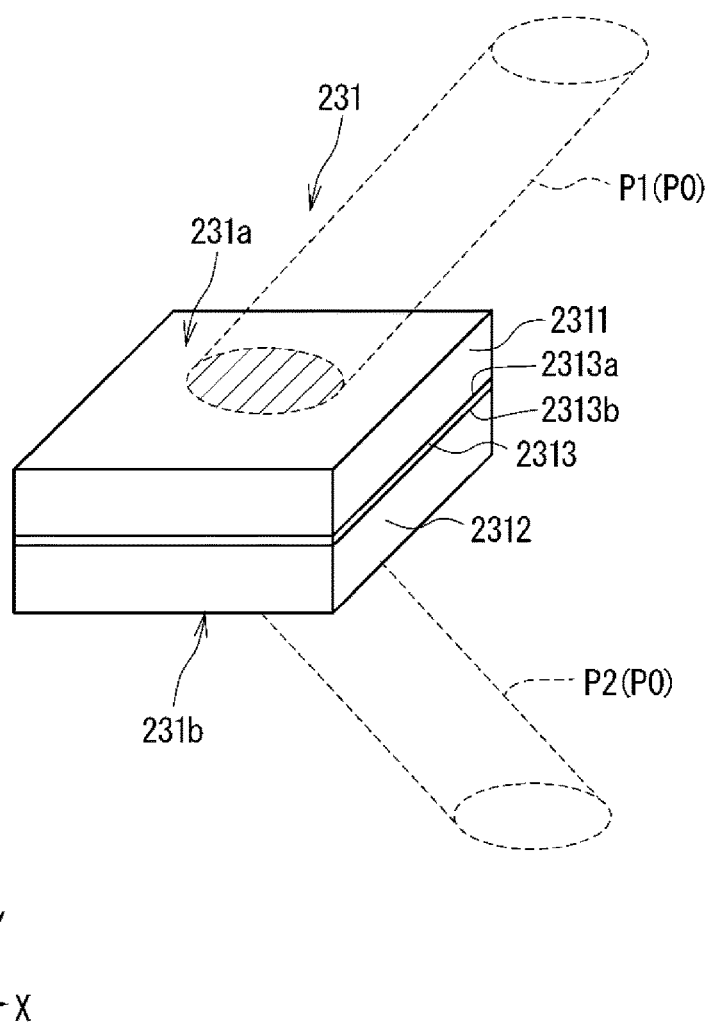
FIG. 29 is a schematic perspective view of a wavelength converter with an example structure.

The first wavelength converter 231 contains a phosphor. The first wavelength converter 231 contains the same or similar phosphor as the phosphor portion 1321. The phosphor portion may be, for example, located on a predetermined substrate. FIG. 29 is a schematic perspective view of a first wavelength converter 231 with an example structure. As illustrated in FIG. 29, the first wavelength converter 231 may include a first phosphor portion 2311, a second phosphor portion 2312, and a substrate 2313.

The substrate 2313 is a plate with a thickness in the Z-direction. The substrate 2313 includes a main surface 2313a in the positive Z-direction on which the first phosphor portion 2311 is located, and a main surface 2313b in the negative Z-direction on which the second phosphor portion 2312 is located.

The first phosphor portion 2311 includes a first incident surface 231a. More specifically, the surface of the first phosphor portion 2311 opposite to the substrate 2313 is the first incident surface 231a. The first phosphor portion 2311 emits fluorescence W0 based on first excitation light P1 incident on the first incident surface 231a. The first phosphor portion 2311 has an example structure described above.

The second phosphor portion 2312 includes a second incident surface 231b. More specifically, the surface of the second phosphor portion 2312 opposite to the substrate 2313 is the second incident surface 231b. The second phosphor portion 2312 emits fluorescence W0 based on second excitation light P2 incident on the second incident surface 231b. The second phosphor portion 2312 has an example structure described above.

The first phosphor portion 2311 and the second phosphor portion 2312 may each have, for example, the same structure. The first phosphor portion 2311 and the second phosphor portion 2312 having the same structure refer to, for example, these phosphor portions manufactured under the same specifications. Thus, the first phosphor portion 2311 and the second phosphor portion 2312 each emit fluorescence W0 with substantially the same wavelength spectrum. The first phosphor portion 2311 and the second phosphor portion 2312 each emit fluorescence W0 with substantially the same color.

The substrate 2313 may be transparent or reflective. In the example described below, the substrate 2313 has reflective surfaces as the main surface 2313a and the main surface 2313b. A material for the substrate 2313 may be, for example, the same as or similar to the material for the substrate 1322 described above.

Similarly to the substrate 1322, the substrate 2313 may include the main surface 2313a and the main surface 2313b being layers of a metal material with a higher light reflectance than its main part (also referred to as high light reflection layers).

Although the substrate 2313 is between the first phosphor portion 2311 and the second phosphor portion 2312 in the example of FIG. 29, the structure is not limited to this example. For the substrate 2313 being transparent, for example, a structure including the first phosphor portion 2311 and the second phosphor portion 2312 may be located on the main surface 2313a of the substrate 2313. In this case, the first phosphor portion 2311 and the second phosphor portion 2312 may be integral with each other. The substrate 2313 may be located to have a thickness in the X-direction or the Y-direction. In this case, the substrate 2313 may be located on a side surface of the structure including the first phosphor portion 2311 and the second phosphor portion 2312 that are integral with each other.

Referring now to FIG. 28, the splitter optical system 232 includes, for example, a splitter 2321, a first optical path changer 2322, and a second optical path changer 2323. The splitter optical system 232 splits excitation light P0 output through the first output end 2e2 of the first optical transmission fiber 2 into first excitation light P1 and second excitation light P2. The splitter optical system 223 directs the first excitation light P1 to the first incident surface 231a of the first wavelength converter 231 and the second excitation light P2 to the second incident surface 231b of the first wavelength converter 231.

The splitter 2321 is located, for example, between the first wavelength converter 231 and the first output end 2e2 on the optical axis AX1. The splitter 2321 splits the excitation light P0 output through the first output end 2e2 into the first excitation light P1 and the second excitation light P2.

Figure 30:
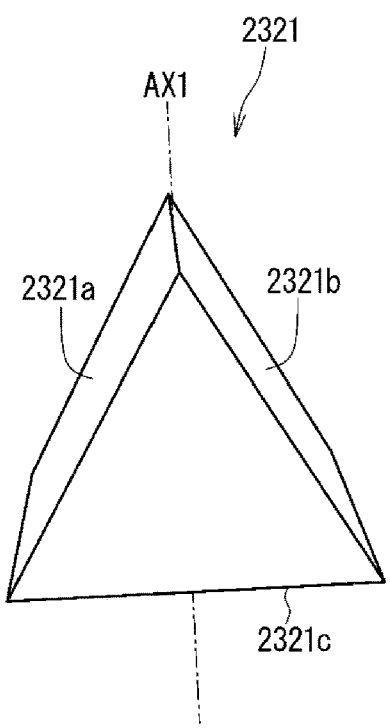
FIG. 30 is a schematic perspective view of a splitter with an example structure.

FIG. 30 is a schematic perspective view of an example splitter 2321. The splitter 2321 includes, for example, a third incident surface 2321a and a fourth incident surface 2321b. The third incident surface 2321a and the fourth incident surface 2321b are continuous with each other. The excitation light P0 is incident across the boundary between the third incident surface 2321a and the fourth incident surface 2321b (refer also to FIG. 28). More specifically, a portion of the excitation light P0 is incident on the third incident surface 2321a, and the remaining portion of the excitation light P0 is incident on the fourth incident surface 2321b.

The fourth incident surface 2321b is inclined with respect to the third incident surface 2321a. In the example of FIGS. 28 and 30, the third incident surface 2321a and the fourth incident surface 2321b are, for example, flat surfaces and together define a V shape. More specifically, the third incident surface 2321a and the fourth incident surface 2321b are joined to each other at an acute angle. The third incident surface 2321a and the fourth incident surface 2321b are inclined toward each other in the Z-direction toward the first output end 2e2 in the X-direction. In the example of FIG. 28, the boundary between the third incident surface 2321a and the fourth incident surface 2321b is aligned with the optical axis AX1.

The splitter 2321 causes the excitation light P0 to be incident on the third incident surface 2321a and the fourth incident surface 2321b to split the excitation light P0 into a first portion and a second portion. More specifically, the splitter 2321 causes the first portion of the excitation light P0 that is incident on the third incident surface 2321a and the second portion of the excitation light P0 that is incident on the fourth incident surface 2321b to travel in different directions to split the excitation light P0 into the first portion and the second portion. The first portion corresponds to the first excitation light P1. The second portion corresponds to the second excitation light P2. In other words, the first portion is the first excitation light P1 before being split, whereas the second portion is the second excitation light P2 before being split. The third incident surface 2321a and the fourth incident surface 2321b are, for example, reflective surfaces. With the third incident surface 2321a and the fourth incident surface 2321b inclined in different directions, the first excitation light P1 reflected from the third incident surface 2321a and the second excitation light P2 reflected from the fourth incident surface 2321b travel in different directions. This allows spatial splitting of the excitation light P0 into the first excitation light P1 and the second excitation light P2.

As illustrated in FIG. 30, the splitter 2321 may be in the shape of a triangular prism. The splitter 2321 is installed to have one rectangular side surface of the triangular prism (referred to as a surface 2321c) perpendicular to the optical axis AX1 and one side of the triangular prism facing the first output end 2e2. The remaining two rectangular side surfaces of the splitter 2321 correspond to the third incident surface 2321a and the fourth incident surface 2321b. A material for the splitter 2321 may be, for example, the same as or similar to the material for the substrate 2313 described above.

In the example of FIG. 28, the third incident surface 2321a is located in the positive Z-direction from the fourth incident surface 2321b. Thus, the first portion of the excitation light P0 reflected from the third incident surface 2321a travels in the positive Z-direction as the first excitation light P1. The second portion of the excitation light P0 reflected from the fourth incident surface 2321b travels in the negative Z-direction as the second excitation light P2.

As illustrated in FIG. 28, the splitter 2321 may be connected to the first wavelength converter 231. More specifically, the surface 2321c of the splitter 2321 may be joined to the surface of the first wavelength converter 231 in the positive X-direction. In this case, the splitter 2321 may serve as a substrate for the first wavelength converter 231. In this case, the first wavelength converter 231 may not include the substrate 2313. The first phosphor portion 2311 and the second phosphor portion 2312 may be integral with each other.

The first optical path changer 2322 is an optical element that directs the first excitation light P1 from the splitter 2321 to the first incident surface 231a of the first wavelength converter 231. In the example of FIG. 28, the first excitation light P1 travels from the splitter 2321 in the positive Z-direction. The first optical path changer 2322 is thus located in the positive Z-direction from the splitter 2321. The first optical path changer 2322 includes, for example, a mirror that reflects the first excitation light P1 to be incident on the first incident surface 231a of the first wavelength converter 231. In the example of FIG. 28, the first excitation light P1 is obliquely incident on the first incident surface 231a.

The second optical path changer 2323 is an optical element that directs the second excitation light P2 from the splitter 2321 to the second incident surface 231b of the first wavelength converter 231. In the example of FIG. 28, the second excitation light P2 travels from the splitter 2321 in the negative Z-direction. The second optical path changer 2323 is thus located in the negative Z-direction from the splitter 2321. The second optical path changer 2323 includes, for example, a mirror that reflects the second excitation light P2 to be incident on the second incident surface 231b of the first wavelength converter 231. In the example of FIG. 28, the second excitation light P2 is obliquely incident on the second incident surface 231b.

The first wavelength converter 231 emits fluorescence W0 based on the first excitation light P1 and the second excitation light P2. FIG. 28 illustrates beams representing the fluorescence W0 radiated from a single point on the first incident surface 231a and beams representing the fluorescence W0 radiated from a single point on the second incident surface 231b. In an actual operation, the phosphors at multiple positions in the first wavelength converter 231 each emit the fluorescence W0. The same applies to any other wavelength converter described below.

In the example of FIG. 28, the photoconversion device 30 also includes a reflector 233. The reflector 233 is also accommodated in, for example, the housing 3b for the relay 3 (not illustrated in FIG. 2) and is fixed directly or indirectly to the housing 3b. In the example of FIG. 28, the reflector 233 includes a reflective surface 233r that is the same as or similar to the reflective surface 133r of the reflector 1331.

In the example of FIG. 28, the reflective surface 233r is concave in the direction from the first wavelength converter 231 toward the splitter 2321 and surrounds the first wavelength converter 231 and the splitter optical system 232. In other words, the first wavelength converter 231 and the splitter optical system 232 are located inside the reflective surface 233r. An imaginary YZ cross section of the reflective surface 233r is, for example, circular. More specifically, for example, the imaginary YZ cross section of the reflective surface 233r may be circular and centered at a point on the optical axis AX1. The imaginary circular cross section of the reflective surface 233r along a YZ plane has a maximum diameter of, for example, about 1 to 10 cm.

The reflector 233 includes, for example, a through-hole 233h through which the excitation light P0 passes. The first optical transmission fiber 2 may have, for example, its part including the first output end 2e2 being received in the through-hole 233h. In this case, the excitation light P0 is transmitted through this part of the first optical transmission fiber 2 to pass through the through-hole 233h.

The ellipsoid 33e along which the reflective surface 233r extends has a focal point F1 (also referred to as a first focal point) located, for example, inside the first wavelength converter 231. In other words, the first wavelength converter 231 is aligned with the first focal point F1 on the reflective surface 233r. This structure allows the fluorescence W0 emitted by the first wavelength converter 231 to be focused near a second focal point F2 with the reflector 233. The second focal point F2 is another focal point of the ellipsoid 33e. The second focal point F2 is different from the first focal point F1.

The focusing plane 33f is aligned with the second focal point F2. In other words, the focusing plane 33f is aligned with the second focal point F2. The focusing plane 33f may be either an imaginary plane or an actual surface. In the seventh embodiment, for example, the focusing plane 33f is aligned with the second input end 4e1 of the second optical transmission fiber 4.

In this structure, the fluorescence W0 emitted by the first wavelength converter 231 near the first focal point F1 is reflected from the reflective surface 233r and is focused onto the focusing plane 33f aligned with the second focal point F2. This can increase, for example, the light intensity of the fluorescence W0 transmitted by the second optical transmission fiber 4.

The first optical path changer 2322 and the second optical path changer 2323 included in the splitter optical system 232 may be attached to the reflector 233 as illustrated in FIG. 28.

As illustrated in, for example, FIG. 28, the photoconversion device 30 may also include an optical system L31 including, for example, a lens that directs the excitation light P0 output through the first output end 2e2 of the first optical transmission fiber 2 to be focused on the splitter 2321.

The photoconversion device 30 may further include, for example, an optical system (not illustrated), such as a lens, that focuses the fluorescence W0 emitted by the first wavelength converter 231 and reflected from the reflective surface 233r toward the second input end 4e1 of the second optical transmission fiber 4.

2-1-3. Overview of Seventh Embodiment

The photoconversion device 30 includes, for example, the first wavelength converter 231 and the splitter optical system 232. The first wavelength converter 231 includes the first incident surface 231a on its first end (e.g., in the positive Z-direction) and the second incident surface 231b on its second end (e.g., in the negative Z-direction) opposite to the first end, and emits fluorescence W0 in response to the excitation light P0. In the example of FIG. 28, the first end and the second end are opposite to each other in the direction intersecting with the optical axis AX1. The splitter optical system 232 splits, for example, the excitation light P0 output through the first output end 2e2 into first excitation light P1 and second excitation light P2, and directs the first excitation light P1 to the first incident surface 231a of the first wavelength converter 231 and the second excitation light P2 to the second incident surface 231b of the first wavelength converter 231. This structure allows the first excitation light P1 to be incident on the first incident surface 231a of the first wavelength converter 231 and the second excitation light P2 to be incident on the second incident surface 231b of the first wavelength converter 231 using the single output portion (in other words, the single first output end 2e2) for outputting the excitation light P0. This simplifies the structure of the light source system and reduces the manufacturing cost.

The first excitation light P1 is incident on the first incident surface 231a, and the second excitation light P2 is incident on the second incident surface 231b. As compared with when the excitation light is incident on either of the two surfaces alone, the excitation light P0 is incident on a larger area of the first wavelength converter 231. This increases, for example, the light intensity of the fluorescence W0. The first incident surface 231a and the second incident surface 231b are located opposite to each other with respect to the first focal point F1. More specifically, the first focal point F1 is located inside the first wavelength converter 231. Thus, the first wavelength converter 231 can emit fluorescence W0 near the first focal point F1. The reflector 233 can focus the fluorescence W0 onto the focusing plane 33f with high directivity. This improves the coupling efficiency of the second optical transmission fiber 4.

In the above example, the splitter optical system 232 is surrounded by the reflector 233. The splitter optical system 232 splits a single beam of excitation light P0 passing through the through-hole 233h of the reflector 233 into first excitation light P1 and second excitation light P2 inside the reflector 233. The splitter optical system 232 may then direct the first excitation light P1 onto the first incident surface 231a and the second excitation light P2 onto the second incident surface 231b.

A comparative structure including a splitter optical system 232 and a first output end 2e2 located outside a reflector 233 will now be described. In this comparative example, the splitter optical system 232 and the first output end 2e2 are located in the positive X-direction from the reflector 233. In this structure as well, the splitter optical system 232 can split the excitation light P0 into first excitation light P1 and second excitation light P2. To allow the first excitation light P1 and the second excitation light P2 outside the reflector 233 to enter the internal space, the reflector 233 includes one through-hole for the first excitation light P1 and another through-hole for the second excitation light P2. In other words, the reflector 233 includes the two through-holes to allow the excitation light to pass through.

In contrast, the splitter optical system 232 in the above example splits the excitation light P0 into the first excitation light P1 and the second excitation light P2 inside the reflector 233. The reflector 233 thus includes the single through-hole 233h to allow the excitation light P0 to enter the internal space of the reflector 233 and can have a simplified structure. This reduces the manufacturing cost of the reflector 233.

As illustrated in FIG. 28, the splitter optical system 232 may allow the first excitation light P1 to be obliquely incident on the first incident surface 231a. This allows the first excitation light P1 to be incident on a larger area of the first incident surface 231a. This reduces the light intensity of the first excitation light P1 per unit area. The same applies to the second excitation light P2. This thus reduces the amount of heat per unit area generated in the first wavelength converter 231 and reduces the temperature increase in the first wavelength converter 231.

A phosphor or a sealant (also referred to as a binder) included in the first wavelength converter 231 can be degraded or altered under heat, possibly causing temperature quenching. The temperature increase in the first wavelength converter 231 is reduced to reduce heat that may cause issues described above.

Although the splitter 2321 is a mirror with the third incident surface 2321a and the fourth incident surface 2321b being reflective surfaces in the above example, the structure is not limited to this example. For example, the splitter 2321 may include a prism or a semitransparent mirror. The splitter 2321 may be any optical element that can spatially split the excitation light P0.

2-2. Other Embodiments

The present disclosure is not limited to the seventh embodiment described above and may be changed or varied without departing from the spirit and scope of the present disclosure.

2-2-1. Eighth Embodiment

Figure 31:
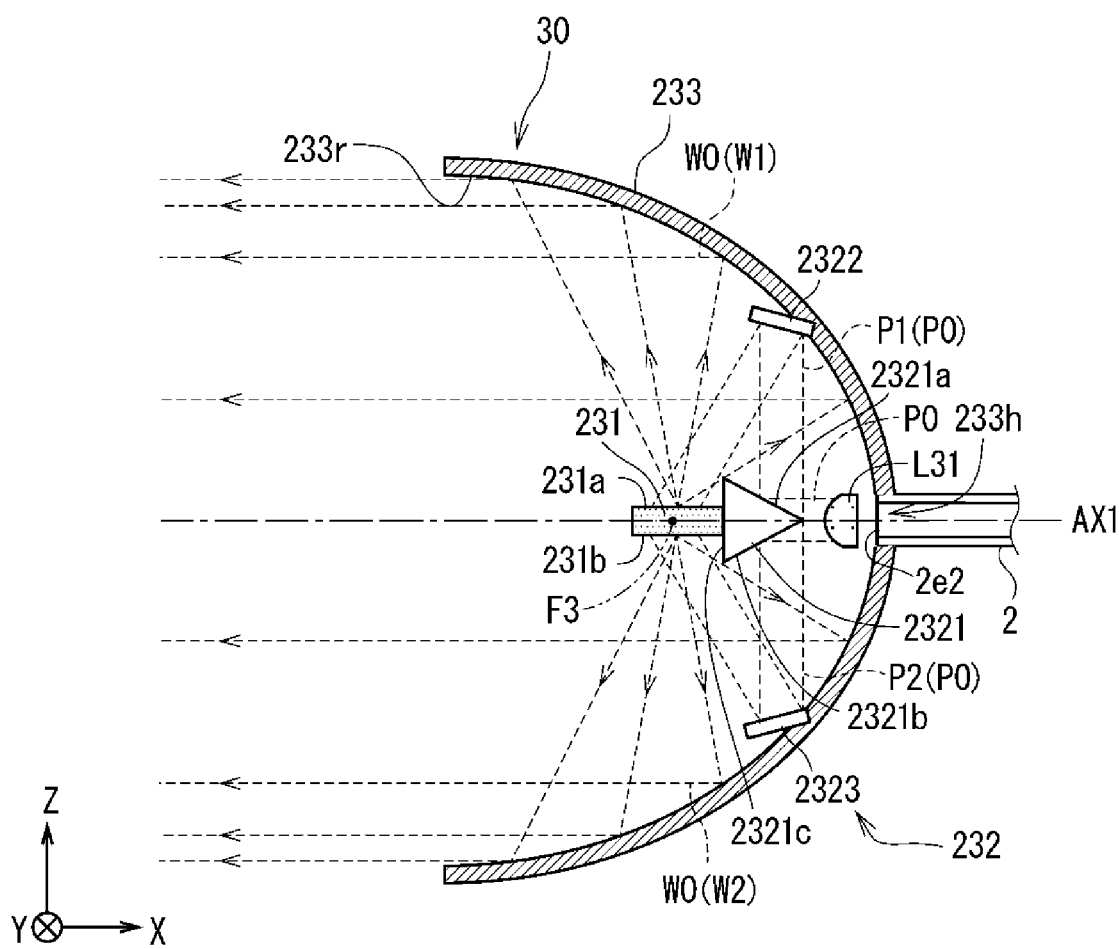
FIG. 31 is a schematic cross-sectional view of a photoconversion device with an example structure according to an eighth embodiment.

A reflector 233 included in a photoconversion device 30 according to an eighth embodiment differs from the reflector in the seventh embodiment. FIG. 31 is a block diagram of the photoconversion device 30 with an example structure according to the eighth embodiment. The reflector 233 may be, for example, a parabolic mirror with a reflective surface 233r shaped along a parabolic plane as illustrated in, for example, FIG. 31. The parabolic plane along which the reflective surface 233r extends has a focal point F3 located, for example, inside the first wavelength converter 231. In other words, the first wavelength converter 231 is located on the focal point F3. This structure allows, for example, conversion of fluorescence W0 emitted by the first wavelength converter 231 to collimated light with the reflector 233.

In this case, the second optical transmission fiber 4 and the optical radiation module 5 may be eliminated. The photoconversion device 30 may emit the fluorescence W0 from the reflector 233 into an external space as illumination light I0 without being through the second optical transmission fiber 4 and the optical radiation module 5.

As in the seventh embodiment, the second optical transmission fiber 4 and the optical radiation module 5 may be provided. This structure may include a lens to focus the collimated fluorescence W0 onto the focusing plane 33f.

In the eighth embodiment as well, the first excitation light P1 is incident on the first incident surface 231a, and the second excitation light P2 is incident on the second incident surface 231b. As compared with when the excitation light is incident on either of the two surfaces alone, the light intensity of the fluorescence W0 can be increased.

The first incident surface 231a and the second incident surface 231b are located opposite to each other with respect to the focal point F3. More specifically, the focal point F3 is located inside the first wavelength converter 231. Thus, the first wavelength converter 231 can emit fluorescence W0 near the focal point F3. The reflector 233 can convert the fluorescence W0 to collimated light with high directivity.

2-2-2. Ninth Embodiment

A photoconversion device 30 according to a ninth embodiment has the same or similar structure as the structure according to the seventh embodiment or the eighth embodiment. In the ninth embodiment, the structure of the first wavelength converter 231 differs from the corresponding structure in the seventh embodiment and the eighth embodiment. In the ninth embodiment, the first wavelength converter 231 includes a first phosphor portion 2311 and a second phosphor portion 2312 with different compositions. Thus, the wavelength spectrum of fluorescence W0 emitted from the first phosphor portion 2311 is different from the wavelength spectrum of fluorescence W0 emitted from the second phosphor portion 2312. The fluorescence W0 emitted from the first phosphor portion 2311 is also referred to as fluorescence W1, and the fluorescence W0 emitted from the second phosphor portion 2312 is also referred to as fluorescence W2. The wavelength spectra being different from each other include, for example, at least one peak wavelength in the wavelength spectrum of the fluorescence W1 being different from at least one peak wavelength in the wavelength spectrum of the fluorescence W2. This may also include the compositions of the first phosphor portion 2311 and the second phosphor portion 2312 being different from each other to provide a color difference of, for example, 0.6 or greater between the fluorescence W1 and the fluorescence W2.

For example, the first phosphor portion 2311 and the second phosphor portion 2312 may contain different types of phosphors. For example, the first phosphor portion 2311 may contain a red phosphor, and the second phosphor portion 2312 may contain a green phosphor and a blue phosphor. The first phosphor portion 2311 and the second phosphor portion 2312 may each contain a common phosphor, in addition to such different phosphors. For example, the first phosphor portion 2311 may contain a red phosphor and a green phosphor, and the second phosphor portion 2312 may contain a green phosphor and a blue phosphor. When the first phosphor portion 2311 and the second phosphor portion 2312 contain different types of phosphors, the fluorescence W1 and the fluorescence W2 have wavelength spectra different from each other.

For example, the first phosphor portion 2311 and the second phosphor portion 2312 may contain phosphors of the same types but with different compositions. For example, the first phosphor portion 2311 and the second phosphor portion 2312 may both contain a red phosphor, a green phosphor, and a blue phosphor. In this case, the proportions of these phosphors in the first phosphor portion 2311 are different from the proportions of the phosphors in the second phosphor portion 2312. This also causes the fluorescence W1 and the fluorescence W2 to have wavelength spectra different from each other.

When the fluorescence W1 and the fluorescence W2 are pseudo white light, the fluorescence W1 and the fluorescence W2 can express a difference between them with a color temperature. For example, the first phosphor portion 2311 and the second phosphor portion 2312 may be designed to have a color temperature difference of 100 K or more between the first phosphor portion 2311 and the second phosphor portion 2312. In a specific example, the compositions of the first phosphor portion 2311 and the second phosphor portion 2312 may be any two selected from multiple compositions that achieve the color temperatures of 2650 K, 3000 K, 4000 K, 5000 K, and 6500 K.

As described above, the photoconversion device 30 according to the ninth embodiment can emit the fluorescence W1 and the fluorescence W2 that have wavelength spectra different from each other.

As in the seventh embodiment, the photoconversion device 30 may focus, for example, the fluorescence W1 and the fluorescence W2 at the second input end 4e1 of the second optical transmission fiber 4 (refer to FIG. 28). The fluorescence W1 and the fluorescence W2 mix spatially when being transmitted by the second optical transmission fiber 4. The illumination light 10 radiated from the optical radiation module 5 is thus less likely to have a color distribution. In this case, the optical radiation module 5 can radiate the illumination light 10 as a mixture of the colors of the fluorescence W1 and the fluorescence W2.

As in the eighth embodiment, the photoconversion device 30 may also emit, for example, the fluorescence W1 and the fluorescence W2 as illumination light into the external space without being through the second optical transmission fiber 4 (refer to FIG. 31). The first phosphor portion 2311 is located in the positive Z-direction from the second phosphor portion 2312 and receives the first excitation light P1 in the positive Z-direction. In this structure, the first phosphor portion 2311 can emit more fluorescence W1 mainly in the positive Z-direction. The second phosphor portion 2312 is located in the negative Z-direction from the first phosphor portion 2311 and receives the second excitation light P2 in the negative Z-direction. In this structure, the second phosphor portion 2312 can emit more fluorescence W2 mainly in the negative Z-direction. Thus, the illumination light emitted from the photoconversion device 30 can have a spatial color distribution in the Z-direction. The color distribution of the illumination light is reflected in the color tones of an illumination object. The color tones of the illumination object can thus be changed partially. More specifically, the color tones can be changed between a part of the illumination object receiving more fluorescence W1 and a part of the illumination object receiving more fluorescence W2.

The photoconversion device 30 may be used for, for example, illumination in a stage performance to change the distribution of the color tones of an illumination object. The photoconversion device 30 may also be used as illumination for inspection equipment for inspecting an inspection object. For example, detecting defects in an inspection object including a substrate such as a semiconductor substrate may use illumination light with a different color depending on the types of defects to be detected. The first phosphor portion 2311 is thus designed to emit fluorescence W1 for detecting a defect of a first type, and the second phosphor portion 2312 is designed to emit fluorescence W2 for detecting a defect of a second type. This facilitates detection of defects of a first type in a portion receiving the fluorescence W1 and detection of defects of a second type in a portion receiving the fluorescence W2. The inspection object can be, for example, scanned using this illumination light to allow inspection entirely across the inspection object.

As illustrated in FIG. 29, when the first phosphor portion 2311 is located on the main surface 2313a of the substrate 2313 and the second phosphor portion 2312 is located on the main surface 2313b of the substrate 2313, at least one of the main surface 2313a or the main surface 2313b may be a reflective surface. In this case, the spatial color distribution can be notable. This results from the fluorescence W1 from the first phosphor portion 2311 traveling in the negative Z-direction and reflected from the substrate 2313 to travel in the positive Z-direction, and the fluorescence W2 traveling in the negative Z-direction likewise. The illumination object can thus have a more notable distribution of color tones.

In the example of FIG. 28 as well, the photoconversion device 30 may emit the fluorescence W1 and the fluorescence W2 as illumination light without being through the second optical transmission fiber 4. This can change the distribution of the color tones of the illumination object.

As described above, the color distribution of the illumination light can be reduced by causing the light to travel through the second optical transmission fiber 4. However, when, for example, the second optical transmission fiber 4 is short, the illumination light 10 after traveling through the second optical transmission fiber 4 may possibly have a viewable color distribution. In this case, the illumination light 10 after traveling through the second optical transmission fiber 4 can also change the distribution of the color tones of the illumination object.

In the ninth embodiment as well, the single output portion is used to simplify the light source system as in the seventh and eighth embodiments. However, multiple output portions may be used when simplifying the light source system is not to be considered. In the ninth embodiment, excitation light may simply be applied to the first incident surface 231a of the first phosphor portion 2311 and the second incident surface 231b of the second phosphor portion 2312 having the composition different from the first phosphor portion 2311. This can adjust the colors or the color distribution of the illumination light.

The structures according to other embodiments described below may also include multiple output portions when simplifying the light source system is not to be considered.

2-2-3. Tenth Embodiment

Figure 32:
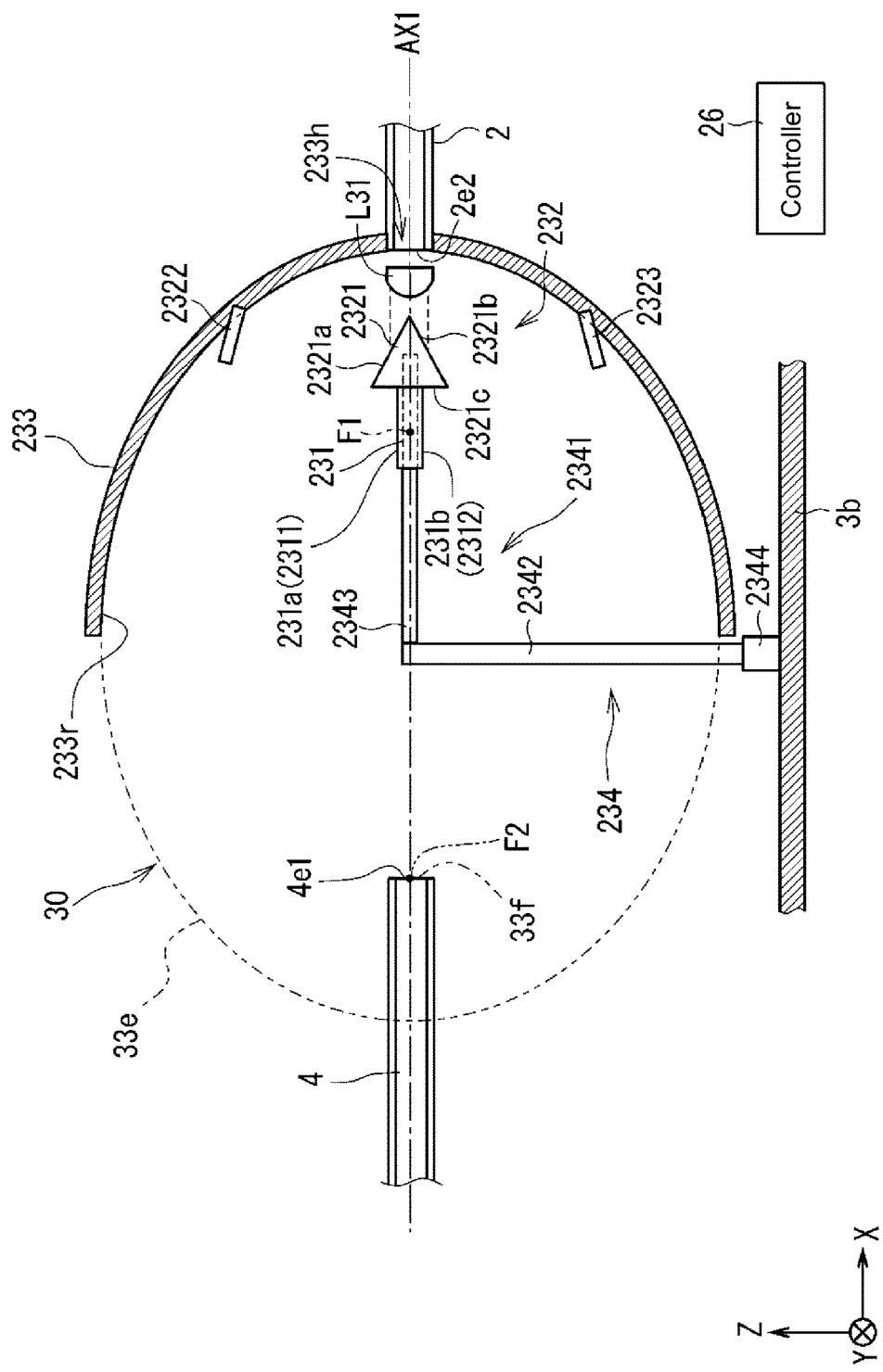
FIG. 32 is a schematic cross-sectional view of a photoconversion device with an example structure according to a tenth embodiment.
Figure 33:
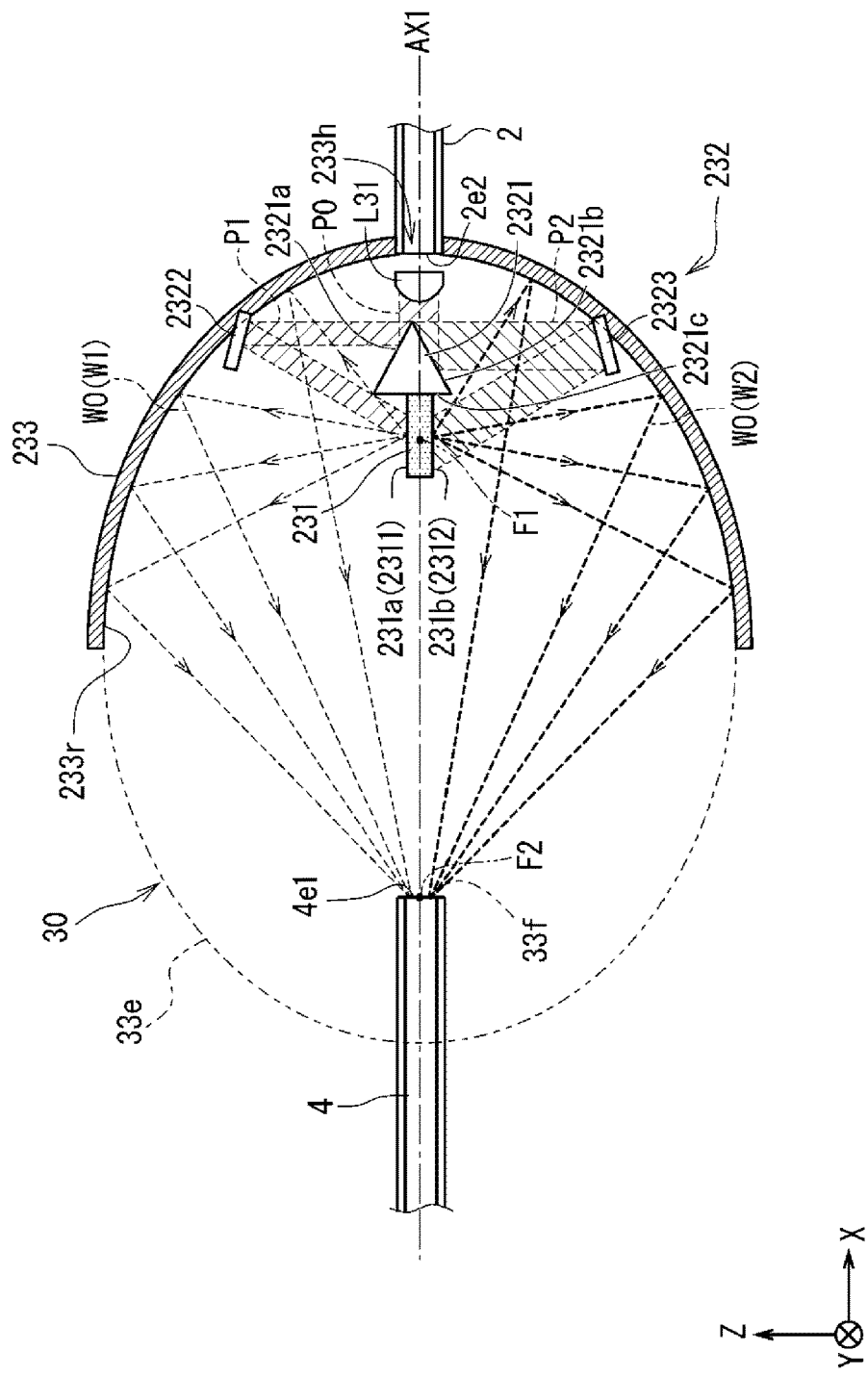
FIG. 33 is a schematic cross-sectional view of a photoconversion device with an example structure including a splitter moved in the positive Z-direction.

A splitter optical system 232 in a tenth embodiment splits excitation light P0 output through the first output end 2e2 into first excitation light P1 and second excitation light P2 at a variable ratio. In other words, the splitter optical system 232 changes the light intensity ratio of the second excitation light P2 to the first excitation light P1. FIG. 32 is a schematic view of a photoconversion device 30 with an example structure according to the tenth embodiment. This photoconversion device 30 has the same or similar structure as the photoconversion device 30 according to the ninth embodiment except the structure of the splitter optical system 232. FIG. 33 is a schematic diagram of the photoconversion device 30 with an example structure having the light intensity ratio of the second excitation light P2 to the first excitation light P1 deviating from 1. In the example of FIG. 33, the light intensity ratio of the second excitation light P2 to the first excitation light P1 is greater than 1. The light intensity is, for example, the total integral of luminance in a cross section perpendicular to the traveling direction of light.

Referring to FIG. 32, the splitter optical system 232 further includes a color adjuster drive 234 that moves the splitter 2321 relative to the first output end 2e2. The color adjuster drive 234 moves, for example, the splitter 2321 relative to the first output end 2e2 to change the light intensity ratio of the second excitation light P2 to the first excitation light P1. In the example of FIG. 32, the splitter 2321 is moved in the positive Z-direction from the first output end 2e2 to increase the cross-sectional area of the second excitation light P2 and thus to increase the light intensity of the second excitation light P2. To simplify the drawing, the color adjuster drive 234 is not illustrated in FIG. 32.

As illustrated in FIG. 31, the color adjuster drive 234 includes, for example, a holder 2341 and a displacer 2344. The holder 2341 is a component for attaching the splitter 2321 to the housing 3b. The holder 2341 includes, for example, a rod 2342 and an arm 2343. The rod 2342 is between the reflector 233 and the focusing plane 33f in the x-direction. The rod 2342 is, for example, elongated in the Z-direction, and has one end attached to the housing 3b with the displacer 2344. The arm 2343 is, for example, elongated in the X-direction, and has an end in the positive X-direction joined to the splitter 2321 and an end in the negative X-direction joined to the rod 2342.

The displacer 2344 can move the holder 2341 forward and rearward in the Z-direction. Thus, the holder 2341 and the splitter 2321 move forward and rearward integrally in the Z-direction. The displacer 2344 may include, for example, a ball screw. The ball screw includes a screw shaft extending in the Z-direction, a motor that rotates the screw shaft, and a nut that is screwed with the screw shaft and moves in the Z-direction as the screw shaft rotates. The nut is connected to the rod 2342. In some embodiments, the displacer 2344 may include, for example, a linear motor. The linear motor includes, for example, a stator and a rotor that moves in the Z-direction under a magnetic force between the rotor and the stator. The rotor is connected to the rod 2342.

The color adjuster drive 234 (more specifically, the displacer 2344) is controlled by the controller 26. The controller 26 receives an external instruction and controls the displacer 2344 based on the instruction to adjust the relative positions of the splitter 2321 and the first output end 2e2. The controller 26 thus adjusts the light intensity ratio of the second excitation light P2 relative to the first excitation light P1.

The controller 26 may serve as a control circuit. The controller 26 may have the same or similar hardware configuration as the controller 36.

The relative positions of the splitter 2321 and the first output end 2e2 will be described based on a reference position. The reference position is the relative position of either the splitter 2321 or the first output end 2e2 relative to the other when the light intensity ratio of the second excitation light P2 to the first excitation light P1 is 1. In the example of FIG. 31, the reference position is the position of the splitter 2321 when the boundary between the third incident surface 2321a and the fourth incident surface 2321b is aligned with the optical axis AX1.

As illustrated in FIG. 32, when the splitter 2321 moves from the reference position in the positive Z-direction, the third incident surface 2321a of the splitter 2321 moves away from the optical axis AX1 of the first output end 2e2 in the positive Z-direction. In this case, a smaller first portion of the excitation light P0 output through the first output end 2e2 is incident on the third incident surface 2321a. The first portion is smaller as the splitter 2321 is moved more in the positive Z-direction. The first portion of the excitation light P0 reflected from the third incident surface 2321a travels in the positive Z-direction as the first excitation light P1. Thus, the first excitation light P1 has a smaller cross-sectional area as the splitter 2321 is moved more in the positive Z-direction. The light intensity of the first excitation light P1 is lower as the splitter 2321 is moved more in the positive Z-direction.

The center of the fourth incident surface 2321b of the splitter 2321 moves toward the optical axis AX1 of the first output end 2e2. Thus, a larger second portion of the excitation light P0 is incident on the fourth incident surface 2321b. The second portion of the excitation light P0 reflected from the fourth incident surface 2321b travels in the positive Z-direction as the second excitation light P2. Thus, the second excitation light P2 has a larger cross-sectional area as the splitter 2321 is moved more in the positive Z-direction. The light intensity of the second excitation light P2 is higher as the splitter 2321 is moved more in the positive Z-direction.

As described above, the light intensity ratio of the second excitation light P2 to the first excitation light P1 increases as the splitter 2321 is moved more in the positive Z-direction from the first output end 2e2. As illustrated in FIG. 32, the first excitation light P1 is incident on a smaller area of the first incident surface 231a of the first phosphor portion 2311, and the second excitation light P2 is incident on a larger area of the second incident surface 231b of the second phosphor portion 2312. Thus, the first phosphor portion 2311 emits fluorescence W1 with lower light intensity, whereas the second phosphor portion 2312 emits fluorescence W2 with higher light intensity. The light intensity ratio of the fluorescence W2 to the fluorescence W1 thus also increases as the splitter 2321 moves more in the positive Z-direction. FIG. 32 schematically illustrates the relationship between the light intensity of the fluorescence W1 and the light intensity of the fluorescence W2 with lines having the corresponding thicknesses.

As illustrated in FIG. 32, the first wavelength converter 231 may be installed stationary independently of the position of the splitter 2321. In other words, the splitter 2321 may be separate from the first wavelength converter 231. This allows the first wavelength converter 231 that emits the fluorescence W1 and the fluorescence W2 to remain at the position of the first focal point F1 independently of the movement of the splitter 2321.

The light intensity ratio of the second excitation light P2 to the first excitation light P1 decreases as the splitter 2321 is moved more in the negative Z-direction from the first output end 2e2. The first excitation light P1 is incident on a larger area of the first phosphor portion 2311. The second excitation light P2 is incident on a smaller area of the second phosphor portion 2312. The light intensity ratio of the fluorescence W2 to the fluorescence W1 thus also decreases as the splitter 2321 moves more in the negative Z-direction.

As described above, the light intensity ratio of the fluorescence W2 to the fluorescence W1 is adjustable by the color adjuster drive 234 moving the splitter 2321 relative to the first output end 2e2.

In the example of FIGS. 31 and 32, the reflective surface 233r of the reflector 233 is aligned with the ellipsoid 33e. The photoconversion device 30 focuses, for example, the fluorescence W1 and the fluorescence W2 at the second input end 4e1 of the second optical transmission fiber 4. The fluorescence W1 and the fluorescence W2 are transmitted by the second optical transmission fiber 4 and emitted from the optical radiation module 5 as illumination light I0. The fluorescence W1 and the fluorescence W2 mix spatially when being transmitted by the second optical transmission fiber 4. The illumination light I0 including the fluorescence W1 and the fluorescence W2 is then emitted from the optical radiation module 5. The color adjuster drive 234 thus adjusts the light intensity ratio between the fluorescence W1 and the fluorescence W2 to adjust the color tones of the illumination light I0. When, for example, the second optical transmission fiber 4 is short, the illumination light I0 can have a spatial color distribution. In this case, the color distribution can be adjusted.

The controller 26 controls the color adjustment drive 234 (more specifically, the displacer 2344) based on an external instruction. For example, the user may input an instruction about the color tones of the illumination light I0 by operating an input device such as a switch. The input device then outputs the instruction to the controller 26. The controller 26 controls the color adjuster drive 234 to cause the illumination light I0 to have the color tones responding to the instruction. The correspondence between each instruction and an operation of the splitter 2321 may be predefined. The controller 26 may determine the position of the splitter 2321 based on an instruction from the input device and the predefined correspondence. As described above, the user can adjust the color tones of the illumination light I0 by operating the input device.

In the above example, the color adjuster drive 234 adjusts the color tones of the illumination light I0 by moving the splitter 2321 and the first output end 2e2 relative to each other. In this manner, the simple structure allows the color adjustment.

The photoconversion device 30 may emit the fluorescence W1 and the fluorescence W2 into the external space as illumination light without being through the second optical transmission fiber 4 and the optical radiation module 5. In this case, the color adjuster drive 234 adjusts the light intensity ratio between the fluorescence W1 and the fluorescence W2 to adjust the color distribution of the illumination light.

The reflective surface 233r of the reflector 233 may be along a parabolic plane as in, for example, the second embodiment. In this case, the fluorescence W1 and the fluorescence W2 reflected from the reflective surface 233r each are output as collimated light.

2-2-3-1. Position of Wavelength Converter

As described above, the first wavelength converter 231 may be installed substantially stationary independently of the position of the splitter 2321. This allows the first incident surface 231a and the second incident surface 231b of the first wavelength converter 231 to remain at substantially equal distances from the first focal point F1. Thus, the reflector 233 can focus the fluorescence W1 and the fluorescence W2 onto the focusing plane 33f with equal directivity, or convert the fluorescence W1 and the fluorescence W2 to collimated light with equal directivity.

2-2-3-2. Holder

The holder 2341 holding the splitter 2321 may be made of a rigid material with high rigidity, such as glass and metal (e.g., stainless steel). The splitter 2321 can be installed with less positional fluctuation.

The holder 2341 may be made of a transparent material such as transparent glass. In this case, a portion of the fluorescence W1 or a portion of the fluorescence W2 reflected from the reflector 233 is transmitted through the holder 2341. The holder 2341 is less likely to block the optical paths of the fluorescence W1 and the fluorescence W2. This structure can thus increase the light intensity of the illumination light 10.

The holder 2341 may not be entirely transparent, but may simply include a transparent portion that receives the fluorescence W1 and the fluorescence W2 from the reflector 233.

2-2-3-3. Color Adjuster Drive

Figure 34:
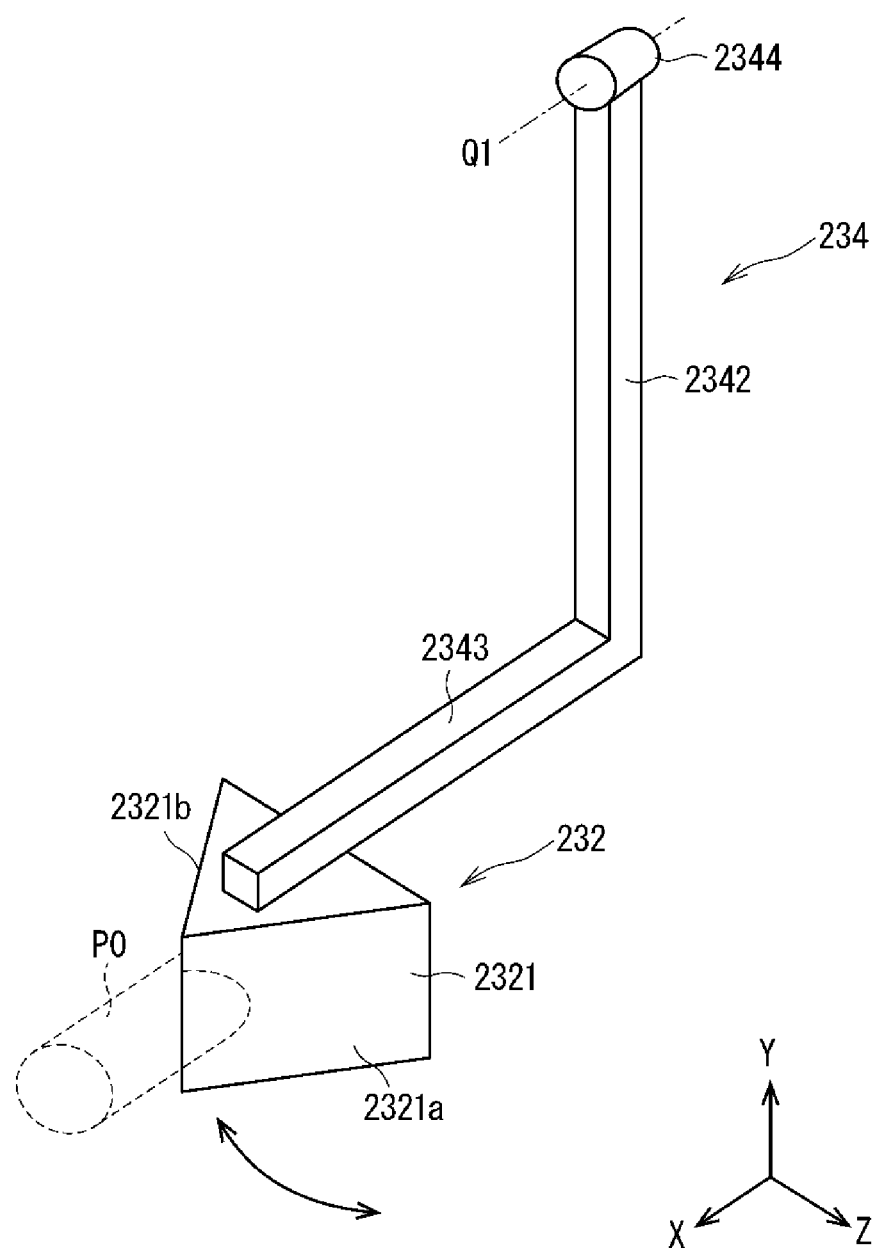
FIG. 34 is a schematic perspective view of a splitter and a color adjuster drive in an example structure.

In the above example, the color adjuster drive 234 moves the splitter 2321 parallel to the Z-direction. However, the structure is not limited to this example. FIG. 34 is a schematic perspective view of the splitter 2321 and the color adjuster drive 234 in an example structure. In the example of FIG. 34, the rod 2342 extends in the Y-direction, and has an end opposite to the arm 2343 connected to the displacer 2344. The displacer 2344 includes, for example, a motor. The rod 2342 is attached to the housing 3b in a turnable manner. The displacer 2344 causes, for example, the rod 2342 to turn about the rotation axis Q1 in the X-direction within a predetermined angular range. Thus, the rod 2342, the arm 2343, and the splitter 2321 turn integrally within the predetermined angular range. This turning causes the splitter 2321 to move forward and rearward in the circumferential direction about the rotation axis Q1 on a YZ cross section. The circumferential direction substantially matches the Z-direction. The displacer 2344 can thus move the splitter 2321 forward and rearward in the Z-direction. For the rod 2342 that is longer, the splitter 2321 is likely to move more parallel to the Z-direction. This movement of the splitter 2321 can also change the proportions of the portions of the excitation light P0 output through the first output end 2e2 and incident on the third incident surface 2321a and the fourth incident surface 2321b of the splitter 2321.

2-2-4. Eleventh Embodiment

Figure 35:
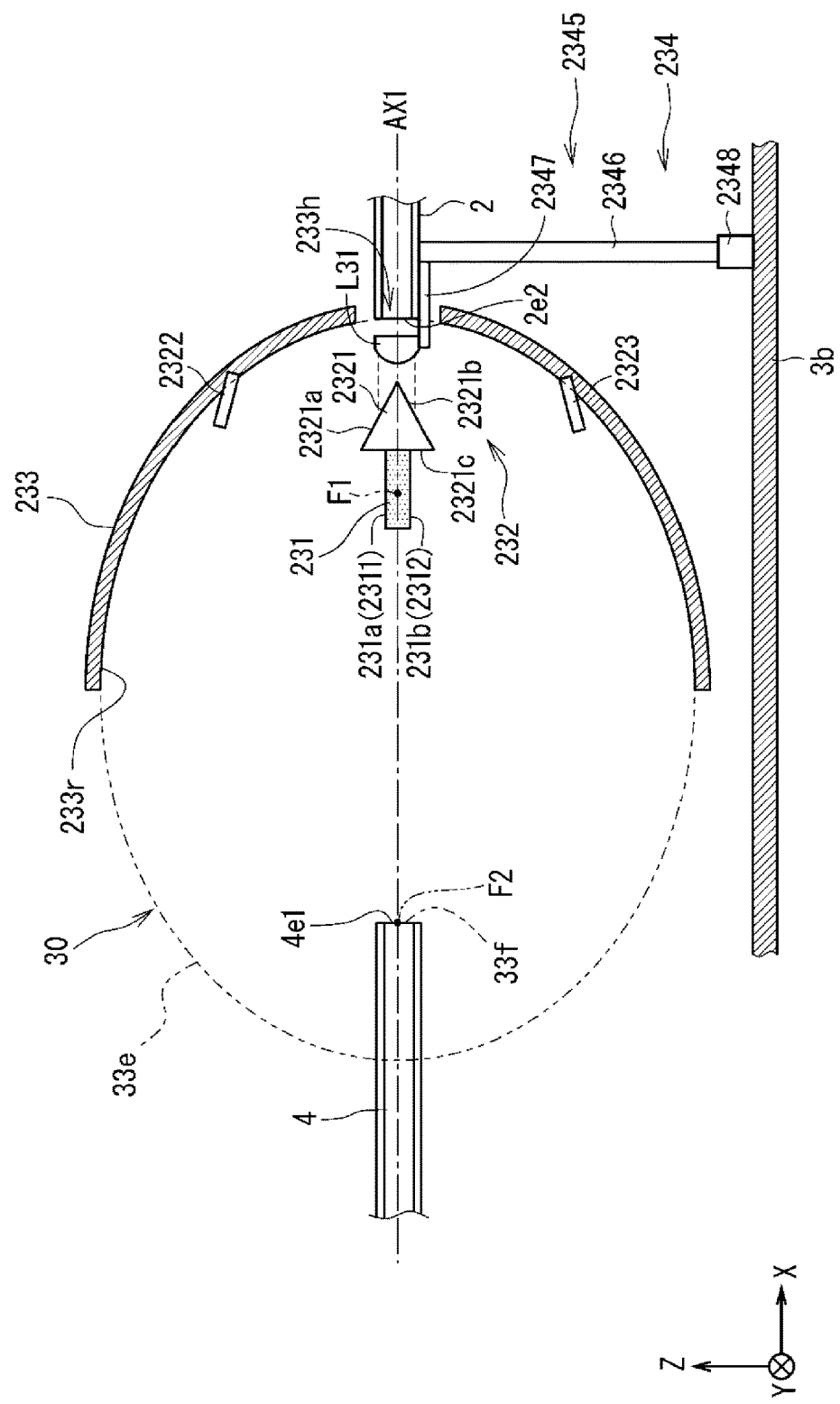
FIG. 35 is a schematic cross-sectional view of a photoconversion device with an example structure according to an eleventh embodiment.
Figure 36:
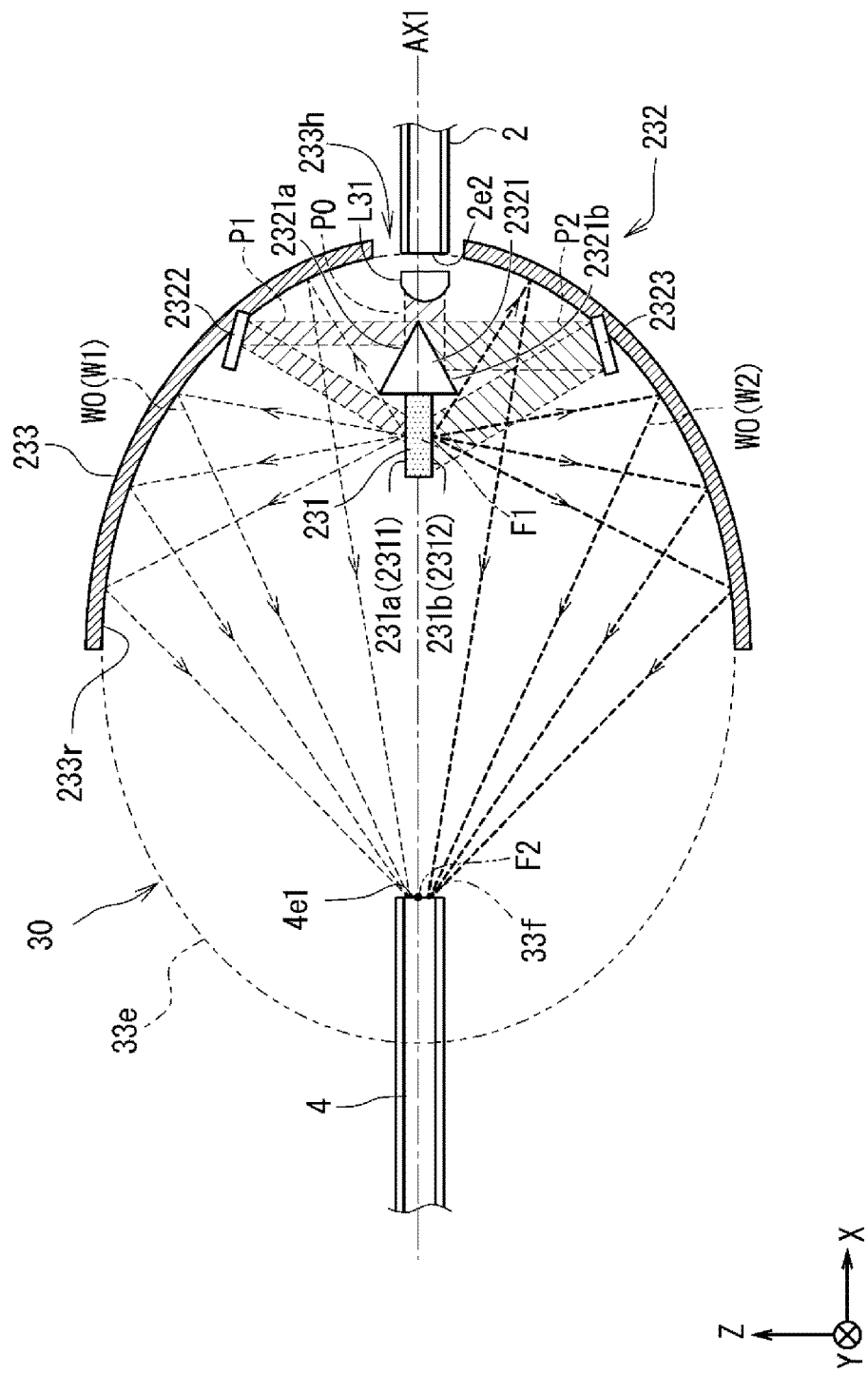
FIG. 36 is a schematic cross-sectional view of a photoconversion device with an example structure including an output portion moved in the negative Z-direction.

FIG. 35 is a block diagram of a photoconversion device 30 with an example structure according to an eleventh embodiment. This photoconversion device 30 has the same or similar structure as the photoconversion device 30 according to the tenth embodiment except the structure of the color adjuster drive 234. This color adjuster drive 234 moves the first output end 2e2, instead of the splitter 2321, in the Z-direction to change the light intensity ratio of the second excitation light P2 to the first excitation light P1. FIG. 36 is a schematic diagram of the photoconversion device 30 with the light intensity ratio of the second excitation light P2 to the first excitation light P1 deviating from 1. In the example of FIG. 36, the light intensity ratio of the second excitation light P2 to the first excitation light P1 is greater than 1.

The color adjuster drive 234 includes a holder 2345 and a displacer 2348 instead of the holder 2341 and the displacer 2344. The holder 2345 is a component for attaching the first output end 2e2 as an output portion to the housing 3b. The holder 2345 is attached to, for example, the housing 3b through the displacer 2348. The holder 2345 comes in contact with, for example, a side peripheral surface of a portion including the first output end 2e2 of the first optical transmission fiber 2 to hold the first optical transmission fiber 2. In the photoconversion device 30 including the optical system L31 as illustrated in FIG. 35, the holder 2345 may also come in contact with the optical system L31 and hold both the optical system L31 and the first optical transmission fiber 2. In the example of FIG. 35, the holder 2345 includes a rod 2346 and a contact member 2347. The rod 2346 is, for example, elongated in the Z-direction, and has one end attached to the displacer 2348. The rod 2346 has the opposite end connected to the contact member 2347. The contact member 2347 may extend, for example, in the X-direction, and includes a surface in the positive Z-direction in contact with and connected to the optical system L31 and the first optical transmission fiber 2.

The displacer 2348 can move the holder 2345 forward and rearward in the Z-direction. Thus, the holder 2345, the first optical transmission fiber 2, and the optical system L31 move forward and rearward integrally in the Z-direction. A specific example of the displacer 2348 is the same as or similar to the displacer 2344.

The through-hole 233h of the reflector 233 has a cross-sectional area large enough to allow the first optical transmission fiber 2 to be movable in the Z-direction. In other words, the first optical transmission fiber 2 can be loosely fitted in the through-hole 233h of the reflector 233 and can be movable in the Z-direction from the reflector 233.

As illustrated in FIG. 36, when the first output end 2e2 and the optical system L31 move in the negative Z-direction, the excitation light P0 translates in the negative Z-direction. Thus, a smaller first portion of the excitation light P0 is incident on the first incident surface 231a, and a larger second portion of the excitation light P0 is incident on the second incident surface 231b. Thus, the light intensity ratio of the second excitation light P2 to the first excitation light P1 increases as the first output end 2e2 and the optical system L31 are moved more in the negative Z-direction.

As illustrated in FIG. 36, the first excitation light P1 is incident on a smaller area of the first incident surface 231a of the first phosphor portion 2311, and the second excitation light P2 is incident on a larger area of the second incident surface 231b of the second phosphor portion 2312. Thus, the first phosphor portion 2311 emits fluorescence W1 with lower light intensity, whereas the second phosphor portion 2312 emits fluorescence W2 with higher light intensity. More specifically, the light intensity ratio of the fluorescence W2 to the fluorescence W1 increases as the first output end 2e2 and the optical system L31 move more in the negative Z-direction.

In contrast, the light intensity ratio of the second excitation light P2 to the first excitation light P1 decreases as the first output end 2e2 and the optical system L31 are moved more in the positive Z-direction. The first excitation light P1 is incident on a larger area of the first phosphor portion 2311. The second excitation light P2 is incident on a smaller area of the second phosphor portion 2312. Thus, the first phosphor portion 2311 emits fluorescence W1 with higher light intensity, whereas the second phosphor portion 2312 emits fluorescence W2 with lower light intensity. More specifically, the light intensity ratio of the fluorescence W2 to the fluorescence W1 decreases as the first output end 2e2 and the optical system L31 move more in the positive Z-direction.

As described above, the light intensity ratio of the fluorescence W2 to the fluorescence W1 is adjustable by the color adjuster drive 234 moving the first output end 2e2 and the optical system L31 in the Z-direction. This can adjust the color tones or the color distribution of the illumination light 10.

In the eleventh embodiment, the color adjuster drive 234 that moves the first output end 2e2 is located outside the reflector 233 as illustrated in FIG. 35. The color adjuster drive 234 can avoid being located on the optical paths of the fluorescence W1 and the fluorescence W2 emitted by the first wavelength converter 231. Thus, the fluorescence W1 and the fluorescence W2 avoid entering the color adjuster drive 234 and being blocked by the color adjuster drive 234. This structure can increase the light intensity of the illumination light 10.

2-2-5. Twelfth Embodiment

Figure 37:
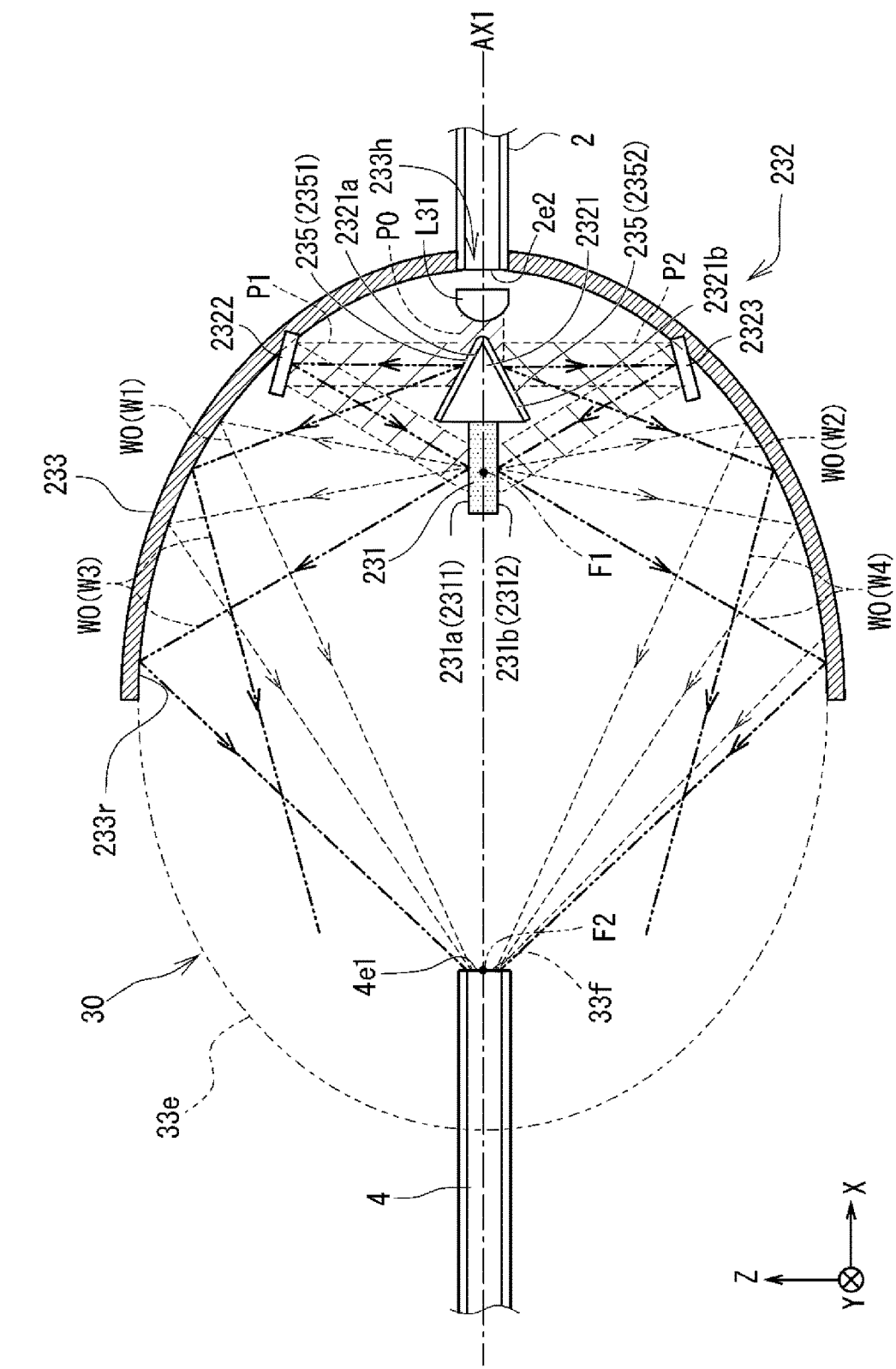
FIG. 37 is a schematic cross-sectional view of a photoconversion device with an example structure according to a twelfth embodiment.

FIG. 37 is a block diagram of a photoconversion device 30 with an example structure according to a twelfth embodiment. This photoconversion device 30 has the same or similar structure as the photoconversion device 30 according to the ninth embodiment, except that it includes a second wavelength converter 235. The second wavelength converter 235 is located across the third incident surface 2321a and the fourth incident surface 2321b of the splitter 2321. More specifically, a part of the second wavelength converter 235 is located on the third incident surface 2321a, and the remaining part of the second wavelength converter 235 is located on the fourth incident surface 2321b.

The second wavelength converter 235 can emit, for example, fluorescence W0 in response to the excitation light P0 output through the first output end 2e2 of the first optical transmission fiber 2. The second wavelength converter 235 includes a phosphor portion similarly to the first wavelength converter 231. The second wavelength converter 235 has a different structure from the first wavelength converter 231. For example, the wavelength spectrum of the fluorescence W0 emitted by the second wavelength converter 235 differs from the wavelength spectrum of each of the fluorescence W1 and the fluorescence W2 emitted by the first wavelength converter 231.

As illustrated in FIG. 37, the second wavelength converter 235 may include a third phosphor portion 2351 and a fourth phosphor portion 2352. The third phosphor portion 2351 and the fourth phosphor portion 2352 also include phosphor pellets containing, for example, a phosphor and a sealant, similarly to the first phosphor portion 2311 and the second phosphor portion 2312. The first phosphor portion 2311, the second phosphor portion 2312, the third phosphor portion 2351, and the fourth phosphor portion 2352 may have different compositions and may each emit fluorescence W0 with a different wavelength spectrum. The fluorescence W0 emitted by the third phosphor portion 2351 is referred to as fluorescence W3. The fluorescence W0 emitted by the fourth phosphor portion 2352 is referred to as fluorescence W4. In the example of FIG. 37, the third phosphor portion 2351 is located on the third incident surface 2321a of the splitter 2321, and the fourth phosphor portion 2352 is located on the fourth incident surface 2321b of the splitter 2321.

The third phosphor portion 2351 receives the first portion of the excitation light P0 traveling toward the third incident surface 2321a. The third phosphor portion 2351 emits the fluorescence W3 in response to the first portion of the excitation light P0. In FIG. 37, example optical paths of the fluorescence W3 and the fluorescence W4 are indicated with thick dashed lines. The thick lines are simply for visibility in the drawing. The thickness of each line does not indicate the light intensity of the fluorescence W3 or the light intensity of the fluorescence W4.

A portion of the fluorescence W3 emitted by the third phosphor portion 2351 travels toward the first focal point through the first optical path changer 2322. More specifically, the portion of the fluorescence W3 travels toward the first wavelength converter 231. The portion of the fluorescence W3 is reflected from the reflective surface 233r of the reflector 233 after passing through the first wavelength converter 231 at the first focal point F1 and is then focused onto the focusing plane 33f aligned with the second focal point F2. The remaining portion of the fluorescence W3 emitted by the third phosphor portion 2351 is mainly reflected from the reflective surface 233r of the reflector 233 without passing through the first optical path changer 2322. The fluorescence W3 that does not pass through the first optical path changer 2322 does not travel near the first focal point F1 and is thus less likely to be focused onto the focusing plane 33f.

The fourth phosphor portion 2352 receives the second portion of the excitation light P0 traveling toward the fourth incident surface 2321b. The fourth phosphor portion 2352 emits the fluorescence W4 in response to the second portion of the excitation light P0. A portion of the fluorescence W4 emitted by the fourth phosphor portion 2352 travels toward a position near the first focal point F1 through the second optical path changer 2323. In other words, the portion of the fluorescence W4 travels toward the first wavelength converter 231. The portion of the fluorescence W4 is reflected from the reflective surface 233r of the reflector 233 after passing through the first wavelength converter 231 at the first focal point F1 and is then focused onto the focusing plane 33f aligned with the second focal point F2. The remaining portion of the fluorescence W4 emitted by the fourth phosphor portion 2352 is mainly reflected from the reflective surface 233r of the reflector 233 without passing through the second optical path changer 2323. The fluorescence W4 that does not pass through the second optical path changer 2323 does not travel near the first focal point F1 and is thus less likely to be focused onto the focusing plane 33f.

A portion of the excitation light P0 not absorbed by the third phosphor portion 2351 and the fourth phosphor portion 2352 is split into the first excitation light P1 and the second excitation light P2 by the splitter 2321. The first excitation light P1 is directed to the first incident surface 231a of the first wavelength converter 231 by the first optical path changer 2322. The second excitation light P2 is directed to the second incident surface 231b of the first wavelength converter 231 by the second optical path changer 2323. The first wavelength converter 231 can emit the fluorescence W1 and the fluorescence W2 in response to the first excitation light P1 and the second excitation light P2. With the first wavelength converter 231 located at the first focal point F1, the fluorescence W1 and the fluorescence W2 emitted by the first wavelength converter 231 are focused onto the focusing plane 33f.

In the example of FIG. 37, the second input end 4e1 of the second optical transmission fiber 4 is aligned with the focusing plane 33f. Thus, the fluorescence W1, the fluorescence W2, the fluorescence W3, and the fluorescence W4 enter the second input end 4e1 of the second optical transmission fiber 4. The fluorescence W1, the fluorescence W2, the fluorescence W3, and the fluorescence W4 are radiated into the external space 200 as illumination light I0 after passing through the second optical transmission fiber 4 and the optical radiation module 5. The illumination light I0 includes the fluorescence W1, the fluorescence W2, the fluorescence W3, and the fluorescence W4. The optical radiation module 5 can thus emit the illumination light I0 having the mixture of multiple colors.

When, for example, the second optical transmission fiber 4 is short, the illumination light I0 can have a color distribution. In this case, the color distribution can include more different colors. When the photoconversion device 30 emits the fluorescence W1, the fluorescence W2, the fluorescence W3, and the fluorescence W4 reflected from the reflective surface 233r of the reflector 233 as illumination light into the external space without being through the second optical transmission fiber 4 and the optical radiation module 5, the illumination light can have a more notable color distribution.

The reflective surface 233r of the reflector 233 may be along a parabolic plane, similarly to the reflective surface in the eighth embodiment.

As in the ninth and tenth embodiments, the photoconversion device 30 may further include a color adjuster drive 234. The color adjuster drive 234 can adjust the light intensity ratio of the first excitation light P1 incident on the first phosphor portion 2311 and the second excitation light P2 incident on the second phosphor portion 2312, as in the ninth and tenth embodiments. In the twelfth embodiment, the light intensity ratio of the excitation light P0 incident on each of the third phosphor portion 2351 and the fourth phosphor portion 2352 can also be adjusted by driving the color adjuster drive 234. Thus, the color adjuster drive unit 234 can adjust the light intensity ratio of the fluorescence W1, the fluorescence W2, the fluorescence W3, and the fluorescence W4.

At least one of the first phosphor portion 2311, the second phosphor portion 2312, the third phosphor portion 2351, or the fourth phosphor portion 2352 may have the composition identical to the composition of at least any other phosphor portion. More specifically, at least one of the fluorescence W1, fluorescence W2, the fluorescence W3, or the fluorescence W4 may have substantially the same color as at least any other fluorescence. At least one of the first phosphor portion 2311, the second phosphor portion 2312, the third phosphor portion 2351, or the fourth phosphor portion 2352 may have the composition different from the composition of any other phosphor portion. This allows the color adjuster drive 234 to adjust the colors or the color distribution of the illumination light.

2-2-6. Thirteenth Embodiment

Figure 38:
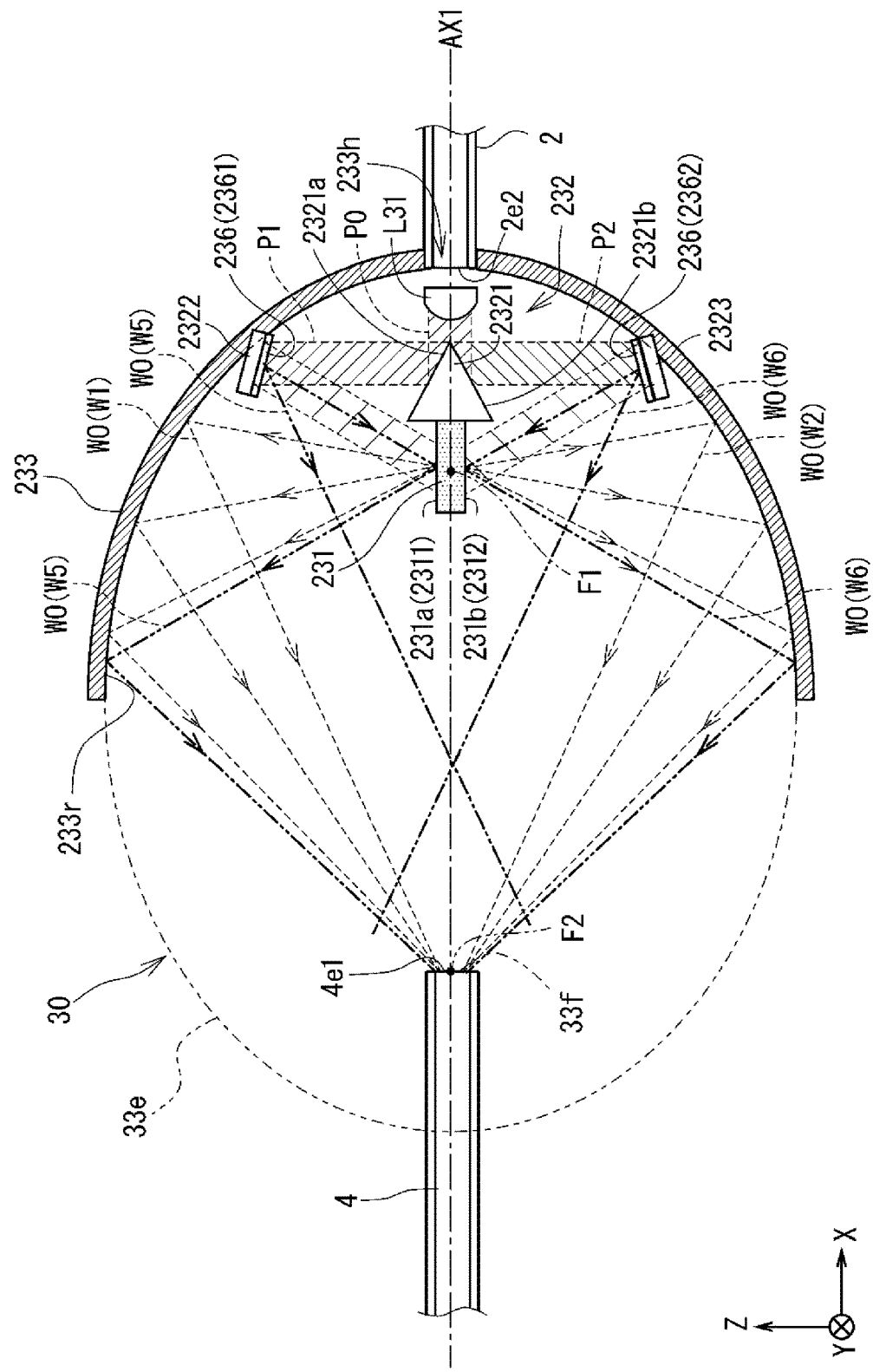
FIG. 38 is a schematic cross-sectional view of a photoconversion device with an example structure according to a thirteenth embodiment.

FIG. 38 is a block diagram of a photoconversion device 30 with an example structure according to a thirteenth embodiment. This photoconversion device 30 has the same or similar structure as the photoconversion device 30 according to the ninth embodiment, except that it includes a third wavelength converter 236. As illustrated in FIG. 38, the photoconversion device 30 may include two third wavelength converters 236. The third wavelength converter 236 is located, for example, on the surface of the first optical path changer 2322 in the negative Z-direction and the surface of the second optical path changer 2323 in the positive Z-direction.

The third wavelength converter 236 can emit, for example, fluorescence W0 in response to the excitation light P0 output through the first output end 2e2 of the first optical transmission fiber 2. The third wavelength converter 236 includes a phosphor portion similarly to the first wavelength converter 231. The third wavelength converter 236 has a different structure from the first wavelength converter 231. For example, the wavelength spectrum of the fluorescence W0 emitted by the third wavelength converter 236 differs from the wavelength spectrum of each of the fluorescence W1 and the fluorescence W2 emitted by the first wavelength converter 231.

As illustrated in FIG. 38, the third wavelength converter 236 on the first optical path changer 2322 may include a fifth phosphor portion 2361, and the third wavelength converter 236 on the second optical path changer 2323 may include a sixth phosphor portion 2362. The fifth phosphor portion 2361 and the sixth phosphor portion 2362 also each include phosphor pellets containing, for example, a phosphor and a sealant. The first phosphor portion 2311, the second phosphor portion 2312, the fifth phosphor portion 2361, and the sixth phosphor portion 2362 may have different compositions and may each emit fluorescence W0 with a different wavelength spectrum. The fluorescence W0 emitted by the fifth phosphor portion 2361 is referred to as fluorescence W5. The fluorescence W0 emitted by the sixth phosphor portion 2362 is referred to as fluorescence W6. In FIG. 38, example optical paths of the fluorescence W5 and the fluorescence W6 are indicated with thick dashed lines. The thick lines are simply for visibility in the drawing. The thickness of each line does not indicate the light intensity of the fluorescence W5 or the light intensity of the fluorescence W6.

The excitation light P0 output through the first output end 2e2 is split into the first excitation light P1 and the second excitation light P2 by the splitter 2321. The first excitation light P1 enters the fifth phosphor portion 2361. The second excitation light P2 enters the sixth phosphor portion 2362. The fifth phosphor portion 2361 receiving the first excitation light P1 emits fluorescence W5. The sixth phosphor portion 2362 receiving second excitation light P2 emits fluorescence W6.

A portion of the fluorescence W5 emitted by the fifth phosphor portion 2361 travels toward a position near the first focal point F1. In other words, the portion of the fluorescence W5 travels toward the first wavelength converter 231. The portion of the fluorescence W5 is reflected from the reflective surface 233r of the reflector 233 after passing through the first wavelength converter 231 located at the first focal point F1 and is then focused onto the focusing plane 33f aligned with the second focal point F2. The remaining portion of the fluorescence W5 does not travel near the first focal point F1 (e.g., the first wavelength converter 231). The fluorescence W5 that does not travel near the first focal point F1 and is thus less likely to be focused onto the focusing plane 33f.

A portion of the fluorescence W6 emitted by the sixth phosphor portion 2362 travels toward a position near the first focal point F1. In other words, the portion of the fluorescence W6 travels toward the first wavelength converter 231. The portion of the fluorescence W6 is reflected from the reflective surface 233r of the reflector 233 after passing through the first wavelength converter 231 at the first focal point F1 and is then focused onto the focusing plane 33f aligned with the second focal point F2. The remaining portion of the fluorescence W6 does not travel near the first focal point F1 (e.g., the first wavelength converter 231). The fluorescence W6 that does not travel near the first focal point F1 and is thus less likely to be focused onto the focusing plane 33f.

The first excitation light P1 not absorbed by the fifth phosphor portion 2361 is directed to the first incident surface 231a of the first phosphor portion 2311 by the first optical path changer 2322. The first phosphor portion 2311 receiving the first excitation light P1 emits fluorescence W1. The second excitation light P2 not absorbed by the sixth phosphor portion 2362 is directed to the second incident surface 231b of the second phosphor portion 2312 by the second optical path changer 2323. The second phosphor portion 2312 receiving the second excitation light P2 emits fluorescence W2. With the first wavelength converter 231 located at the first focal point F1, the fluorescence W1 and the fluorescence W2 emitted by the first wavelength converter 231 are focused onto the focusing plane 33f.

In the example of FIG. 38, the second input end 4e1 of the second optical transmission fiber 4 is aligned with the focusing plane 33f. Thus, the fluorescence W1, the fluorescence W2, the fluorescence W5, and the fluorescence W6 enter the second input end 4e1 of the second optical transmission fiber 4. The fluorescence W1, the fluorescence W2, the fluorescence W5, and the fluorescence W6 are radiated into the external space 200 as illumination light I0 after passing through the second optical transmission fiber 4 and the optical radiation module 5. The illumination light I0 includes the fluorescence W1, the fluorescence W2, the fluorescence W5, and the fluorescence W6. The optical radiation module 5 can thus emit the illumination light I0 with the mixture of multiple colors.

When, for example, the second optical transmission fiber 4 is short, the illumination light I0 can have a color distribution. In this case, the color distribution can include more different colors. When the photoconversion device 30 emits the fluorescence W1, the fluorescence W2, the fluorescence W5, and the fluorescence W6 reflected from the reflective surface 233r of the reflector 233 as illumination light into the external space without being through the second optical transmission fiber 4 and the optical radiation module 5, the illumination light can have a more notable color distribution.

The reflective surface 233r of the reflector 233 may be along a parabolic plane, similarly to the eighth embodiment.

As in the ninth and tenth embodiments, the photoconversion device 30 may further include a color adjuster drive 234. The color adjuster drive 234 can adjust the light intensity ratio of the first excitation light P1 and the second excitation light P2, as in the ninth and tenth embodiments. In the thirteenth embodiment, the first excitation light P1 enters the fifth phosphor portion 2361 and the first phosphor portion 2311, and the second excitation light P2 enters the sixth phosphor portion 2362 and the second phosphor portion 2312. Thus, the color adjuster drive unit 234 can adjust the light intensity ratio of the fluorescence W1, the fluorescence W2, the fluorescence W5, and the fluorescence W6.

At least one of the first phosphor portion 2311, the second phosphor portion 2312, the fifth phosphor portion 2361, or the sixth phosphor portion 2362 may have the composition identical to the composition of any other one of the phosphor portions. More specifically, at least one of the fluorescence W1, the fluorescence W2, the fluorescence W5, or the fluorescence W6 may substantially have the same color as at least any other fluorescence. At least one of the first phosphor portion 2311, the second phosphor portion 2312, the fifth phosphor portion 2361, or the sixth phosphor portion 2362 may have the composition different from the composition of any other phosphor portion to allow the color adjuster drive 234 to adjust the colors or the color distribution of the illumination light.

2-2-7. Fourteenth Embodiment

The photoconversion device 30F in the illumination system 100F illustrated in FIG. 11 has the same or similar structure as the photoconversion device 30 according to any of the seventh to thirteenth embodiments described above.

In this structure as well, the photoconversion device 30F includes, for example, a first wavelength converter 231 and a splitter optical system 232. The first wavelength converter 231 includes a first incident surface 231a on its first end (e.g., in the positive Z-direction) intersecting with the optical axis AX1 and a second incident surface 231b on its second end (e.g., in the negative Z-direction) opposite to the first end, and emits fluorescence W0 in response to the excitation light P0. The splitter optical system 232 splits, for example, the excitation light P0 output through the first output end 2e2 into first excitation light P1 and second excitation light P2, and directs the first excitation light P1 to the first incident surface 231a of the first wavelength converter 231 and the second excitation light P2 to the second incident surface 231b of the first wavelength converter 231. This structure allows the first excitation light P1 to be incident on the first incident surface 231a of the first wavelength converter 231 and the second excitation light P2 to be incident on the second incident surface 231b of the first wavelength converter 231 using the single output portion (in other words, the single first output end 2e2) for outputting the excitation light P0. This eliminates the arrangement of multiple output portions corresponding to the first incident surface 231a and the second incident surfaces 231b of the first wavelength converter 231, thus simplifying the structure of the light source system and reducing the manufacturing cost. The photoconversion device 30F can also produce the above other effects as appropriate.

Figure 39:
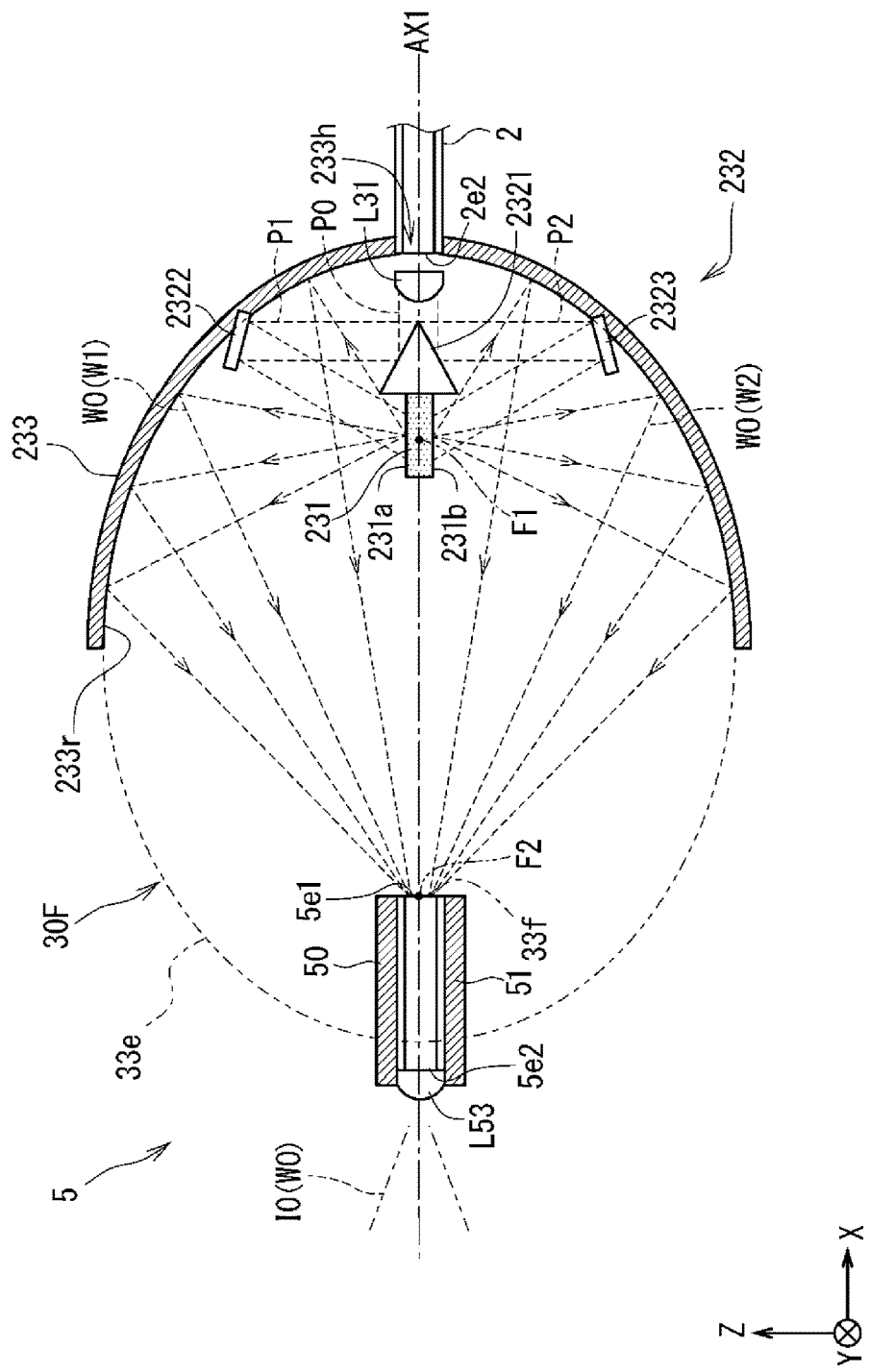
FIG. 39 is a schematic cross-sectional view of an optical radiation module with an example structure according to a fourteenth embodiment.

An optical radiation module 5 with an example structure according to the fourteenth embodiment illustrated in FIG. 39 includes a photoconversion device 30F and an optical radiator 50. In this example, the photoconversion device 30F has the same or similar structure as the photoconversion device 30 according to the seventh embodiment illustrated in FIG. 28. The optical radiator 50 is the same as or similar to the optical radiator 50 in FIG. 12.

2-2-8. Fifteenth Embodiment

A photoconversion device 30G in a light-emitting module 1 illustrated in FIG. 14 has the same or similar structure as the photoconversion device 30 according to any of the seventh to thirteenth embodiments described above.

In this structure as well, the photoconversion device 30G includes, for example, a first wavelength converter 231 and a splitter optical system 232. The first wavelength converter 231 includes a first incident surface 231a on its first end (e.g., in the positive Z-direction) intersecting with the optical axis AX1 and a second incident surface 231b on its second end (e.g., in the negative Z-direction) opposite to the first end, and emits fluorescence W0 in response to the excitation light P0. The splitter optical system 232 splits, for example, the excitation light P0 from the light-emitting element 10 into first excitation light P1 and second excitation light P2, and directs the first excitation light P1 to the first incident surface 231a of the first wavelength converter 231 and the second excitation light P2 to the second incident surface 231b of the first wavelength converter 231. This structure allows the first excitation light P1 to be incident on the first incident surface 231a of the first wavelength converter 231 and the second excitation light P2 to be incident on the second incident surface 231b of the first wavelength converter 231 using the single output portion (in other words, the single first output end 2e2) for outputting the excitation light P0. This eliminates the arrangement of multiple output portions corresponding to the first incident surface 231a and the second incident surfaces 231b of the first wavelength converter 231, thus simplifying the structure of the light source system and reducing the manufacturing cost. The photoconversion device 30G can also produce the above other effects as appropriate.

Figure 40:
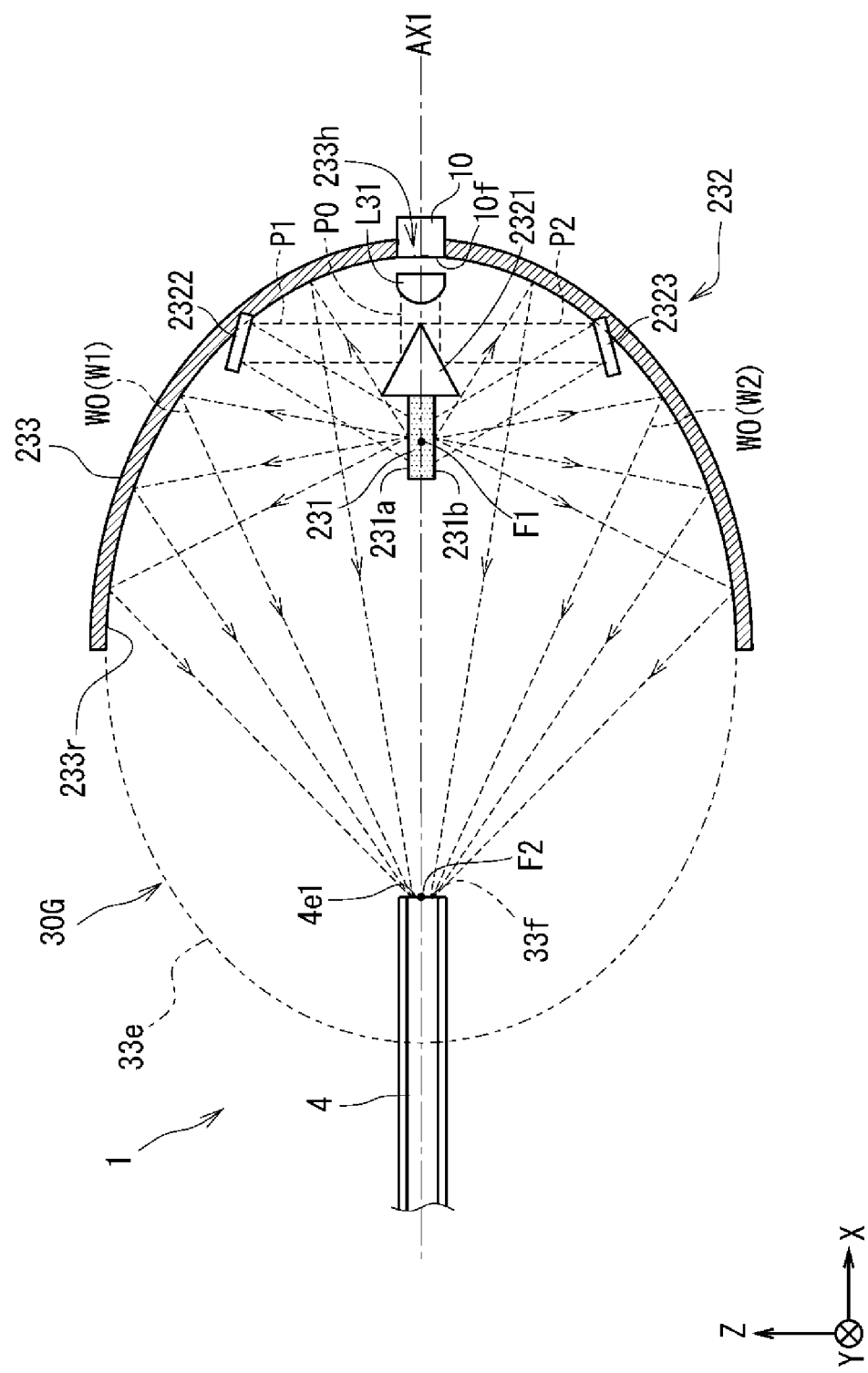
FIG. 40 is a schematic cross-sectional view of a light-emitting module with an example structure according to a fifteenth embodiment.

FIG. 40 is a schematic diagram of a light-emitting module 1 with an example structure according to a fifteenth embodiment. The light-emitting module 1 with the example structure includes a light-emitting element 10 and a photoconversion device 30G. In this example, the photoconversion device 30G has, for example, the same or similar structure as the photoconversion device 30 according to the seventh embodiment illustrated in FIG. 28. In the example of FIG. 40, excitation light P0 is emitted from an output portion 10f of the light-emitting element 10 toward the splitter 2321, instead of being through the first output end 2e2 of the first optical transmission fiber 2.

2-3. Others

Although the first incident surface 231a and the second incident surface 231b are, for example, flat surfaces in each of the above embodiments, the structure is not limited to this example. The first incident surface 231a and the second incident surface 231b may have, for example, multiple uneven portions, or may protrude in the direction to receive incident light, or more specifically, may be curved in an arc or may be in another shape.

3-1. Sixteenth Embodiment

A known light source device converts excitation light such as laser light emitted by a light source to fluorescence with a different wavelength with a phosphor, reflects the fluorescence with a reflector, and emits the fluorescence in a predetermined direction. With the phosphor containing phosphor substances that emit red (R) fluorescence, green (G) fluorescence, and blue (B) fluorescence, for example, the excitation light is converted to pseudo white light.

The light intensity of the fluorescence emitted from the phosphor may be increased by, for example, increasing the energy of the excitation light.

However, when the energy of the excitation light is increased, for example, a phosphor substance in the phosphor may deteriorate due to the resultant temperature increase. This may cause emission of fluorescence with lower light intensity in response to the excitation light.

The inventors of the present disclosure thus have developed a technique for increasing the light intensity of fluorescence emitted from a photoconversion device and an illumination system including the photoconversion device in response to excitation light.

3-1-1. Illumination System

An example illuminating system according to a sixteenth embodiment is the same as or similar to the system in FIG. 1.

3-1-2. Photoconversion Device

Figure 41A:
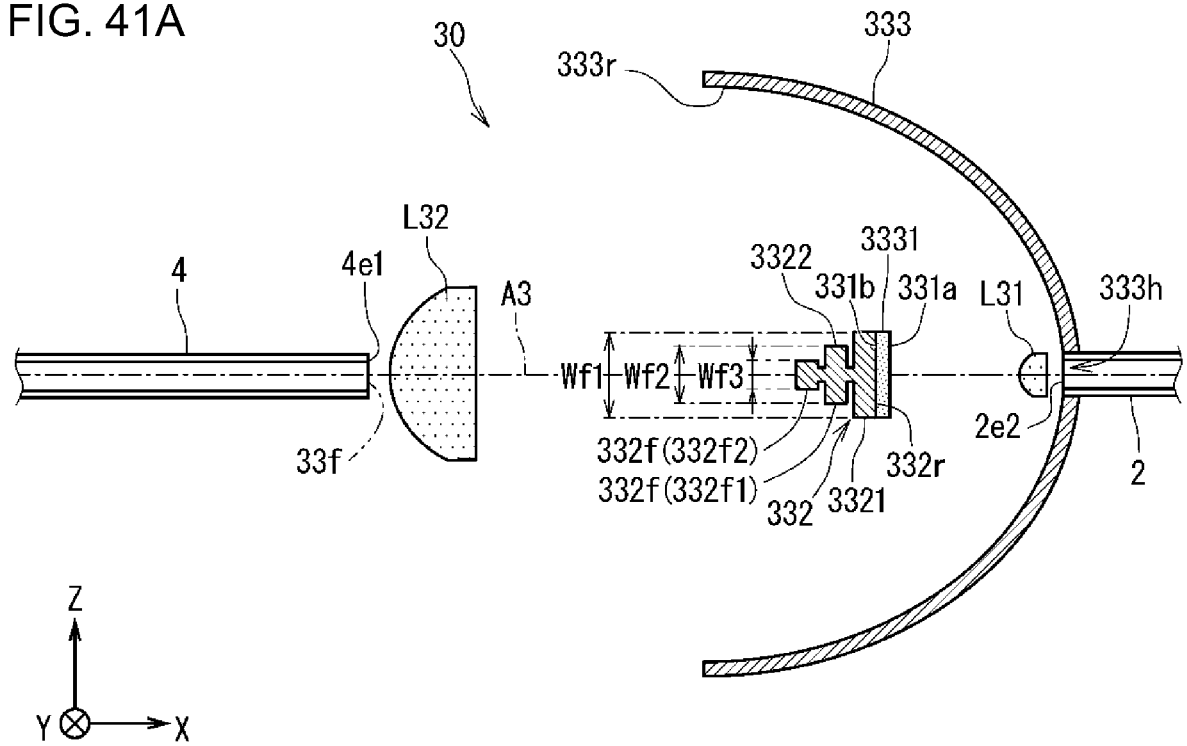
FIG. 41A is a schematic cross-sectional view of a photoconversion device with an example structure according to a sixteenth embodiment.

As illustrated in FIG. 41A, the photoconversion device 30 includes, for example, a wavelength converter 331, a heat sink 332, and a reflector 333. These components of the photoconversion device 30 are fixed to a housing 3b of a relay 3 either directly or indirectly with, for example, another member.

Figure 41B:
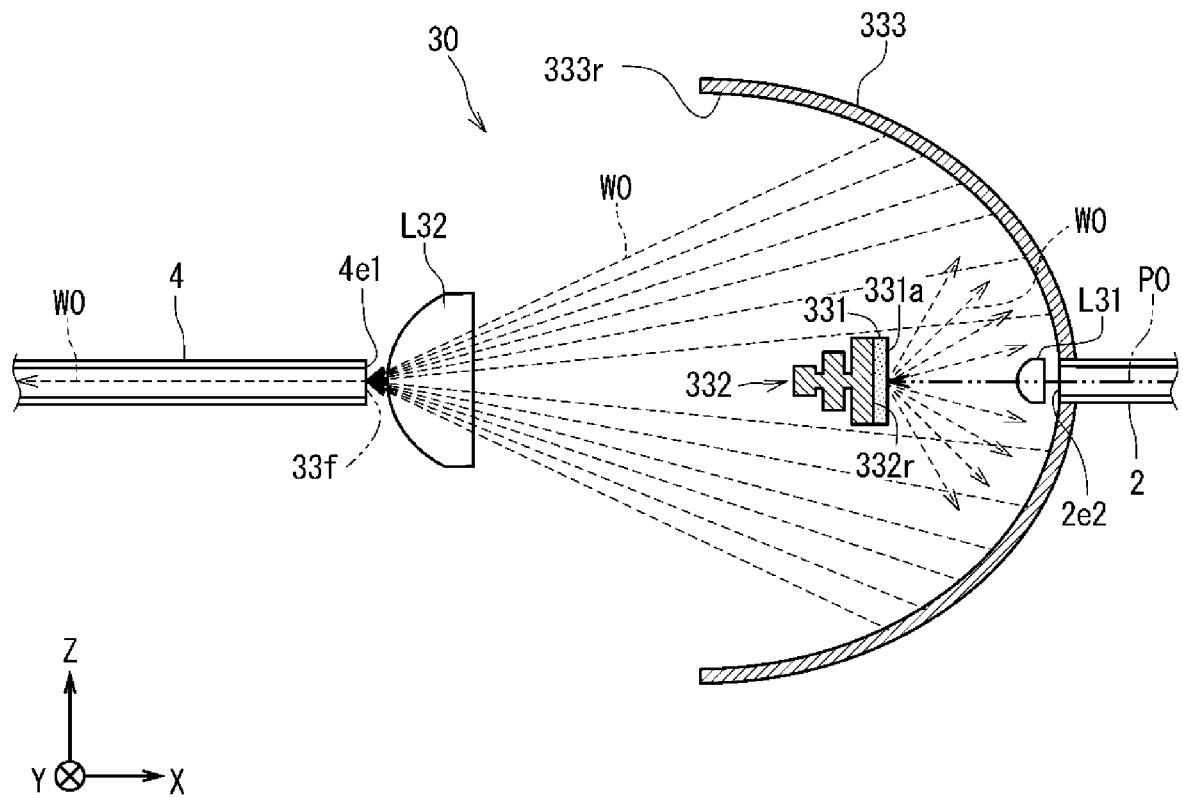
FIG. 41B is a schematic cross-sectional view of the photoconversion device with the example structure according to the sixteenth embodiment describing conversion of excitation light to fluorescence.

For example, the wavelength converter 331 can receive the excitation light P0 output through the first output end 2e2 as an output portion and emit fluorescence W0, as illustrated in FIG. 41B. The wavelength converter 331 includes, for example, a first surface (also referred to as a front surface) 331a to receive excitation light P0 output through the first output end 2e2 as an output portion, and a second surface (also referred to as a back surface) 331b different from the first surface 331a. The wavelength converter 331 in the sixteenth embodiment includes the second surface 331b located opposite to the first surface 331a. For example, the first surface 331a may face in the positive X-direction, and the second surface 331b may face in the negative X-direction. The wavelength converter 331 is, for example, a flat plate or a film. In other words, for example, the first surface 331a and the second surface 331b each are along a YZ plane. In this case, for example, the first output end 2e2 is, for example, on an imaginary line A3 extending along the normal to the first surface 331a. For example, the excitation light P0 output through the first output end 2e2 along the imaginary line A3 in the negative X-direction is incident on the first surface 331a of the wavelength converter 331. In this example, the first surface 331a and the second surface 331b may each be a flat surface, such as a circular surface or a polygonal surface, or a non-flat surface, such as a curved surface or an uneven surface. Thus, for example, the imaginary line A3 may be aligned with an optical path of the excitation light P0 output through the first output end 2e2 as an output portion toward the first surface 331a.

The wavelength converter 331 includes, for example, a solid member including phosphors (also referred to as a phosphor member), similarly to the wavelength converter 132.

The heat sink 332 includes, for example, a third surface (also referred to as a joining surface) 332r to be joined to the second surface 331b of the wavelength converter 331. The heat sink 332 can thus cool, for example, the wavelength converter 331 through the second surface 331b. The wavelength converter 331 is less likely to undergo temperature increase and resultant deterioration. When, for example, the wavelength converter 331 and the third surface 332r of the heat sink 332 are in direct contact with each other, heat generated in the wavelength converter 331 upon receiving the excitation light P0 is easily transferred from the wavelength converter 331 to the heat sink 332. For example, phosphor pellets may be formed on the third surface 332r of the heat sink 332 using, for example, molding with heat, to directly join the wavelength converter 331 to the third surface 332r of the heat sink 332. For the phosphor pellets containing numerous phosphor particles in glass with a low melting point, for example, the phosphor pellets may be joined to the third surface 332r of the heat sink 332 by sharing oxygen between the phosphor particles and the material for the heat sink 332. The glass with a low melting point may be, for example, a transparent metal oxide with a melting point of about 400 to 500 degrees Celsius (° C.).

When, for example, the surface area of the heat sink 332 is larger than the surface area of the wavelength converter 331, the heat sink 332 has a larger area exposed to outside air than the wavelength converter 331. This allows, for example, heat transferred from the wavelength converter 331 to the heat sink 332 to be easily dissipated into an atmosphere surrounding the heat sink 332. This facilitates, for example, cooling of the wavelength converter 331 with the heat sink 332. The heat sink 332 may have, for example, a larger volume than the wavelength converter 331 to facilitate heat transfer from the wavelength converter 331 to the heat sink 332. The heat sink 332 may include, for example, heat-dissipating fins 332f to facilitate heat transfer between the heat sink 332 and the atmosphere surrounding the heat sink 332. This allows, for example, heat transferred from the wavelength converter 331 to the heat sink 332 to be easily dissipated into the atmosphere surrounding the heat sink 332. This facilitates, for example, cooling of the wavelength converter 331 with the heat sink 332. The heat-dissipating fins 332f are projections on a surface of the heat sink 332 different from the third surface 332r. The surface area of the wavelength converter 331 and the surface area of the heat sink 332 herein each refer to the surface area of the component surface exposed to outside air. The heat-dissipating fins 332f may be in any shape that increases the surface area of the heat sink 332 to facilitate cooling of the wavelength converter 331 with the heat sink 332.

In the sixteenth embodiment, for example, the third surface 332r of the heat sink 332 can reflect light. This allows, for example, the excitation light P0 passing through the wavelength converter 331 to be reflected from the third surface 332r and enter the wavelength converter 331 again. This may increase, for example, the fluorescence W0 emitted by the wavelength converter 331. This may thus increase, for example, the light intensity of the fluorescence W0 emitted in response to the excitation light P0.

The heat sink 332 may be made of, for example, a metal material. The metal material may be, for example, copper (Cu), aluminum (Al), magnesium (Mg), gold (Au), silver (Ag), iron (Fe), chromium (Cr), cobalt (Co), beryllium (Be), molybdenum (Mo), tungsten (W), or an alloy of any of these metals. The heat sink 332 made of, for example, Cu, Al, Mg, Fe, Cr, Co, or Be as the metal material may be fabricated easily by molding, such as die casting. The heat sink 332 made of, for example, Al, Mg, Ag, Fe, Cr, or Co as the metal material may have the third surface 332r with a higher reflectance against visible light. This can increase, for example, the light intensity of the fluorescence W0 emitted in response to the excitation light P0. The heat sink 332 may be made of, for example, a nonmetallic material. The nonmetallic material may be, for example, aluminum nitride (AlN), silicon nitride ($Si_3N_4$), carbon (C), or aluminum oxide ($Al_2O_3$). The nonmetallic material may be, for example, crystalline or non-crystalline. The crystalline nonmetallic material may be, for example, silicon carbide (SiC) or $Si_3N_4$.

The heat sink 332 may have, as the third surface 332r, a layer of a metal material with a higher light reflectance than its main part (also referred to as a high light reflectance layer). For example, the heat sink 332 may use Cu as the material for the main part, and may use Ag or Cr, which has a high reflectance against visible light, as the metal material with a high light reflectance. In this case, for example, the main part of the heat sink 332 is fabricated by molding, or for example, by die casting. The surface of the main part then undergoes vapor deposition or plating to form a high light reflectance layer of, for example, Ag or Cr. A dielectric multilayer film may further be formed on, for example, the high light reflectance layer on the third surface 332r of the heat sink 332. The dielectric multilayer film may include, for example, dielectric thin films repeatedly stacked on one another. The dielectric may be at least one material selected from the group consisting of titanium dioxide ($TiO_3$), silicon dioxide ($SiO_2$), niobium pentoxide ($Nb_2O_5$), tantalum pentoxide ($Ta_2O_5$), and magnesium fluoride ($MgF_2$).

When, for example, the heat sink 332 has a higher thermal conductivity than the wavelength converter 331, heat generated in the wavelength converter 331 in response to the excitation light P0 is easily dissipated by the heat sink 332. The thermal conductivity of the material for the heat sink 332 may be higher than the thermal conductivity of the material for the wavelength converter 331. More specifically, for example, the material for the heat sink 332 may have a higher thermal conductivity than the transparent material contained in the wavelength converter 331 or than the phosphor (also referred to as a phosphor substance) contained in the wavelength converter 331.

The reflector 333 has, for example, a reflective surface 333r facing the first surface 331a of the wavelength converter 331. As illustrated in FIG. 41B, the reflective surface 333r directs, for example, the fluorescence W0 emitted by the wavelength converter 331 to be focused onto the focusing plane 33f (corresponding to a focusing portion). In the sixteenth embodiment, the wavelength converter 331 is between the reflective surface 333r and the focusing plane 33f. The reflector 333 herein may be, for example, a parabolic reflector. The reflective surface 333r is located, for example, to surround the wavelength converter 331 facing the first surface 331a, similarly to the reflective surface 133r of the reflector 1331. The reflective surface 333r may have, for example, a shape along an imaginary parabolic plane.

In the sixteenth embodiment, the heat sink 332 has, for example, a width in a direction (second direction) perpendicular to a direction (first direction) from the wavelength converter 331 toward the focusing plane 33f. The width of the heat sink 332 decreases in the first direction. In the example of FIGS. 41A and 41B, the first direction is the negative X-direction, and the second direction is the Z-direction. The Z-direction includes the positive Z-direction and the negative Z-direction. For example, the second direction may be the Y-direction. The Y-direction includes the positive Y-direction and the negative Y-direction. The heat sink 332 with this shape is less likely to, for example, block an optical path of the fluorescence W0 from the reflective surface 333r toward the focusing plane 33f. The wavelength converter 331 is thus less likely to undergo temperature increase and resultant deterioration in the photoconversion device 30 and the illumination system 100. The photoconversion device 30 and the illumination system 100 can thus emit fluorescence W0 with higher light intensity in response to the excitation light P0.

The heat sink 332 with the width in the second direction decreasing in the first direction (negative X-direction) may be, for example, the heat sink 332 with the width in the second direction decreasing in the first direction, or the heat sink 332 with the maximum width in the second direction increasing or decreasing in the first direction while the maximum size of the width decreases in the first direction. For example, the size of the cross section (YZ cross section) of the heat sink 332 perpendicular to the first direction (negative X-direction) may decrease in the first direction, or the size of the cross-section may increase or decrease in the first direction while the maximum size of the cross-section decreases in the first direction. For example, the diameter of the cross section (YZ cross section) of the heat sink 332 perpendicular to the first direction (negative X-direction) may decrease in the first direction, or the diameter may increase or decrease in the first direction while the maximum value of the diameter decreases in the first direction. In other words, the heat sink 332 may have, for example, the width in the second direction decreasing in the first direction (negative X-direction).

As illustrated in, for example, FIGS. 41A and 41B, the heat sink 332 includes multiple heat-dissipating fins 332f arranged in the first direction (negative X-direction). In this case, for example, each heat-dissipating fin 332f protrudes in the second direction (e.g., in the Z-direction) perpendicular to the first direction (negative X-direction), and the height of each heat-dissipating fin 332f in the second direction (e.g., in the Z-direction) may decrease in the first direction (negative X-direction).

As illustrated in, for example, FIGS. 41A and 41B, the heat sink 332 includes a portion 3321 including a third surface 332r to which the wavelength converter 331 is joined (also referred to as a first portion), a portion 3322 (also referred to as the second portion) protruding in the first direction (negative X-direction) from the first portion 3321. In other words, the first portion 3321 is a part of the heat sink 332 joined to the wavelength converter 331. The boundary between the first portion 3321 and the second portion 3322 in the heat sink 332 is, for example, aligned with an imaginary plane perpendicular to the first direction (YZ plane in this example) at a position at which the width of the heat sink 332 in the second direction starts decreasing in the first direction (negative X-direction) from the third surface 332r. In the example of FIGS. 41A and 41B, the second portion 3322 includes two heat-dissipating fins 332f. The two heat-dissipating fins 332f include a first heat-dissipating fin 332f1 and a second heat-dissipating fin 332f2. The first heat-dissipating fin 332f1 and the second heat-dissipating fin 332f2 are arranged in this order in the first direction (negative X-direction). A width Wf1 of the first portion 3321 is the width in the second direction (e.g., in the Z-direction). A width Wf2 of the first heat-dissipating fin 332f1 is the width in the second direction (e.g., in the Z-direction). A width Wf3 of the second heat-dissipating fin 332f2 is the width in the second direction (e.g., in the Z-direction). In this case, the width Wf2 is less than the width Wf1, and the width Wf3 is less than the width Wf2. In other words, the relationship is Wf1>Wf2>Wf3. The widths Wf1, Wf2, and Wf3 each are set to, for example, not more than 1 cm. The width Wf1 may be the same as the width in the second direction (e.g., in the Z-direction) of the wavelength converter 331, or may be greater than the width in the second direction (e.g., in the Z-direction) of the wavelength converter 331.

For the heat sink 332 including multiple heat-dissipating fins 332f arranged in the first direction, the heat sink 332 having the width in the second direction perpendicular to the first direction decreasing in the first direction refers to the width of each of the multiple heat-dissipating fins 332f satisfying the above relationship. More specifically, the performance of the heat sink 332 is affected by the multiple heat-dissipating fins 332f as the main part of the heat sink 332. The heat sink 332 may thus be designed without considering a part of the heat sink 332 between the adjacent heat-dissipating fins 332f.

For example, the third surface 332r of the heat sink 332 joined to the wavelength converter 331 may include an uneven surface. This structure has, for example, the anchor effect to increase the strength of the joint between the wavelength converter 331 and the heat sink 332. In this case, for example, the wavelength converter 331 and the heat sink 332 are less likely to separate from each other. The transfer of heat from the wavelength converter 331 to the heat sink 332 is thus less likely to deteriorate.

As illustrated in FIGS. 41A and 41B, the photoconversion device 30 may also include an optical system L31 including, for example, a lens that directs the excitation light P0 output through the first output end 2e2 of the first optical transmission fiber 2 to be focused toward the wavelength converter 331. The optical system L31 may include, for example, a reflective mirror that reflects or focuses the excitation light P0, or may be eliminated.

As illustrated in FIGS. 41A and 41B, the photoconversion device 30 may also include an optical system L32 including, for example, a lens that directs the fluorescence W0 emitted by the wavelength converter 331 and reflected from the reflective surface 333r to be focused at the input end (second input end) 4e1 of the second optical transmission fiber 4. The optical system L32 may include, for example, a reflective mirror that reflects or focuses the fluorescence W0, or may be eliminated.

3-1-3. Overview of Sixteenth Embodiment

The photoconversion device 30 according to the sixteenth embodiment includes, for example, the wavelength converter 331, the heat sink 332, and the reflector 333. The wavelength converter 331 includes the first surface 331a to receive the excitation light P0 output through the first output end 2e2, and the second surface 331b different from the first surface 331a to emit fluorescence W0 in response to the excitation light P0. The heat sink 332 includes the third surface 332r joined to the second surface 331b. The reflector 333 includes the reflective surface 333r facing the first surface 331a to focus the fluorescence W0 emitted by the wavelength converter 331 toward the focusing portion (focusing plane 33f). The wavelength converter 331 is between the reflective surface 333r and the focusing plane 33f. The heat sink 332 has, for example, the width in the second direction perpendicular to the negative X-direction as the first direction from the wavelength converter 331 toward the focusing plane 33f. The heat sink 332 with this structure can thus cool, for example, the wavelength converter 331 through the second surface 331b. The wavelength converter 331 is thus less likely to undergo temperature increase and resultant deterioration. The heat sink 332 with the width in the second direction decreasing in the first direction from the reflective surface 333r toward the focusing plane 33f is, for example, less likely to block an optical path of the fluorescence W0 from the reflective surface 333r toward the focusing plane 33f. The wavelength converter 331 is, for example, less likely to undergo temperature increase and resultant deterioration in the photoconversion device 30 and the illumination system 100. The photoconversion device 30 and the illumination system 100 can thus emit fluorescence W0 with higher light intensity in response to the excitation light P0.

3-2. Other Embodiments

The present disclosure is not limited to the sixteenth embodiment and may be changed or varied without departing from the spirit and scope of the present disclosure.

3-2-1. Seventeenth Embodiment

Figure 42A:
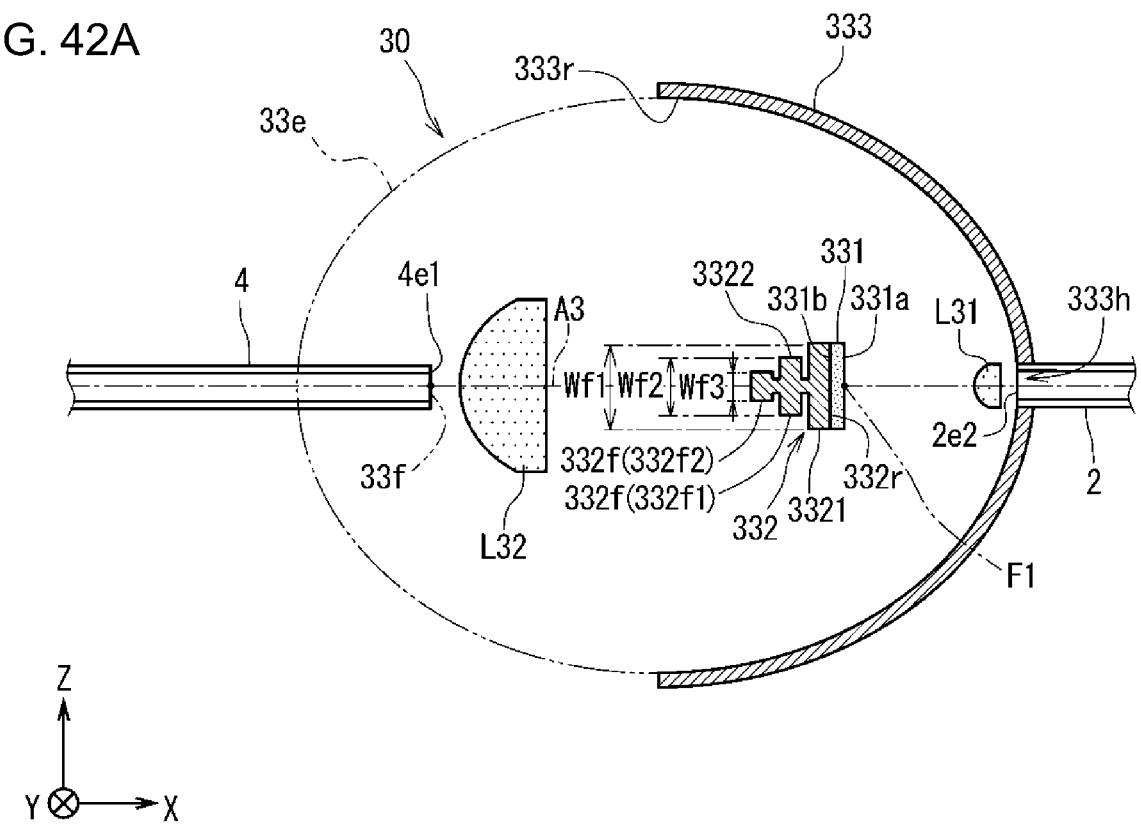
FIG. 42A is a schematic cross-sectional view of a photoconversion device with an example structure according to a seventeenth embodiment.
Figure 42B:
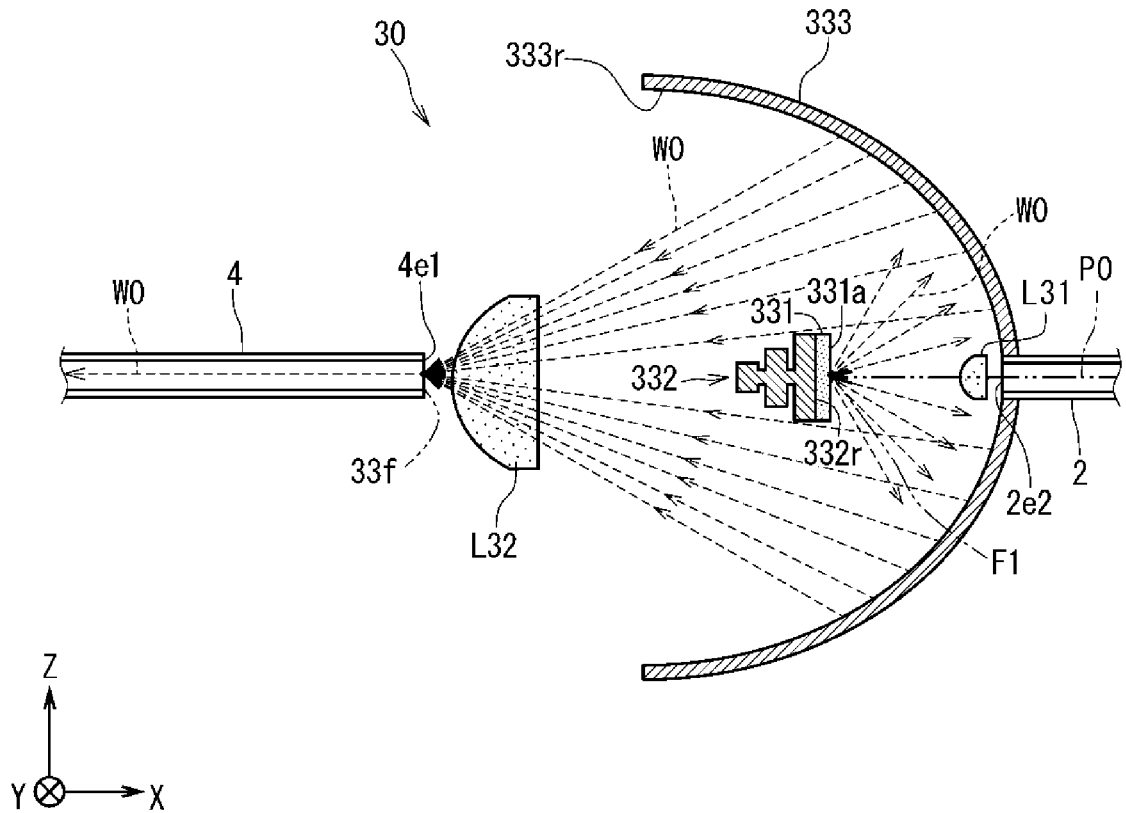
FIG. 42B is a schematic cross-sectional view of the photoconversion device with the example structure according to the seventeenth embodiment describing conversion of excitation light to fluorescence.

In the above sixteenth embodiment, as illustrated in, for example, FIGS. 42A and 42B, the reflector 333 may be an ellipsoidal mirror with the reflective surface 333r along the ellipsoid 33e. The ellipsoid 33e may include, for example, a focal point F1 (also referred to as a first focal point) aligned with the area to receive the excitation light P0 output through the first output end 2e2 as an output portion on the first surface 331a. This structure facilitates, for example, focusing of the fluorescence W0 emitted by the wavelength converter 331 with the reflector 333. This, for example, increases the light intensity of the fluorescence W0 emitted from the photoconversion device 30 and the illumination system 100 in response to the excitation light P0.

A photoconversion device 30 with an example structure according to a seventeenth embodiment illustrated in FIGS. 42A and 42B is based on the structure of the photoconversion device 30 according to the above sixteenth embodiment illustrated in FIGS. 41A and 41B. More specifically, the photoconversion device 30 with the example structure according to the seventeenth embodiment includes a reflector 333 being an ellipsoidal mirror, and other components with shapes and arrangement changed as appropriate to cause the first focal point F1 to be on the first surface 331a of the wavelength converter 331. In this example, the optical systems L31 and L32 may be eliminated.

3-2-2. Eighteenth Embodiment

Figure 43A:
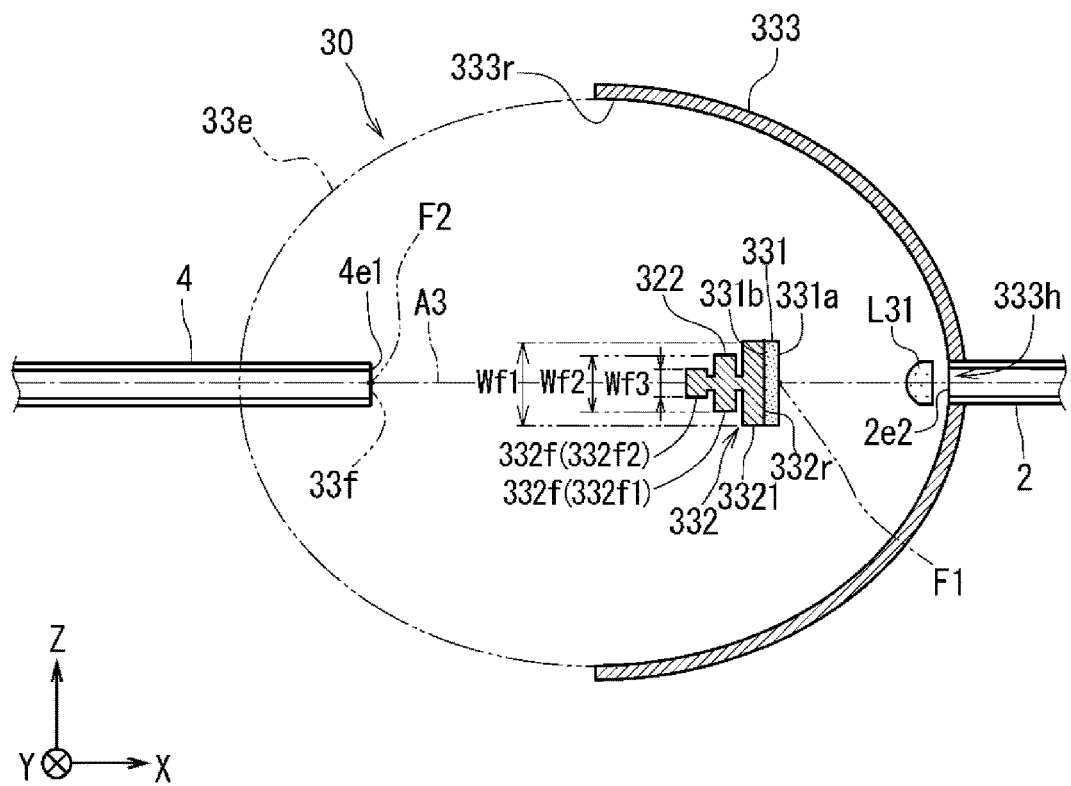
FIG. 43A is a schematic cross-sectional view of a photoconversion device with an example structure according to an eighteenth embodiment.
Figure 43B:
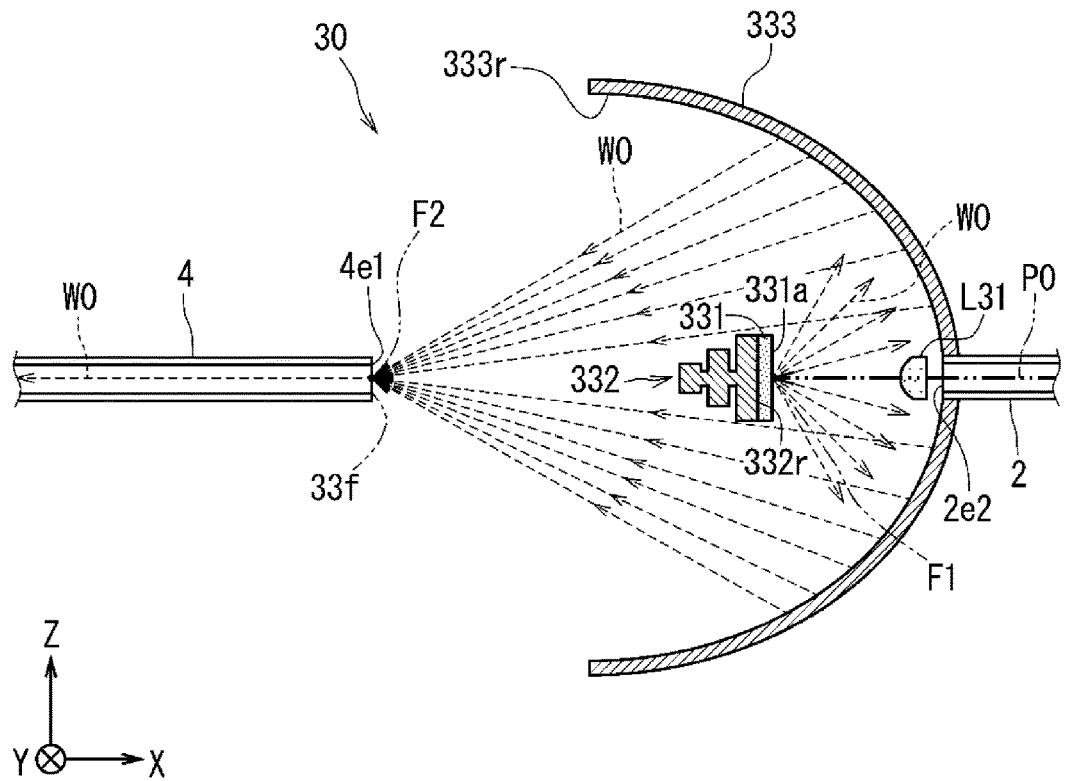
FIG. 43B is a schematic cross-sectional view of the photoconversion device with the example structure according to the eighteenth embodiment describing conversion of excitation light to fluorescence.

In the seventeenth embodiment, as illustrated in, for example, FIGS. 43A and 43B, the ellipsoid 33e may include a focal point F2 (also referred to as a second focal point) different from the first focal point F1. The second focal point F2 may be aligned with the focusing plane 33f. In other words, for example, the second focal point F2 on the ellipsoid 33e may be aligned with the focusing plane 33f. This structure facilitates, for example, focusing of the fluorescence W0 emitted by the wavelength converter 331 onto the focusing plane 33f with the reflector 333. This, for example, increases the light intensity of the fluorescence W0 emitted from the photoconversion device 30 and the illumination system 100 in response to the excitation light P0.

A photoconversion device 30 with an example structure according to an eighteenth embodiment illustrated in FIGS. 43A and 43B is based on the structure of the photoconversion device 30 according to the above seventeenth embodiment illustrated in FIGS. 42A and 42B. More specifically, the photoconversion device 30 with the example structure according to the seventeenth embodiment eliminates the optical system L32 and includes other components with shapes and arrangement changed as appropriate to cause the second focal point F2 to be on the focusing plane 33f. In the example of FIGS. 43A and 43B, the second focal point F2 is aligned with the second input end 4e1 of the second optical transmission fiber 4.

Figure 44A:
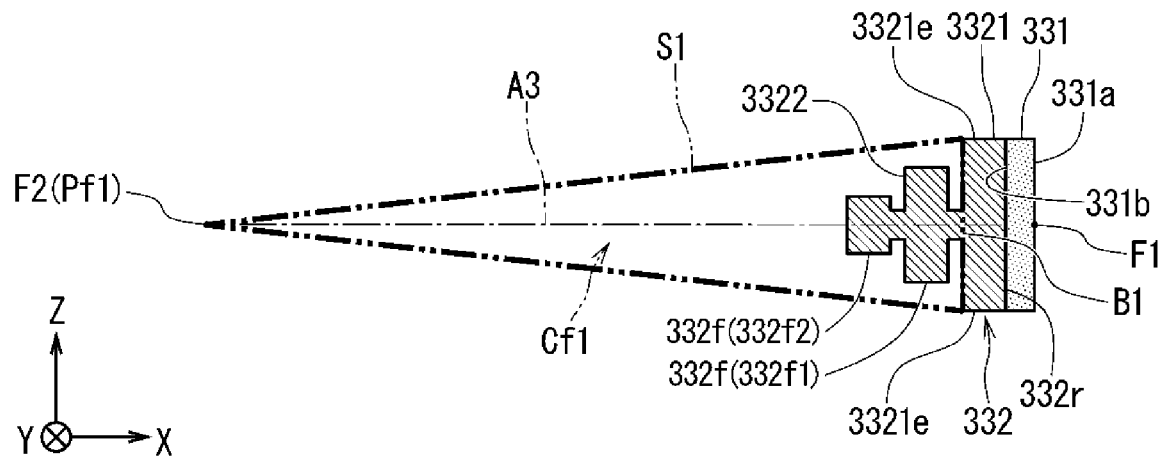
FIG. 44A is a schematic cross-sectional view of a heat sink and a wavelength converter in an example structure according to the eighteenth embodiment.
Figure 44B:
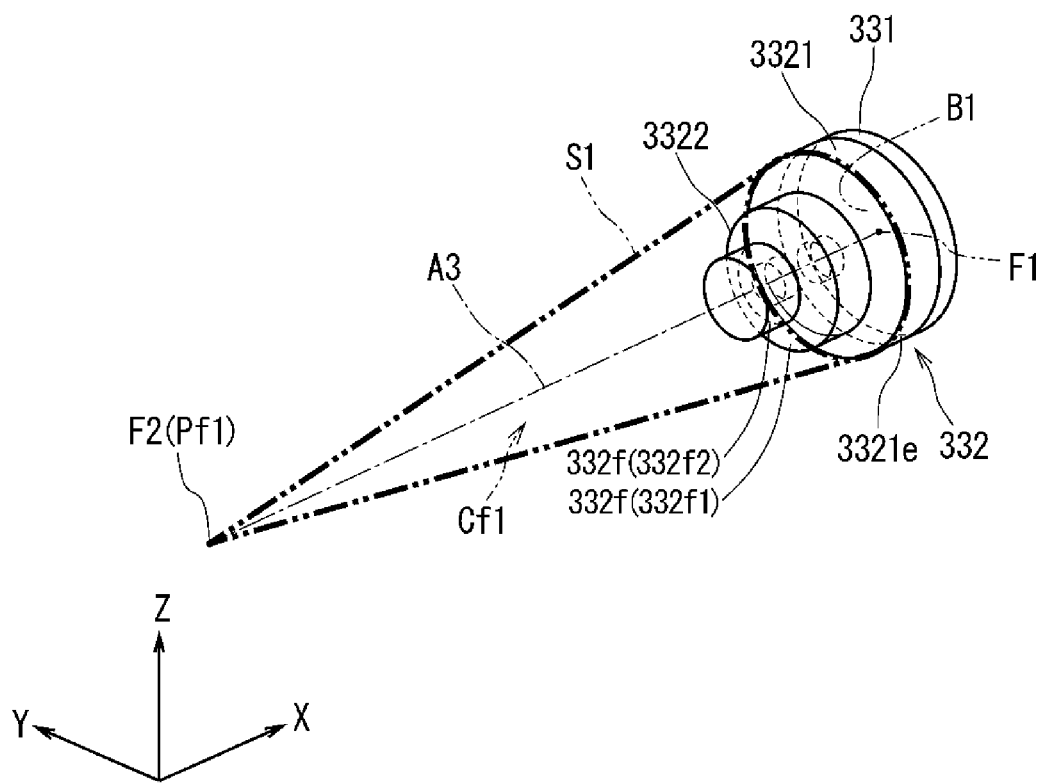
FIG. 44B is a schematic perspective view of the heat sink and the wavelength converter in the example structure according to the eighteenth embodiment.

As illustrated in, for example, FIGS. 44A and 44B, the first portion 3321 of the heat sink 332 joined to the wavelength converter 331 has an outer edge 3321e surrounding a straight imaginary line passing through the first focal point F1 and the second focal point F2 (e.g., an imaginary line A3). The outer edge 3321e is, for example, an outer circumferential portion of the first portion 3321 centered on the imaginary line A3. In the example of FIGS. 44A and 44B, the outer edge 3321e is a cylindrical outer portion of the first portion 3321 centered on the imaginary line A3. When, for example, an imaginary surface surrounded by the outer edge 3321e is a bottom surface B1 and an imaginary area in the shape of a cone having the second focal point F2 as a vertex Pf1 is a first area Cf1 (also referred to as a first conical area), the second portion 3322 of the heat sink 332 may be located inside the first area Cf1. The bottom surface B1 is, for example, the surface of a closed area defined by cutting the outer edge 3321e along an imaginary plane intersecting with the imaginary line A3. The imaginary plane may be, for example, perpendicular to or inclined with the imaginary line A3. The bottom surface B1 including an outer peripheral portion located on the outer edge 3321e may be, for example, a flat surface or a non-flat surface, such as a curved surface or an uneven surface. In the example below, all the heat-dissipating fins 332f included in the second portion 3322 may be inside the first area Cf1. In FIGS. 44A and 44B, two-dot-dash lines indicate the outer edges of the bottom surface B1 and an inclined surface Si of the first area Cf1. In the example in FIGS. 44A and 44B, the bottom surface B1 is circular, and the first area Cf1 is in the shape of a circular cone. The heat sink 332 with this structure is, for example, less likely to block an optical path of the fluorescence W0 from the reflective surface 333r toward the focusing plane 33f. This, for example, increases the light intensity of the fluorescence W0 emitted from the photoconversion device 30 and the illumination system 100 in response to the excitation light P0.

3-2-3. Nineteenth Embodiment

Figure 45A:
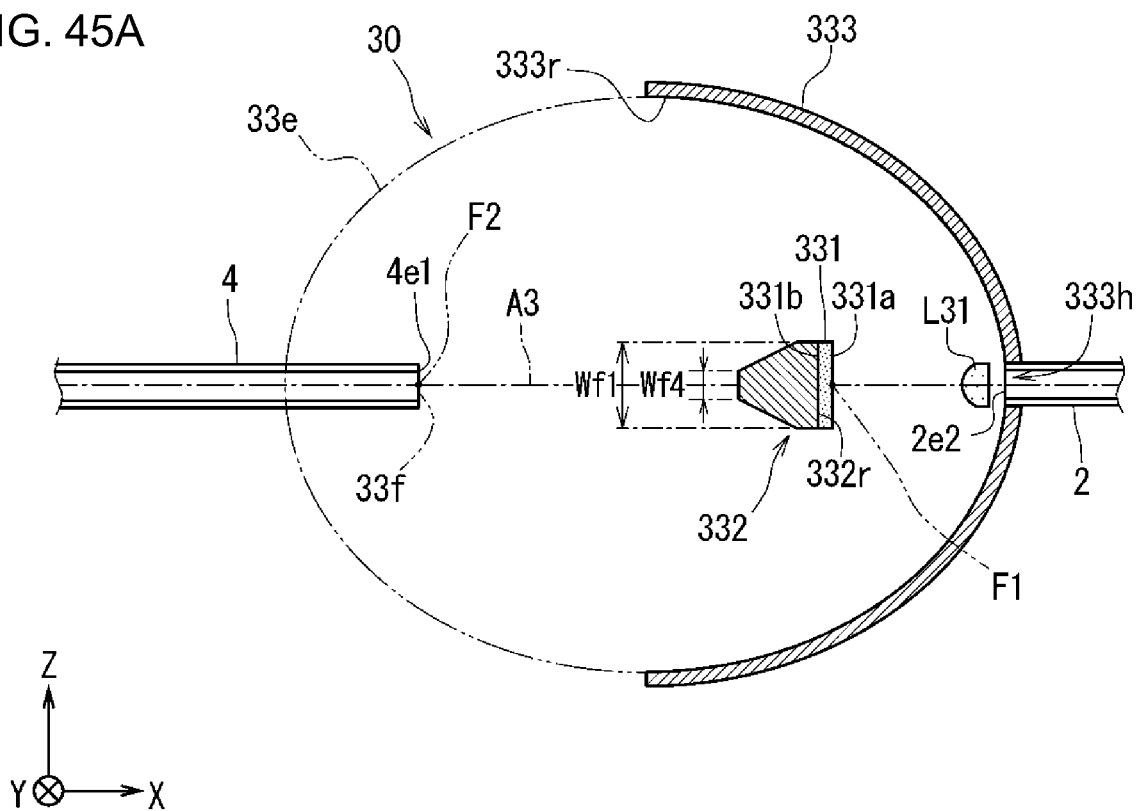
FIG. 45A is a schematic cross-sectional view of a photoconversion device with an example structure according to a nineteenth embodiment.
Figure 45B:
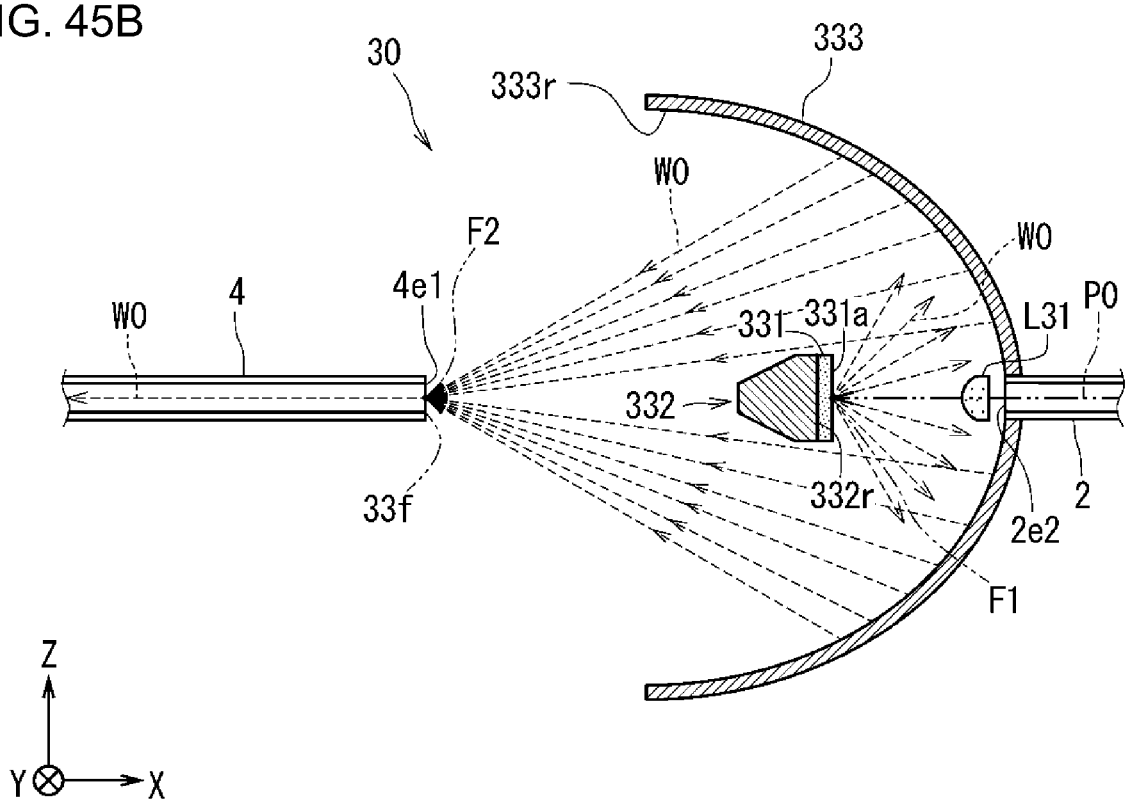
FIG. 45B is a schematic cross-sectional view of the photoconversion device with the example structure according to the nineteenth embodiment describing conversion of excitation light to fluorescence.

In each of the above sixteenth to eighteenth embodiments, for example, the heat sink 332 may not include the heat-dissipating fins 332f as illustrated in FIGS. 45A and 45B.

A photoconversion device 30 with an example structure according to a nineteenth embodiment illustrated in FIGS. 45A and 45B is based on the structure of the photoconversion device 30 according to the above eighteenth embodiment illustrated in FIGS. 43A and 43B. More specifically, the photoconversion device 30 with the example structure according to the nineteenth embodiment may include the second portion 3322 with no heat-dissipating fins 332f, and may have the shape changed to have the width in the second direction (e.g., in the Z-direction) decreasing in the first direction (negative X-direction). As illustrated in FIGS. 45A, the width of the second portion 3322 in the second direction (e.g., in the Z-direction) decreases in the first direction (negative X-direction) at a constant rate from the maximum width Wf1 to the minimum width Wf4.

Figure 46A:
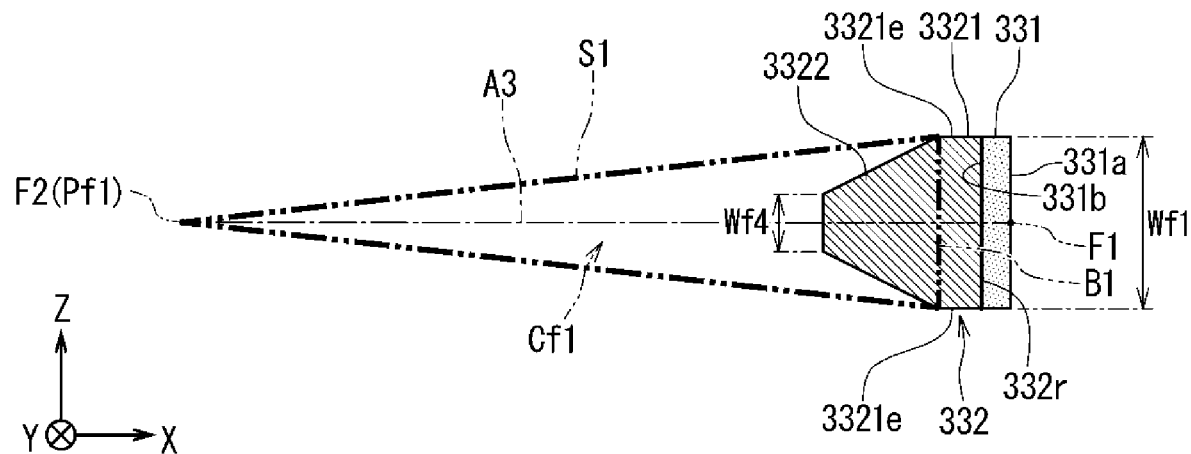
FIG. 46A is a schematic cross-sectional view of a heat sink and a wavelength converter in a first structure according to the nineteenth embodiment.
Figure 46B:
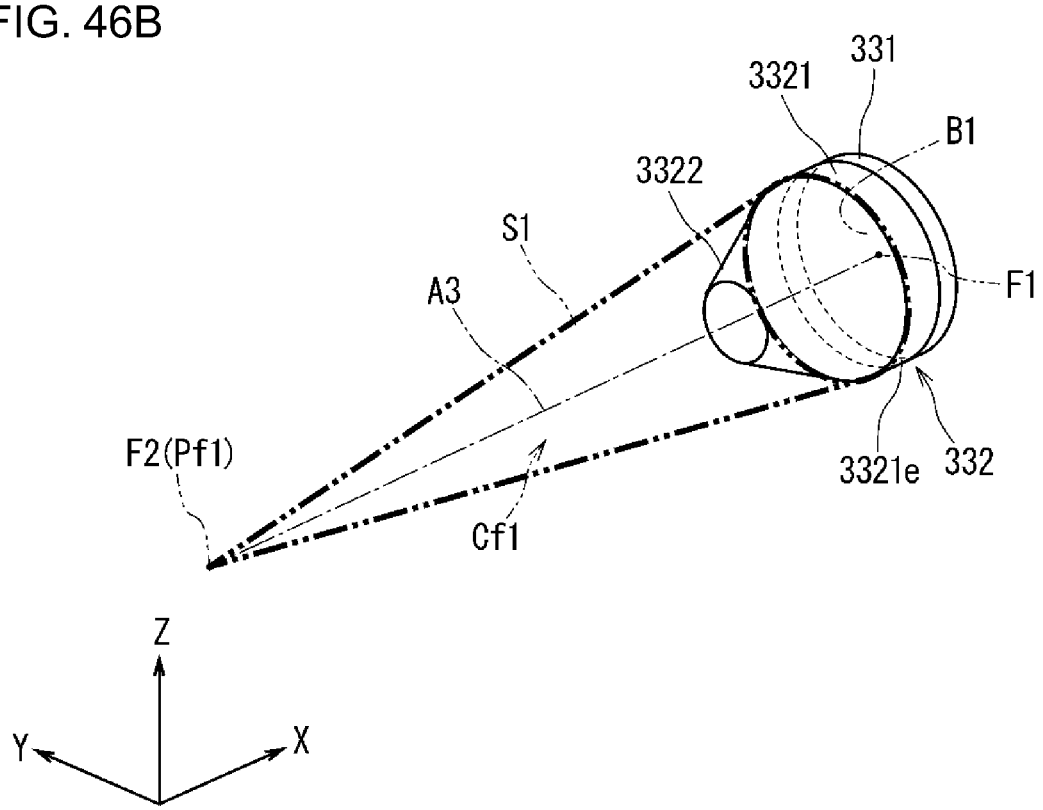
FIG. 46B is a schematic perspective view of the heat sink and the wavelength converter each in the first structure according to the nineteenth embodiment.

The second portion 3322 may be, for example, in a tapered shape or in the shape of a frustum with its cross section perpendicular to the first direction (YZ cross section in this example) decreasing in the first direction (negative X-direction). As illustrated in, for example, FIGS. 46A and 46B, the second portion 3322 may be in the shape of a circular frustum with its cross section perpendicular to the first direction (YZ cross-section in this example) decreasing in the first direction (negative X-direction). A heat sink 332 with a first structure according to a nineteenth embodiment illustrated in FIGS. 46A and 46B is based on the example structure of the heat sink 332 according to the above eighteenth embodiment illustrated in FIGS. 44A and 44B. More specifically, the heat sink 332 with the first structure according to the nineteenth embodiment illustrated in FIGS. 46A and 46B may include the second portion 3322 with no heat-dissipating fins 332f, and may have the width in the second direction (e.g., in the Z-direction) decreasing in the first direction (negative X-direction). When, for example, an imaginary surface surrounded by the outer edge 3321e of the first portion 3321 is the bottom surface B1 and an imaginary area in the shape of a cone having the second focal point F2 as a vertex Pf1 is a first area Cf1, the second portion 3322 of the heat sink 332 may also be located inside the first area Cf1. In FIGS. 46A and 46B, two-dot-dash lines indicate the outer edges of the bottom surface B1 and the inclined surface S1 of the first area Cf1 as in FIGS. 44A and 44B. The heat sink 332 with this structure is, for example, less likely to block an optical path of the fluorescence W0 from the reflective surface 333r toward the focusing plane 33f. This, for example, increases the light intensity of the fluorescence W0 emitted from the photoconversion device 30 and the illumination system 100 in response to the excitation light P0.

For example, the second portion 3322 may be in the shape of a circular cone with its upper bottom having the diameter Wf4 smaller than the diameter Wf1 of its lower bottom. In this example, the minimum width Wf4 may be zero. The second portion 3322 may be, for example, in the shape of a cone or the shape of a circular cone with its cross section perpendicular to the first direction (YZ cross section in this example) decreasing in the first direction (negative X-direction).

The length of the first portion 3321 in the first direction (negative X-direction) may be, for example, short or substantially zero. The heat sink 332 may have, for example, the width in the second direction (e.g., in the Z-direction) decreasing in the first direction (negative X-direction) from the third surface 332r. For the first portion 3321 with the length of substantially zero in the first direction (negative X-direction), an optical path of the fluorescence W0 is more difficult to be blocked by the heat sink 332.

Figure 47A:
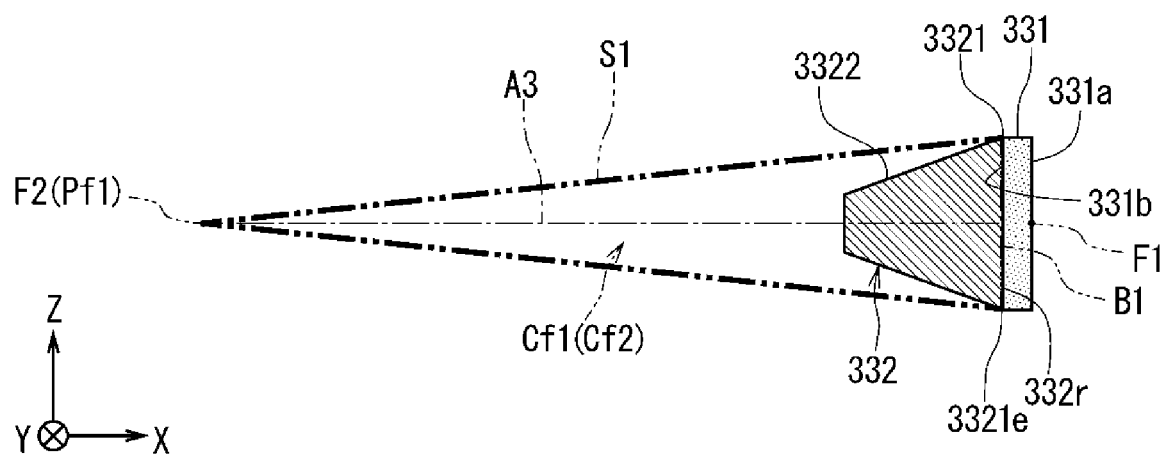
FIG. 47A is a schematic cross-sectional view of a heat sink and a wavelength converter in a second structure according to the nineteenth embodiment.
Figure 47B:
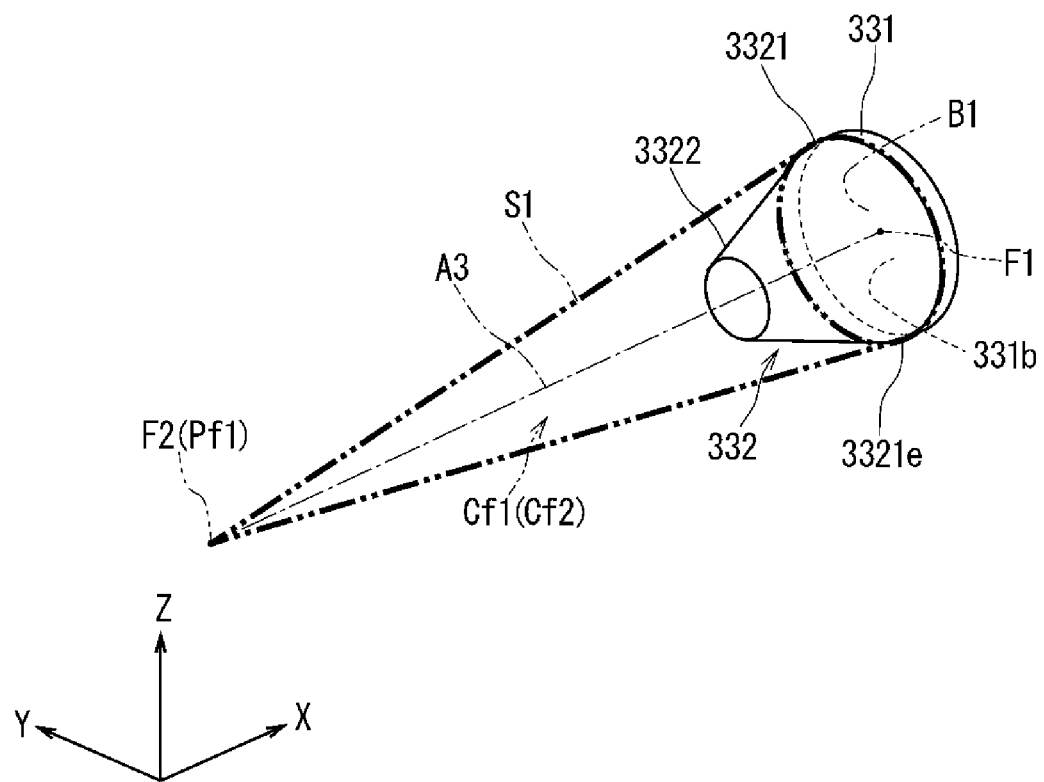
FIG. 47B is a schematic perspective view of the heat sink and the wavelength converter in the second structure according to the nineteenth embodiment.

The heat sink 332 may be, for example, in a tapered shape or in the shape of a frustum with its cross section perpendicular to the first direction (YZ cross section in this example) decreasing in the first direction (negative X-direction). As illustrated in, for example, FIGS. 47A and 47B, the heat sink 332 may be in the shape of a circular frustum with its cross section perpendicular to the first direction (YZ cross-section in this example) decreasing in the first direction (negative X-direction). A heat sink 332 with a second structure according to the nineteenth embodiment illustrated in FIGS. 47A and 47B is based on the first structure of the heat sink 332 according to the above nineteenth embodiment illustrated in FIGS. 46A and 46B. More specifically, the heat sink 332 with the second structure according to the nineteenth embodiment illustrated in FIGS. 47A and 47B may have the width in the second direction (e.g., in the Z-direction) decreasing in the first direction (negative X-direction) from the third surface 332r. When, for example, an imaginary surface surrounded by the outer edge 3321e of the first portion 3321 is the bottom surface B1 and an imaginary area in the shape of a cone having the second focal point F2 as a vertex Pf1 is a first area Cf1, the second portion 3322 of the heat sink 332 may also be located inside the first area Cf1. In FIGS. 47A and 47B, two-dot-dash lines indicate the outer edges of the bottom surface B1 and the inclined surface S1 of the first area Cf1 as in FIGS. 46A and 46B. The heat sink 332 with this structure is, for example, less likely to block an optical path of the fluorescence W0 from the reflective surface 333r toward the focusing plane 33f. This, for example, increases the light intensity of the fluorescence W0 emitted from the photoconversion device 30 and the illumination system 100 in response to the excitation light P0.

For example, the size of the third surface 332r of the heat sink 332 may be substantially smaller than or equal to the size of the second surface 331b of the wavelength converter 331. When, for example, the second surface 331b is the bottom surface B1 and an imaginary area in the shape of a cone (also referred to as a second conical area) having the second focal point F2 as a vertex Pf1 is a second area Cf2, the heat sink 332 may be located inside the first area Cf1. In this example, the second surface 331b and the bottom surface B1 may each be a flat surface, such as a circular surface or a polygonal surface, or a non-flat surface, such as a curved surface or an uneven surface. The heat sink 332 with this structure is, for example, less likely to block an optical path of the fluorescence W0 from the reflective surface 333r toward the focusing plane 33f. When, for example, the second surface 331b is the bottom surface B1 and an imaginary area in the shape of a cone having the second focal point F2 as a vertex Pf1 is a second area Cf2, the heat sink 332 located inside the second area Cf2 may or may not include the heat-dissipating fins 332f.

Figure 48:
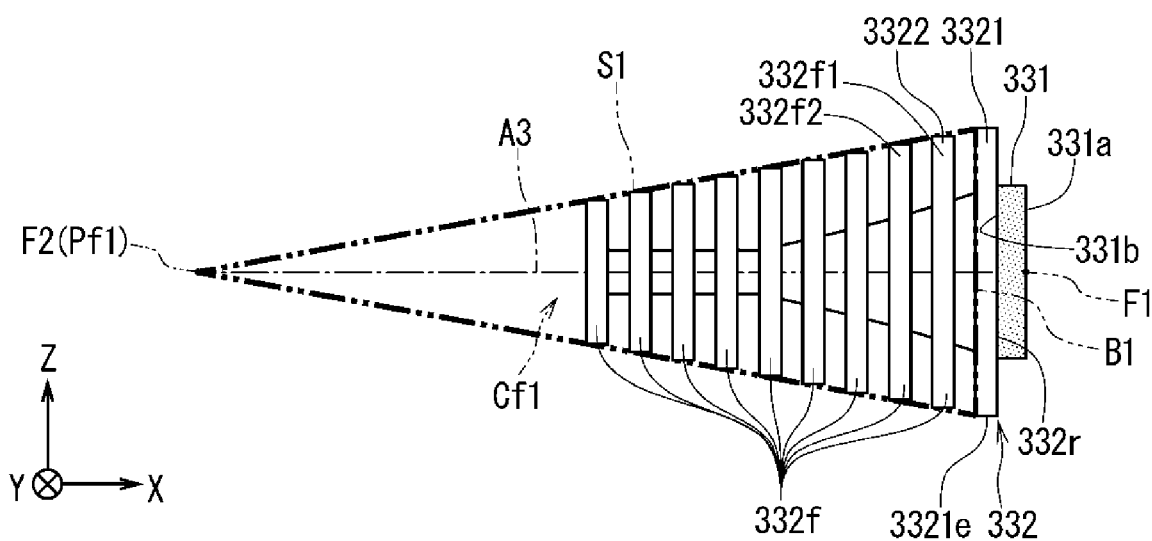
FIG. 48 is a schematic cross-sectional view of a heat sink and a wavelength converter in a third structure according to the nineteenth embodiment.

As illustrated in FIG. 48, for example, the size of the third surface 332r of the heat sink 332 may be larger than the size of the second surface 331b of the wavelength converter 331. The heat sink 332 with the width in the second direction decreasing in the first direction, depending on the shape of the ellipsoid 33e of the reflector 333, is less likely to block an optical path of the fluorescence W0 from the reflective surface 333r toward the focusing plane 33f. The heat sink 332 with a larger third surface 332r allows more cooling.

3-2-4. Twentieth Embodiment

Figure 49A:
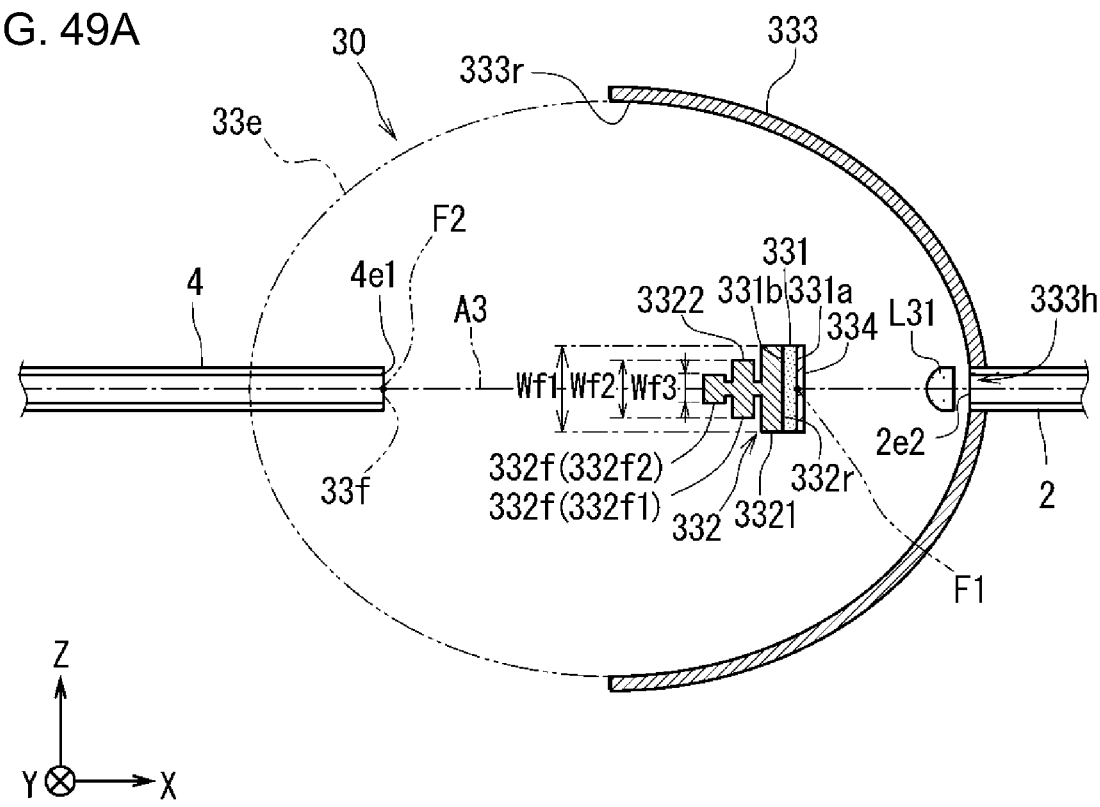
FIG. 49A is a schematic cross-sectional view of a photoconversion device with an example structure according to a twentieth embodiment.
Figure 49B:
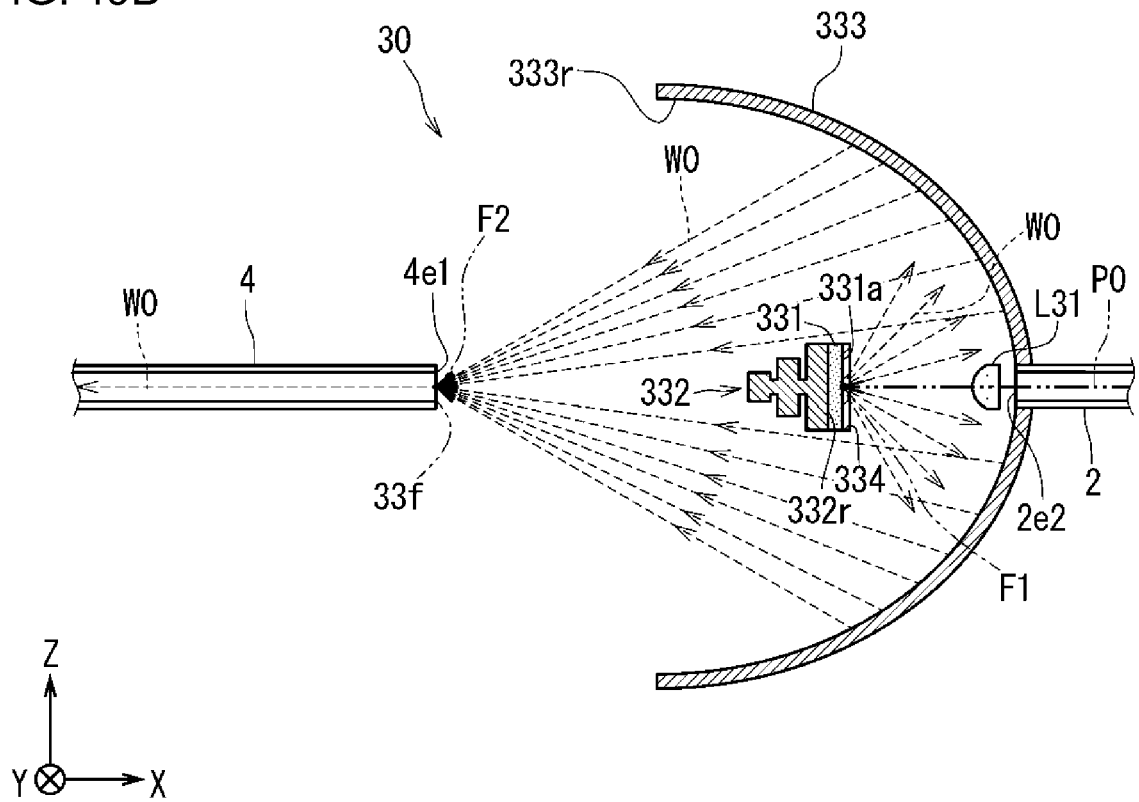
FIG. 49B is a schematic cross-sectional view of the photoconversion device with the example structure according to the twentieth embodiment describing conversion of excitation light to fluorescence.

In each of the above sixteenth to nineteenth embodiments, for example, the photoconversion device 30 may include a transparent member 334 with high thermal conductivity in contact with the first surface 331a of the wavelength converter 331 as illustrated in FIGS. 49A and 49B. The transparent member 334 may be transmissive to, for example, excitation light P0. The heat sink 332 with this structure can thus cool, for example, the wavelength converter 331 through the second surface 331b and cool the wavelength converter 331 through the first surface 331a with the transparent member 334. The wavelength converter 331 is thus less likely to undergo temperature increase and resultant deterioration. This, for example, increases the light intensity of the fluorescence W0 emitted from the photoconversion device 30 and the illumination system 100 in response to the excitation light P0. The transparent member 334 may be, for example, a plate along the first surface 331a.

When, for example, the transparent member 334 has a higher thermal conductivity than the wavelength converter 331, heat generated in the wavelength converter 331 in response to the excitation light P0 is easily dissipated by the transparent member 334. The thermal conductivity of the material for the transparent member 334 may be, for example, higher than the thermal conductivity of the material for the wavelength converter 331. More specifically, the transparent member 334 may be referred to as a highly thermally conductive transparent member. More specifically, for example, the material for the transparent member 334 may have a higher thermal conductivity than the phosphor (phosphor substance) contained in the wavelength converter 331 or than the transparent material contained in the wavelength converter 331. For example, the transparent member 334 may have a higher thermal conductivity than the wavelength converter 331 and a lower thermal conductivity than the heat sink 332.

The transparent member 334 may be made of, for example, a single-crystal inorganic oxide. Examples of the single-crystal inorganic oxide include sapphire and magnesia. For example, phosphor pellets can be formed between the heat sink 332 and the substrate of the transparent member 334 by molding with heat to cause the first surface 331a of the wavelength converter 331 and the transparent member 334 to be in contact with each other. For the phosphor pellets containing numerous particles of multiple types of phosphors in glass with a low melting point, for example, the phosphor pellets may be joined to the transparent member 334 by sharing oxygen between the phosphor particles and the material for the transparent member 334.

Figure 50A:
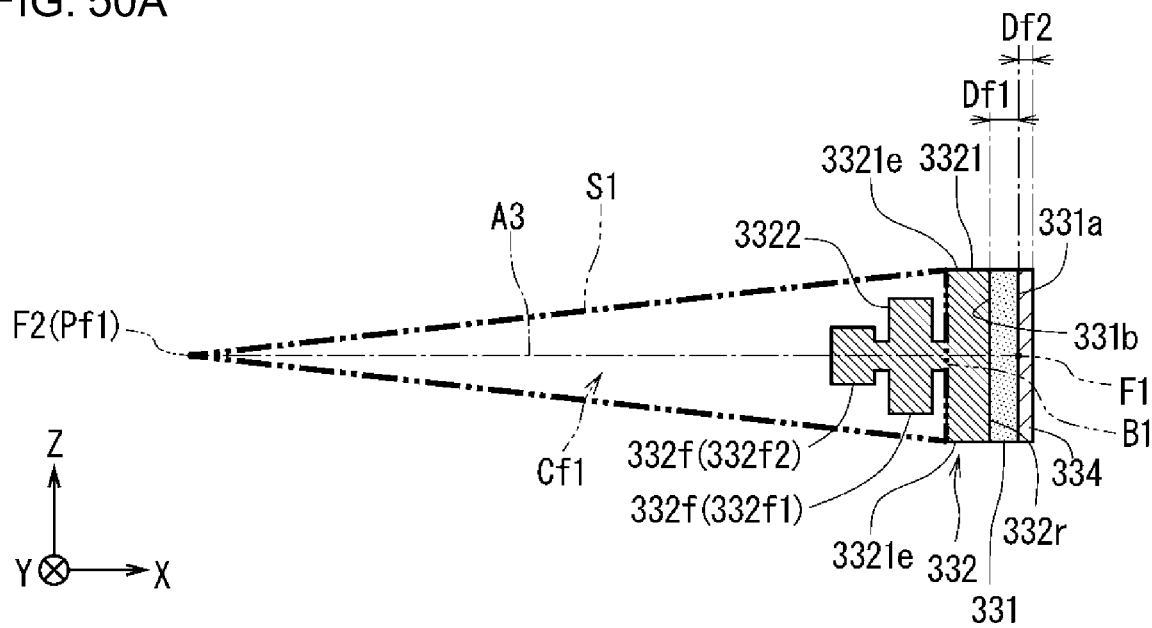
FIG. 50A is a schematic cross-sectional view of a heat sink, a wavelength converter, and a transparent member in a first structure according to the twentieth embodiment.

As illustrated in, for example, FIG. 50A, a thickness Df2 of the transparent member 334 is less than a thickness Df1 of the wavelength converter 331 in the first direction (negative X-direction) to allow excitation light P0 output through the first output end 2e2 as an output portion to easily pass through the transparent member 334 and reach the wavelength converter 331. This may increase, for example, the light intensity of the fluorescence W0 emitted from the photoconversion device 30 and the illumination system 100 in response to the excitation light P0.

When, for example, the thickness Df2 of the transparent member 334 is greater than the thickness Df1 of the wavelength converter 331 in the first direction (negative X-direction), the wavelength converter 331 is easily cooled by the transparent member 334 through the first surface 331a. The wavelength converter 331 is, for example, thus less likely to undergo temperature increase and resultant deterioration.

As illustrated in, for example, FIG. 50A, the transparent member 334 may be in an area along the first surface 331a of the wavelength converter 331. As illustrated in, for example, FIG. 50B, the transparent member 334 may be in an area along the fourth surface (also referred to as a side surface) 331s connecting the first surface 331a and the second surface 331b of the wavelength converter 331. In other words, the transparent member 334 may be, for example, in contact with the first surface 331a and the fourth surface 331s of the wavelength converter 331. In this case, the transparent member 334 may be a plate along the first surface 331a and the fourth surface 331s. This structure includes, for example, the substrate of the transparent member 334 having a recess filled with phosphor pellets that are formed by molding with heat. The transparent member 334 with this structure can thus cool, for example, the wavelength converter 331 through the first surface 331a and the fourth surface 331s. The wavelength converter 331 is thus less likely to undergo temperature increase and resultant deterioration. With the transparent member 334 connected to the heat sink 332 as illustrated in, for example, FIG. 50B, the wavelength converter 331 is easily cooled through the first surface 331a by heat transfer from the transparent member 334 to the heat sink 332. The transparent member 334 may be, for example, indirectly connected to the heat sink 332 with a material having a high thermal conductivity.

Figure 50B:
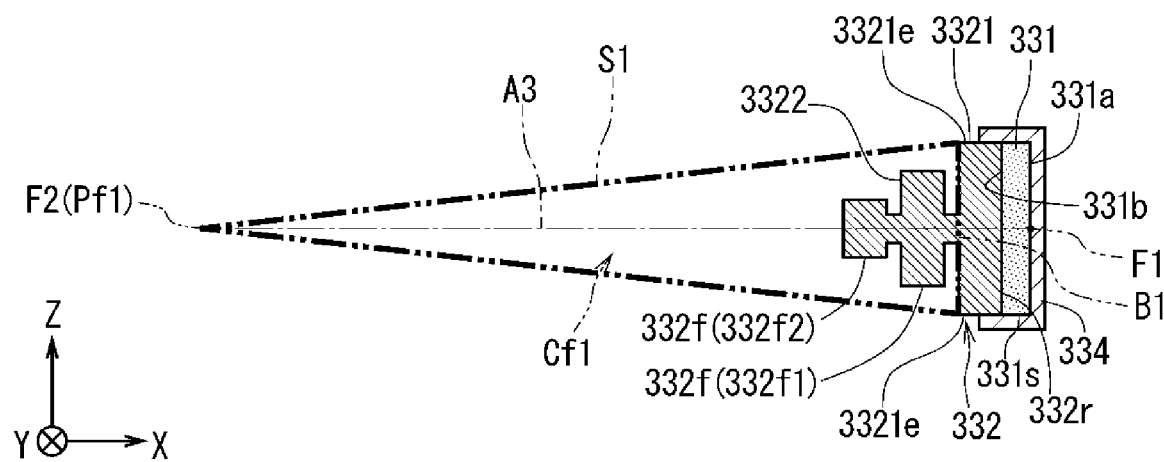
FIG. 50B is a schematic cross-sectional view of a heat sink, a wavelength converter, and a transparent member in a second structure according to the twentieth embodiment.

A heat sink 332, a wavelength converter 331, and a transparent member 334 in a first structure according to a twentieth embodiment illustrated in FIG. 50A are based on the example structures of the heat sink 332 and the wavelength converter 331 according to the above eighteenth embodiment illustrated in FIG. 44A. More specifically, the first structure including the heat sink 332, the wavelength converter 331, and the transparent member 334 according to the twentieth embodiment illustrated in FIG. 50A additionally includes a transparent member 334 extending along and in contact with the first surface 331a of the wavelength converter 331. A heat sink 332, a wavelength converter 331, and a transparent member 334 in a second structure according to the twentieth embodiment illustrated in FIG. 50B are based on the heat sink 332, the wavelength converter 331, and the transparent member 334 in the first structure according to the above twentieth embodiment illustrated in FIG. 50A. More specifically, the second structure including the heat sink 332, the wavelength converter 331, and the transparent member 334 according to the twentieth embodiment illustrated in FIG. 50B includes the transparent member 334 with the structure changed to cause the transparent member 334 to be in contact with the first surface 331a and the fourth surface 331s. In the example in FIG. 50B, the transparent member 334 is connected to the outer periphery of the first portion 3321 in the heat sink 332.

Figure 51A:
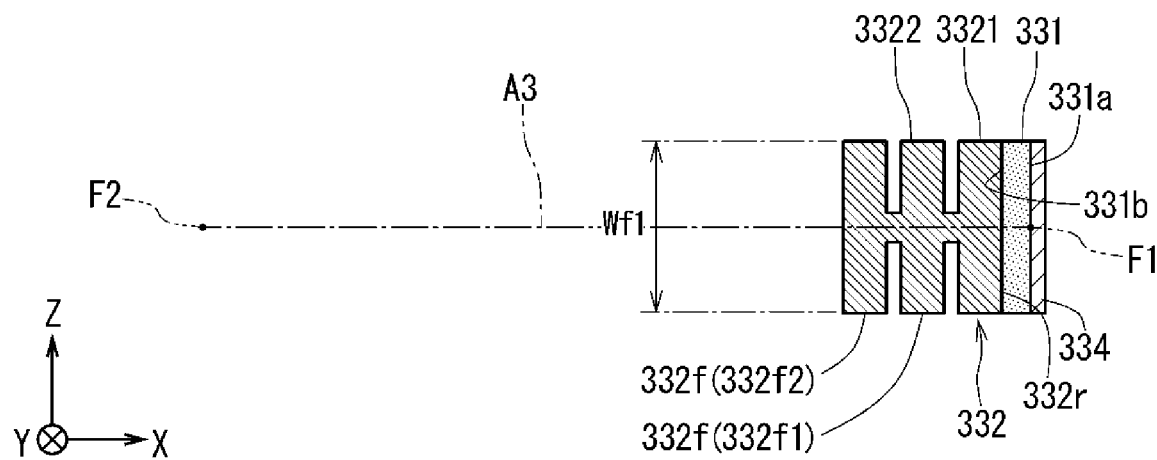
FIG. 51A is a schematic cross-sectional view of a heat sink, a wavelength converter, and a transparent member in a first variation of the twentieth embodiment.
Figure 51B:
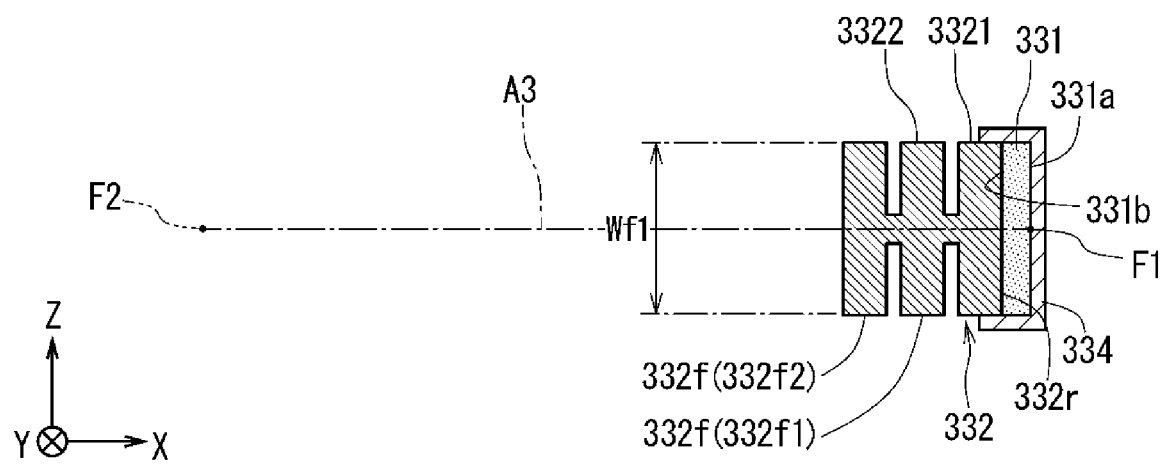
FIG. 51B is a schematic cross-sectional view of a heat sink, a wavelength converter, and a transparent member in a second variation of the twentieth embodiment.

As illustrated in, for example, FIGS. 51A and 51B, the heat sink 332 may not have the width in the second direction (e.g., in the Z-direction) perpendicular to the first direction (e.g., the negative X-direction) decreasing in the first direction from the wavelength converter 331 to the focusing plane 33f. When, for example, the photoconversion device 30 includes the wavelength converter 331, the heat sink 332 including the third surface 332r joined to the second surface 331b of the wavelength converter 331, and the transparent member 334 in contact with the first surface 331a of the wavelength converter 331, the heat sink 332 can cool the wavelength converter 331 through the second surface 331b, and the transparent member 334 can cool the wavelength converter 331 through the first surface 331a. The wavelength converter 331 is, for example, less likely to undergo temperature increase and resultant deterioration. This, for example, increases the light intensity of the fluorescence W0 emitted from the photoconversion device 30 and the illumination system 100 in response to the excitation light P0.

A heat sink 332, a wavelength converter 331, and a transparent member 334 according to a first variation of the twentieth embodiment illustrated in FIG. 51A are based on the heat sink 332, the wavelength converter 331, and the transparent member 334 in the first structure according to the above twentieth embodiment illustrated in FIG. 50A. More specifically, the structure including the heat sink 332, the wavelength converter 331, and the transparent member 334 according to the first variation of the twentieth embodiment includes the heat sink 332 with the shape changed to have the first portion 3321 and the two heat-dissipating fins 332f of the second portion 3322 each having the same width Wf1 in the second direction (Z-direction). A heat sink 332, a wavelength converter 331, and a transparent member 334 in a second structure according to a second variation of the twentieth embodiment illustrated in FIG. 51B are based on the heat sink 332, the wavelength converter 331, and the transparent member 334 in the second structure according to the above twentieth embodiment illustrated in FIG. 50B. More specifically, the structure including the heat sink 332, the wavelength converter 331, and the transparent member 334 according to the second variation of the twentieth embodiment illustrated in FIG. 51B includes the heat sink 332 with the shape changed to have the first portion 3321 and the two heat-dissipating fins 332f of the second portion 3322 each having the same width Wf1 in the second direction (Z-direction).

The heat sink 332 may not include, for example, the heat-dissipating fins 332f and may be a plate.

3-2-5. Twenty-first Embodiment

Figure 52A:
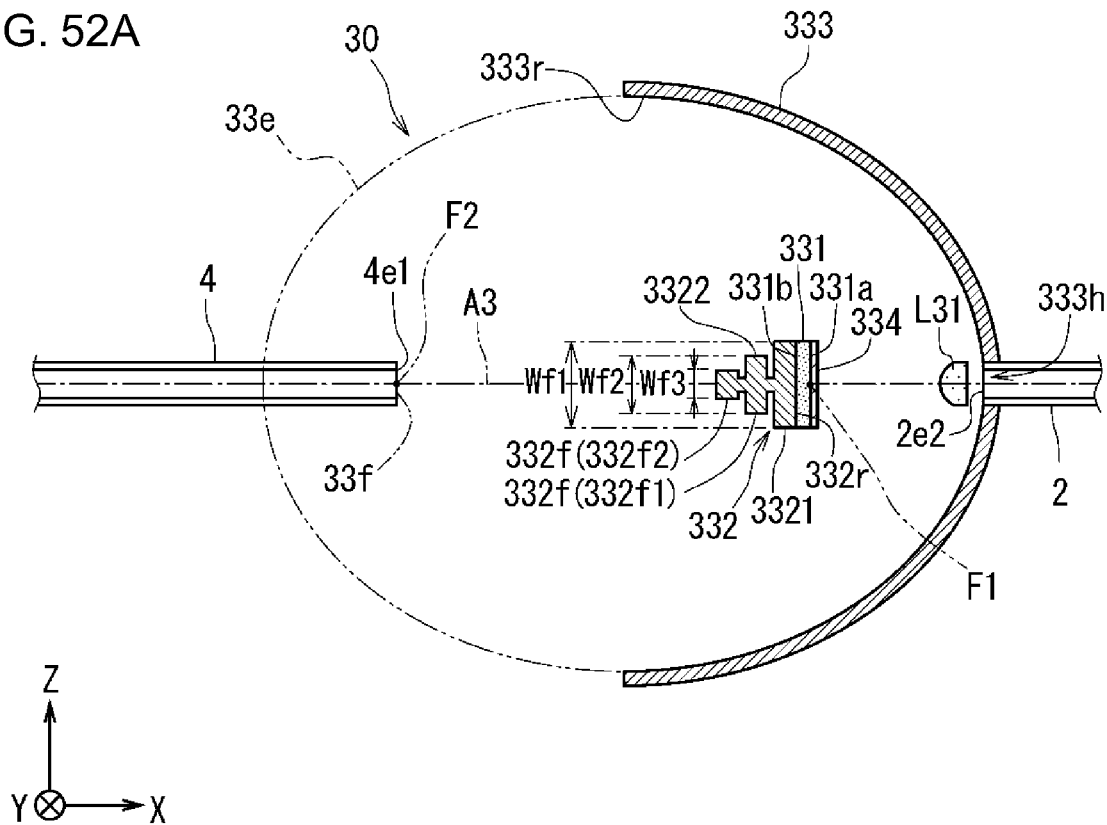
FIG. 52A is a schematic cross-sectional view of a photoconversion device with an example structure according to a twenty-first embodiment.
Figure 52B:
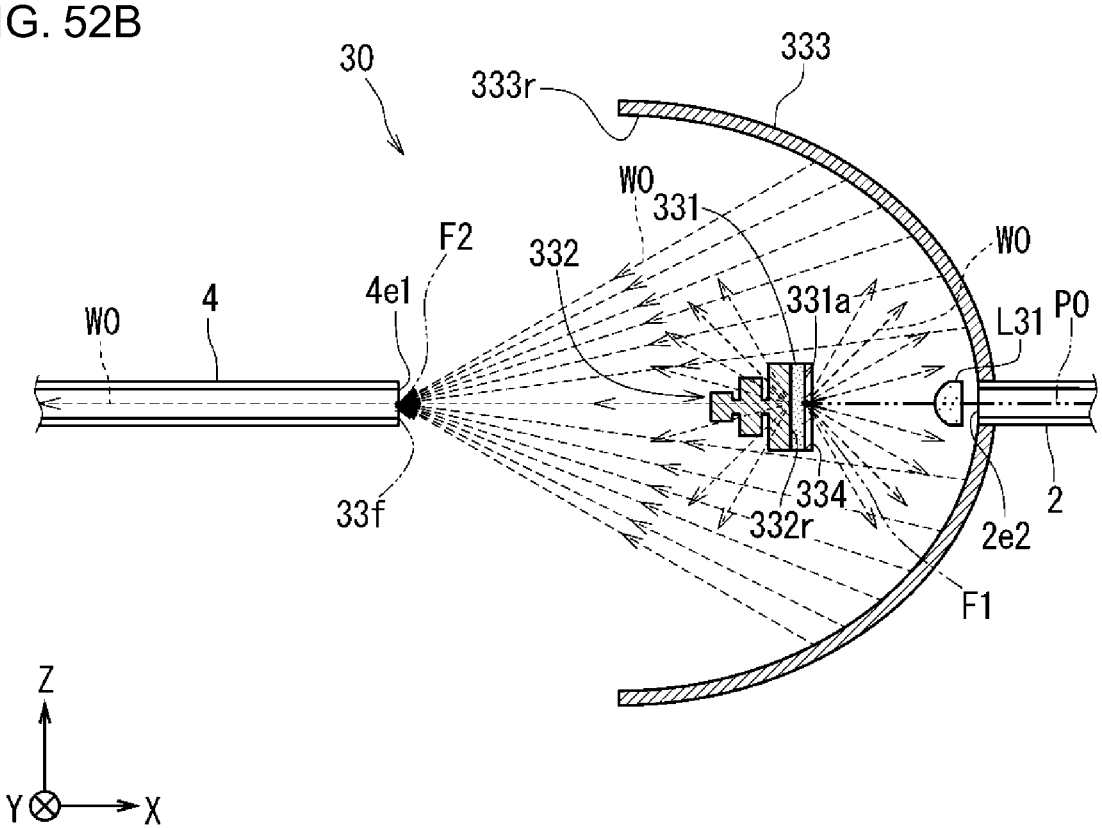
FIG. 52B is a schematic cross-sectional view of the photoconversion device with the example structure according to the twenty-first embodiment describing conversion of excitation light to fluorescence.

In each of the above sixteenth to twentieth embodiments, the heat sink 332 may be made of a material transmissive to light as illustrated in FIGS. 52A and 52B. Examples of the material transmissive to light may include gallium nitride (GaN), magnesium oxide (MgO), aluminum nitride (AlN), aluminum oxide ($Al_2O_3$), yttrium aluminum garnet (YAG), and carbon (C). In this case, the third surface 332r of the heat sink 332 is, for example, less likely to reflect light and allows light to pass through the heat sink 332. This structure may allow, for example, the wavelength converter 331 to emit fluorescence W0 from both the first surface 331a and the second surface 331b in response to the excitation light P0. As illustrated in, for example, FIG. 52B, the fluorescence W0 emitted from the second surface 331b of the wavelength converter 331 can pass through the transparent heat sink 332 toward the second input end 4e1 of the second optical transmission fiber 4 along the focusing plane 33f.

The heat sink 332 that is transparent may have the width in the second direction (e.g., in the Z-direction) perpendicular to the negative X-direction as the first direction decreasing in the first direction from the wavelength converter 331 to the focusing plane 33f. In this case, the fluorescence W0 from the reflective surface 333r to the focusing plane 33f is less likely to be reflected and refracted at the heat sink 332. The heat sink 332 with this structure is, for example, less likely to block an optical path of the fluorescence W0 from the reflective surface 333r toward the focusing plane 33f. This, for example, increases the light intensity of the fluorescence W0 emitted from the photoconversion device 30 and the illumination system 100 in response to the excitation light P0.

3-2-6. Twenty-Second Embodiment

The photoconversion device 30F in the illumination system 100F illustrated in FIG. 11 has the same or similar structure as the photoconversion device 30 according to any of the sixteenth to twenty-first embodiments described above.

The photoconversion device 30F with this structure also includes, for example, a wavelength converter 331 that receives excitation light P0 on the first surface 331a and emits fluorescence W0, a heat sink 332 with a third surface 332r joined to the second surface 331b of the wavelength converter 331, and a reflector 333 located opposite to the first surface 331a and including a reflective surface 333r that focuses the fluorescence W0 emitted by the wavelength converter 331 toward the focusing plane 33f. This photoconversion device 30F includes, for example, the wavelength converter 331 located between the reflective surface 333r and the focusing plane 33f, and the heat sink 332 having the width in the second direction perpendicular to the first direction decreasing in the first direction from the wavelength converter 331 to the focusing plane 33f. The heat sink 332 can thus cool, for example, the wavelength converter 331 through the second surface 331b. The wavelength converter 331 is thus less likely to undergo temperature increase and resultant deterioration. The heat sink 332 with the width in the second direction decreasing in the first direction from the reflective surface 333r toward the focusing plane 33f is, for example, less likely to block an optical path of the fluorescence W0 from the reflective surface 333r toward the focusing plane 33f. This increases the light intensity of the fluorescence W0 emitted from the photoconversion device 30F and the illumination system 100F in response to the excitation light P0.

Figure 53A:
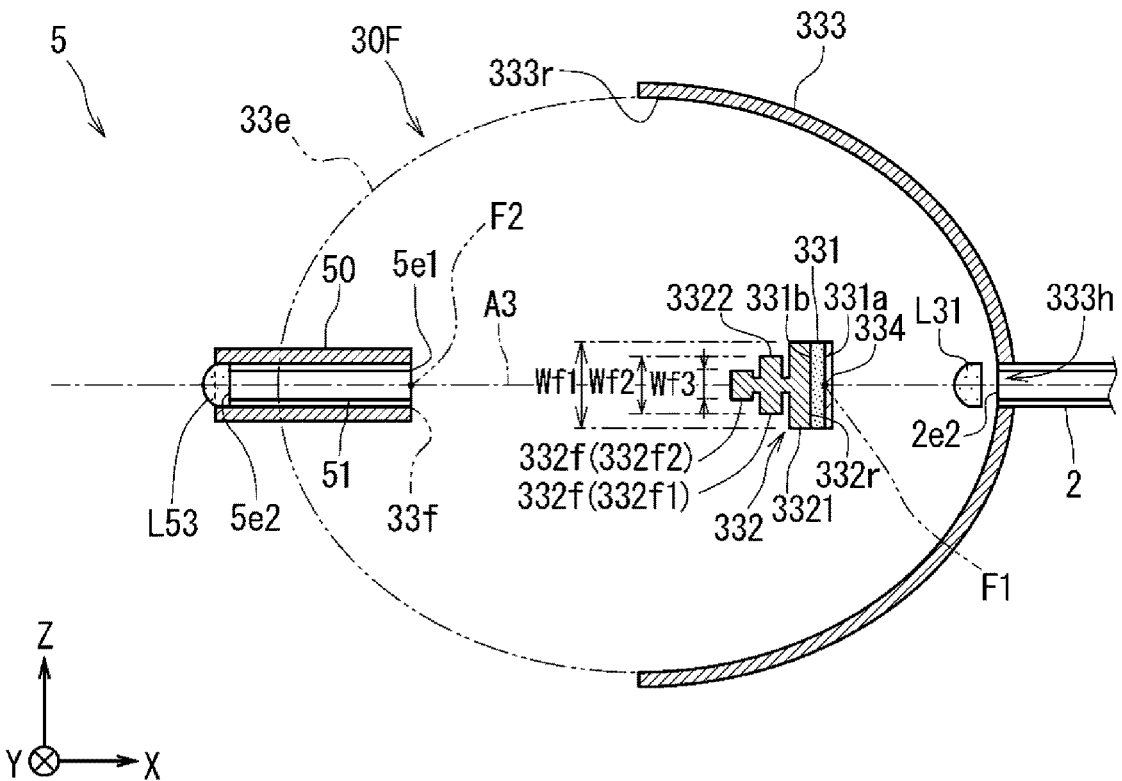
FIG. 53A is a schematic cross-sectional view of an optical radiation module with an example structure according to a twenty-second embodiment.
Figure 53B:
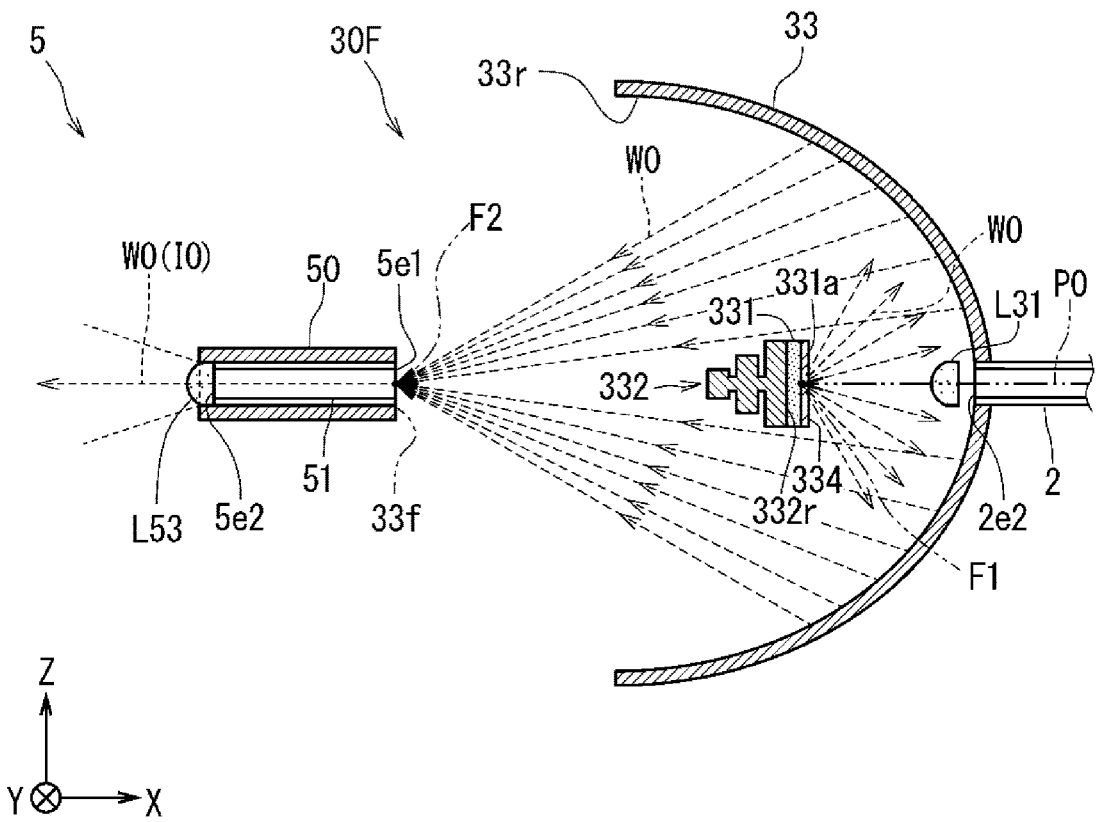
FIG. 53B is a schematic cross-sectional view of the optical radiation module with the example structure according to the twenty-second embodiment describing conversion of excitation light to fluorescence.

An optical radiation module 5 with an example structure according to a twenty-second embodiment illustrated in FIGS. 53A and 53B includes a photoconversion device 30F and an optical radiator 50. In this example, the photoconversion device 30F has the same or similar structure as the photoconversion device 30 according to the twentieth embodiment illustrated in FIGS. 49A and 49B. The optical radiator 50 is the same as or similar to the optical radiator 50 in FIG. 12.

3-2-7. Twenty-Third Embodiment

A photoconversion device 30G in the light-emitting module 1 illustrated in FIG. 14 has the same or similar structure as the photoconversion device 30 according to any of the sixteenth to twenty-first embodiments described above.

The photoconversion device 30G with this structure also includes, for example, a wavelength converter 331 that receives excitation light P0 on the first surface 331a and emits fluorescence W0, a heat sink 332 with a third surface 332r joined to the second surface 331b of the wavelength converter 331, and a reflector 333 located opposite to the first surface 331a and including a reflective surface 333r that focuses the fluorescence W0 emitted by the wavelength converter 331 toward the focusing plane 33f. This photoconversion device 30G includes, for example, the wavelength converter 331 located between the reflective surface 333r and the focusing plane 33f, and the heat sink 332 having the width in the second direction perpendicular to the first direction decreasing in the first direction from the wavelength converter 331 to the focusing plane 33f. The heat sink 332 can thus cool, for example, the wavelength converter 331 through the second surface 331b. The wavelength converter 331 is thus less likely to undergo temperature increase and resultant deterioration. The heat sink 332 with the width in the second direction decreasing in the first direction from the reflective surface 333r toward the focusing plane 33f is, for example, less likely to block an optical path of the fluorescence W0 from the reflective surface 333r toward the focusing plane 33f. This increases the light intensity of the fluorescence W0 emitted from the photoconversion device 30G and the illumination system 100G in response to the excitation light P0.

Figure 54A:
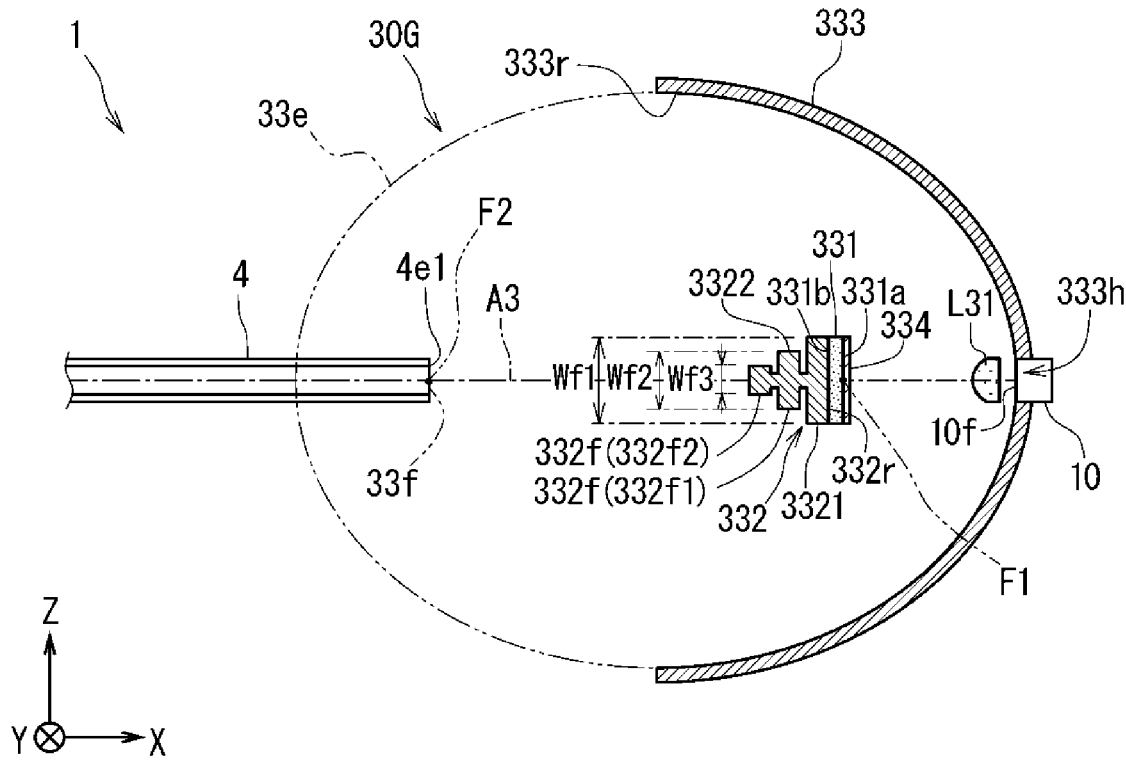
FIG. 54A is a schematic cross-sectional view of a light-emitting module with an example structure according to a twenty-third embodiment, and FIG., and 54B is a schematic cross-sectional view of the light-emitting module with the example structure according to the twenty-third embodiment describing conversion of excitation light to fluorescence.
Figure 54B:
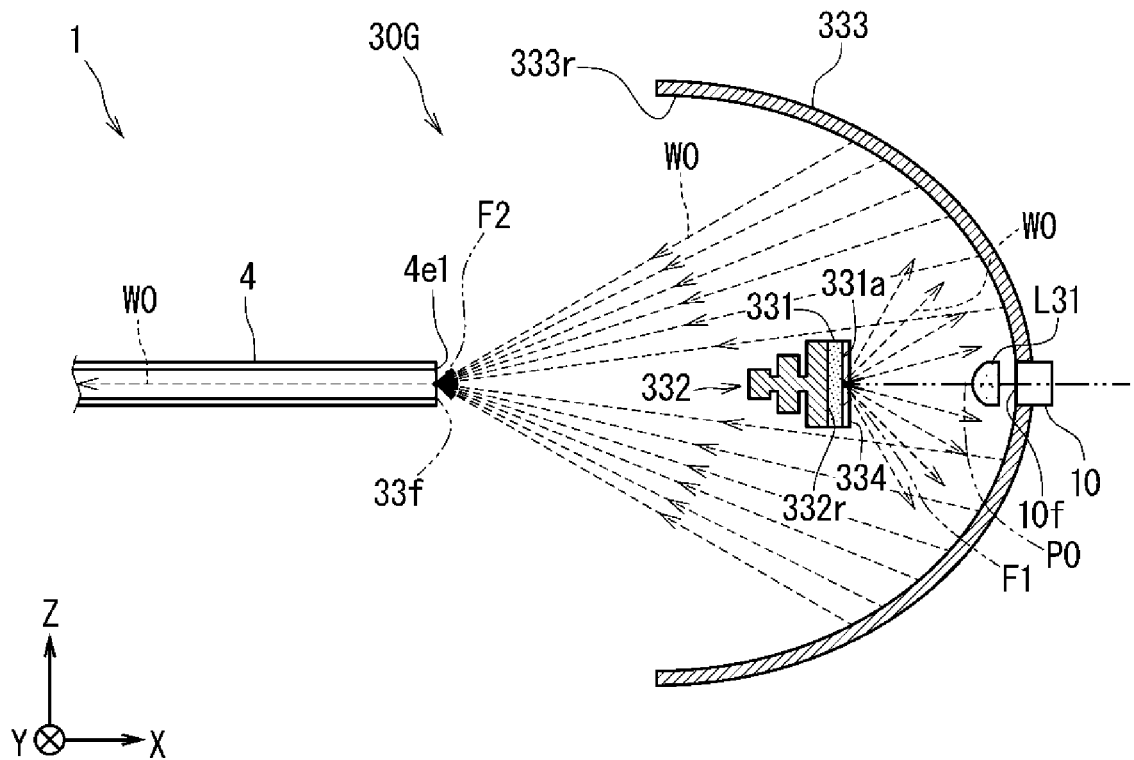

A light-emitting module 1 with an example structure according to a twenty-third embodiment illustrated in FIGS. 54A and 54B includes a light-emitting element 10 and a photoconversion device 30G. In this example, the photoconversion device 30G has the same or similar structure as the photoconversion device 30 according to the twentieth embodiment illustrated in FIGS. 49A and 49B. In the example of FIGS. 54A and 54B, excitation light P0 is emitted from an output portion 10f of the light-emitting element 10 toward the first surface 331a of the wavelength converter 331, instead of being through the first output end 2e2 of the first optical transmission fiber 2.

3-3. Others

In each of the above sixteenth to twenty-third embodiments, for example, the second surface 331b of the wavelength converter 331 and the third surface 332r of the heat sink 332 may be joined with another layer with a higher thermal conductivity than the wavelength converter 331.

In each of the above fifteenth to twenty-second embodiments, the heat sink 332 having the width in the second direction decreasing in the first direction may be, for example, the heat sink 332 having a part of the second portion 3322 in the first direction with a constant width in the second direction.

In each of the above fifteenth to twenty-second embodiments, the second surface 331b of the wavelength converter 331 to which the heat sink 332 is joined can be any surface of the wavelength converter 331 with the capability described above. In other words, the heat sink 332 can be joined to any surface of the wavelength converter 331 with the capability described above. For the heat sink 332 with a through-hole, for example, the wavelength converter 331 may be located in the through-hole.

In each of the above fifteenth to twenty-second embodiments, the second surface 331b of the wavelength converter 331 and the third surface 332r of the heat sink 332 are to be simply joined substantially with one of various joining methods. As described above, for example, the second surface 331b and the third surface 332r may be joined with an adhesive, or the second surface 331b and the third surface 332r may be joined to each other with a screw or a spring, or by swaging.

The first surface 331a of the wavelength converter 331 (specifically, the incident surface section) to receive the excitation light P0 may protrude toward the first output end 2e2. For example, the wavelength converter 331 may have the shape that is the same as or similar to the shape of the wavelength converter 132 in FIGS. 3 to 6.

In the photoconversion devices 30, 30F, and 30G according to the above embodiments, for example, a portion of the excitation light P0 may not be converted to fluorescence W0 by the wavelength converters 132, 231, 235, 236, and 331, and that portion of the excitation light P0 may form pseudo white light together with the fluorescence W0. In this case, the illumination light I0 radiated from the optical radiation module 5 into the external space 200 of the illumination system 100 may be pseudo white light including for example, the portion of the excitation light P0 and the fluorescence W0. When, for example, the excitation light P0 is blue light and the fluorescence W0 is yellow fluorescence, the blue light and the yellow fluorescence can be mixed into pseudo white light.

In each of the above embodiments, the illumination light I0 radiated from the optical radiation module 5 into the external space 200 of the illumination system 100 may not be, for example, pseudo white light. For example, the types, the number of types, and the ratio of phosphors included in each of the wavelength converters 132, 231, 235, 236, and 331 may be changed as appropriate to cause the illumination light I0 to exclude light in a specific wavelength range (e.g., blue light) to include more light in a specific wavelength range (e.g., red light). The illumination light I0 is, for example, controlled in this manner.

In the above embodiments, the phosphor portion may include a transparent substrate, such as a resin or glass substrate, and phosphor pellets on the substrate.

When the reflectors 1331, 233, 333 are ellipsoidal mirrors in the above embodiments, the first focal point F1 of the ellipsoid 33e of the ellipsoidal mirror may not be aligned with the illuminating area of the wavelength converters 132, 231, 235, 236, and 331 to receive the excitation light P0, and the second focal point F2 may not be aligned with the focusing plane 33f as the focusing portion.

The components described in the above embodiments and variations may be entirely or partially combined as appropriate unless any contradiction arises.

The invention claimed is:

1. A photoconversion device, comprising:
    a holder holding an output portion configured to output excitation light;
    a wavelength converter including an incident surface section including a protruding surface to receive an excitation light from the output portion, the wavelength converter being configured to emit a fluorescence in response to the excitation light that is incident on the incident surface section;
    an optical element including a reflector surrounding the wavelength converter, the reflector including a focal point surrounded by the incident surface section to direct the fluorescence emitted by the wavelength converter in a predetermined direction, the reflector being configured to reflect the fluorescence emitted by the wavelength converter;
    a drive configured to change an illuminating area to receive the excitation light in the incident surface section, wherein
    the incident surface section includes a plurality of phosphor areas including a first phosphor area and a second phosphor area,
    the first phosphor area emits a first fluorescence with a first wavelength spectrum in response to the excitation light,
    the second phosphor area emits a second fluorescence with a second wavelength spectrum different from the first wavelength spectrum in response to the excitation light,
    the drive moves a part of at least one of the holder or the wavelength converter to change a relative positional relationship between the output portion and the plurality of phosphor areas,
    the drive includes a mover configured to move the wavelength converter and the holder relative to each other in an intersecting direction intersecting with an optical axis of the excitation light, and
    the plurality of phosphor areas is arranged in the intersecting direction in a plan view of the wavelength converter in a direction parallel to the optical axis.

2. The photoconversion device according to claim 1, wherein
    the optical element includes a lens configured to transmit the fluorescence emitted by the wavelength converter.

3. The photoconversion device according to claim 1, wherein
    the optical element focuses the fluorescence at an input end of an optical transmitter.

4. An illumination system, comprising:
    a light-emitting module configured to emit excitation light;
    a first optical transmitter configured to transmit the excitation light from the light-emitting module;

a relay including the photoconversion device according to claim 1;
a second optical transmitter configured to transmit the fluorescence from the relay; and
an optical radiation module configured to radiate the fluorescence transmitted by the second optical transmitter into an external space,
wherein the output portion includes an output end of the first optical transmitter.

5. A photoconversion device, comprising
a holder holding an output portion configured to output excitation light;
a wavelength converter including an incident surface section including a protruding surface to receive an excitation light from the output portion, the wavelength converter being configured to emit a fluorescence in response to the excitation light that is incident on the incident surface section;
an optical element including a focusing element configured to focus the fluorescence emitted by the wavelength converter onto a focusing plane, the optical element including a conjugate point having a conjugate relation with a point on the focusing plane, the conjugate point being surrounded by the incident surface section; and
a drive configured to change an illuminating area to receive the excitation light in the incident surface section, wherein
the incident surface section includes a plurality of phosphor areas including a first phosphor area and a second phosphor area,
the first phosphor area emits a first fluorescence with a first wavelength spectrum in response to the excitation light,
the second phosphor area emits a second fluorescence with a second wavelength spectrum different from the first wavelength spectrum in response to the excitation light,
the drive moves a part of at least one of the holder or the wavelength converter to change a relative positional relationship between the output portion and the plurality of phosphor areas,
the drive includes a mover configured to move the wavelength converter and the holder relative to each other in an intersecting direction intersecting with an optical axis of the excitation light, and
the plurality of phosphor areas is arranged in the intersecting direction in a plan view of the wavelength converter in a direction parallel to the optical axis.

6. A photoconversion device, comprising
a holder holding an output portion configured to output excitation light;
a wavelength converter including an incident surface section including a protruding surface to receive an excitation light from the output portion, the wavelength converter being configured to emit a fluorescence in response to the excitation light that is incident on the incident surface section; and
an optical element including a reflector surrounding the wavelength converter, the reflector including a focal point surrounded by the incident surface section to direct the fluorescence emitted by the wavelength converter in a predetermined direction, the reflector being configured to reflect the fluorescence emitted by the wavelength converter, wherein the incident surface section includes a first incident surface and a second incident surface being opposite to each other, and
the photoconversion device further comprises a splitter optical system configured to split the excitation light from the output portion into first excitation light and second excitation light and direct the first excitation light to the first incidence surface and direct the second excitation light to the second incidence surface.

7. The photoconversion device according to claim 6, further comprising:
a reflector including a reflective surface and a through-hole in the reflective surface, the reflective surface being concave and surrounding the splitter optical system and the wavelength converter, the through-hole being configured to allow the excitation light to pass through, the reflector being configured to reflect, with the reflective surface, the fluorescence emitted by the wavelength converter.

8. The photoconversion device according to claim 6, wherein
the wavelength converter includes
a first phosphor portion including the first incident surface, the first phosphor portion being configured to emit first fluorescence with a first wavelength spectrum in response to the first excitation light, and
a second phosphor portion including the second incident surface, the second phosphor portion being configured to emit second fluorescence with a second wavelength spectrum different from the first fluorescence in response to the second excitation light.

9. The photoconversion device according to claim 6, further comprising:
a reflector including a reflective surface being concave and surrounding the wavelength converter, the reflector being configured to reflect, with the reflective surface, the fluorescence emitted by the wavelength converter to be focused at an input end of an optical transmitter.

10. A photoconversion device comprising:
a holder holding an output portion configured to output an excitation light;
a wavelength converter including an incident surface section including a protruding surface to receive the excitation light from the output portion, the wavelength converter being configured to emit fluorescence in response to the excitation light that is incident on the incident surface section;
an optical element including a reflector surrounding the wavelength converter, the reflector including a focal point surrounded by the incident surface section to direct a fluorescence emitted by the wavelength converter in a predetermined direction, the reflector being configured to reflect the fluorescence emitted by the wavelength converter; and
a heat sink,
wherein the wavelength converter includes a first surface as the incident surface section and a second surface different from the first surface,
the heat sink includes a third surface joined to the second surface,
the reflector including a reflective surface located opposite to the incident surface section to focus the fluorescence emitted by the wavelength converter toward a focusing portion,
the wavelength converter is located between the reflective surface and the focusing portion, and the heat sink has a width decreasing in a first direction from the wavelength converter toward the focusing portion, and the heat sink has the width in a second direction perpendicular to the first direction.

11. The photoconversion device according to claim 10, wherein
the reflector includes the reflective surface including an ellipsoidal mirror along an ellipsoid, and
the ellipsoid includes a first focal point aligned with an area of the first surface to receive the excitation light from the output portion.

12. The photoconversion device according to claim 11, wherein
the ellipsoid includes a second focal point different from the first focal point,
the second focal point is aligned with the focusing portion,
the heat sink includes a first portion joined to the wavelength converter and a second portion protruding in the first direction from the first portion,
the first portion includes an outer edge surrounding an imaginary straight line extending through the first focal point and the second focal point, and
the second portion is included in a first area being an imaginary area in a shape of a cone including an imaginary surface surrounded by the outer edge as a bottom surface and the second focal point as a vertex.

13. The photoconversion device according to claim 11, wherein
the ellipsoid includes a second focal point different from the first focal point,
the second focal point is aligned with the focusing portion, and
the heat sink is located in a second area being an imaginary area in a shape of a cone including the second surface as a bottom surface and the second focal point as a vertex.

* * * * *